US005489542A

United States Patent [19]

Iwai et al.

[11] Patent Number: 5,489,542
[45] Date of Patent: Feb. 6, 1996

[54] METHOD FOR FABRICATING SEMICONDUCTOR DEVICE IN WHICH THRESHOLD VOLTAGE SHIFT AND CHARGE-PUMPING CURRENT ARE IMPROVED

[75] Inventors: Hiroshi Iwai, Kanagawa; Toyota Morimoto, Chiba; Hisayo S. Momose, Tokyo; Kikuo Yamabe; Yoshio Ozawa, both of Kanagawa, all of Japan

[73] Assignee: Kabushiki Kaisha Toshiba, Kawasaki, Japan

[21] Appl. No.: 91,921

[22] Filed: Jul. 16, 1993

Related U.S. Application Data

[62] Division of Ser. No. 798,098, Nov. 27, 1991, Pat. No. 5,237,188.

[30] Foreign Application Priority Data

Nov. 28, 1990 [JP] Japan ..................................... 2-328470
Jul. 23, 1991 [JP] Japan ..................................... 3-182707

[51] Int. Cl.⁶ .......................... H01L 21/265; H01L 21/02; H01L 27/00; H01L 21/70
[52] U.S. Cl. ..................... 437/41; 437/241; 437/42; 437/57; 437/52
[58] Field of Search .................... 437/42, 45, 241, 437/228, 242, 244, 41, 41 GS, 41 SW, 41 CS, 41 LC, 52, 57; 257/325, 411

[56] References Cited

U.S. PATENT DOCUMENTS

| | | | |
|---|---|---|---|
| 3,793,090 | 2/1974 | Barite et al. | 437/41 |
| 4,192,059 | 3/1980 | Khan et al. | 437/41 |
| 4,372,033 | 2/1983 | Chiao | 437/41 |
| 4,455,737 | 6/1984 | Godejahn, Jr. | 437/41 |
| 4,517,729 | 5/1985 | Batra | 437/41 |
| 4,623,912 | 11/1986 | Chang et al. | 357/23.15 |
| 4,644,637 | 2/1987 | Temple | 437/41 |
| 4,798,810 | 1/1989 | Blanchard et al. | 437/41 |
| 4,962,065 | 10/1990 | Brown et al. | 437/241 |
| 4,980,307 | 12/1990 | Ito et al. | 437/40 |
| 5,013,692 | 5/1991 | Ide et al. | 437/241 |
| 5,043,224 | 8/1991 | Jaccodine et al. | 428/446 |
| 5,254,506 | 10/1993 | Hori | 437/241 |
| 5,258,333 | 11/1993 | Shappir et al. | 437/235 |

OTHER PUBLICATIONS

Wolf, S. "Silicon Processing for the VLSI ERA", Lattice Press, Sunset Beach, CA. vol. 2, (1990) pp. 362, 397–399.
Wolf, S and R. Tauber "Silicon Processing for the VLSI ERA", Lattice Press Sunset Beach, CA. vol. 1 (1986). pp. 191–194.

*Primary Examiner*—Olik Chaudhuri
*Assistant Examiner*—Brian K. Dutton
*Attorney, Agent, or Firm*—Foley & Lardner

[57] ABSTRACT

A method for fabricating a semiconductor device on a silicon substrate, consists of producing a silicon oxide film on the silicon substrate producing a thin silicon nitride film on the silicon oxide film, thermally nitriding the silicon nitride film in an atmosphere of nitrogenous gas, producing a conductive film on the silicon nitride film nitrided in the atmosphere of the nitrogenous gas, producing a gate region from the silicon oxide film, the silicon nitride film, and the conductive film, a channel region being positioned under the gate region in the silicon substrate, producing a source region in the silicon substrate adjacent to one side of the channel region, producing a drain region in the silicon substrate adjacent to another side of the channel region, and producing wiring regions on the source region, the drain region, and the gate region.

34 Claims, 39 Drawing Sheets

FIG. 4

| SAMPLE | FABRICATION PROCESS | | $T_{OX}$ (C-V) |
|---|---|---|---|
| | FURNACE OXIDATION 800°C DRY $O_2$ | LPCVD $Si_3N_4$ | |
| "PO" PURE OXIDE | 5 nm | — | 4.9 nm |
| "ON" STACKED NITRIDATION | 3 nm | 3 nm | 4.5 nm |
| | 3 nm | 4 nm | 5.1 nm |
| | 3 nm | 6 nm | 6.1 nm |
| | 5 nm | 3 nm | 6.2 nm |
| | 5 nm | 4 nm | 6.7 nm |
| | 5 nm | 6 nm | 7.7 nm |

FIG. 12

| SAMPLE | | FABRICATION PROCESS | | |
|---|---|---|---|---|
| | | FURNACE OXIDATION | LPCVD Si₃N₄ | +α | $T_{OX}$ (C-V) |
| "PO" PURE OXIDE | | 5 nm<br>800°C<br>DRY O₂ | — | — | 4.9 nm |
| "ON" STACKED NITRIDE | | | 3 nm | — | 6.2 nm |
| | | | | RTA | 6.0 nm |
| | | | | RTA + OX | 10.1 nm |
| | | | | RTN | 5.6 nm |
| | | | | RTN + OX | 6.0 nm |
| | | | | OX | 10.5 nm |

| +α | | | |
|---|---|---|---|
| RTA | 1100°C | RTP(Ar) | 1 MIN |
| RTN | 1100°C | RTP(NH₃) | 1 MIN |
| OX | 800°C | FURNACE | 30 MIN |

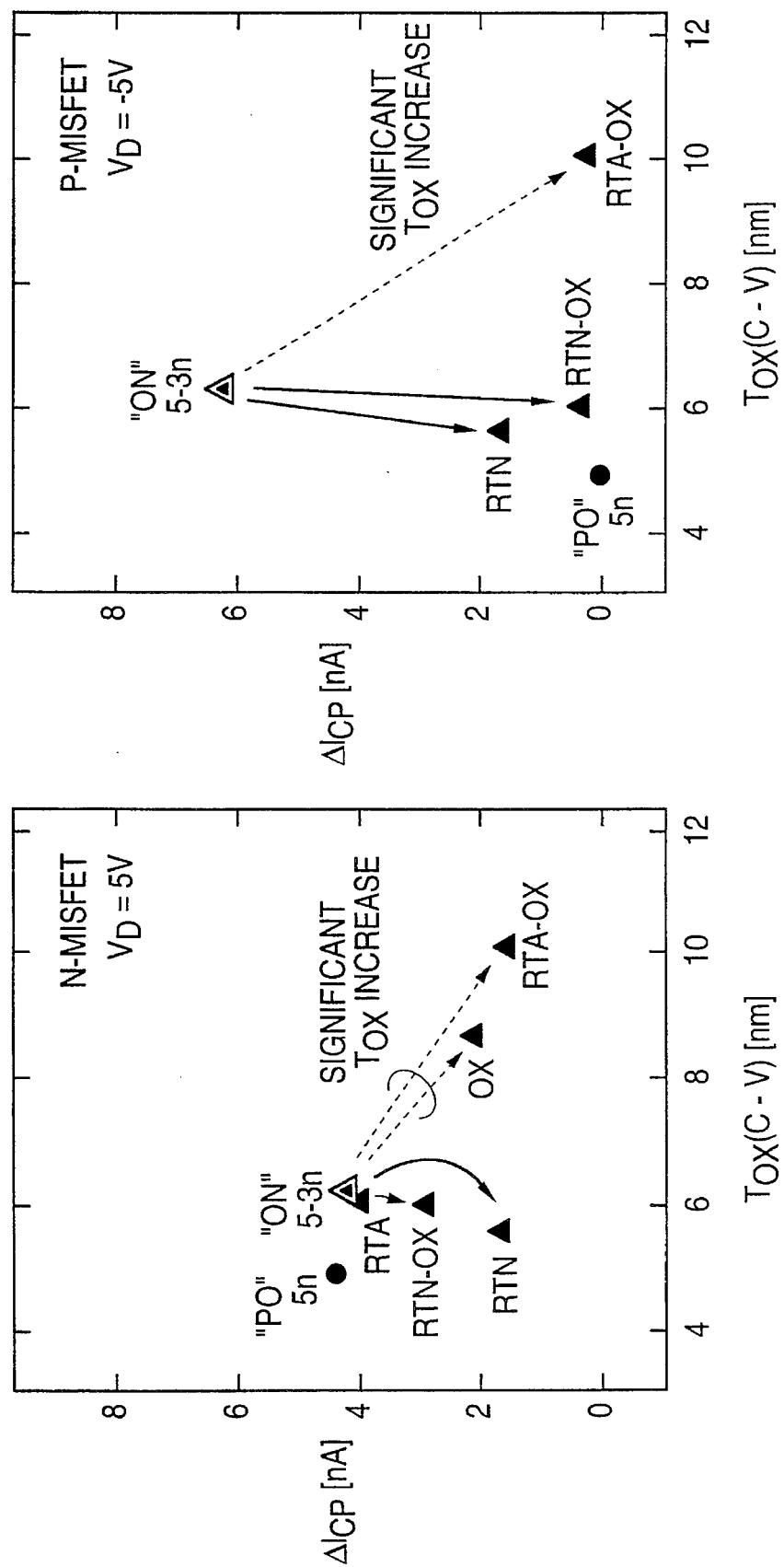

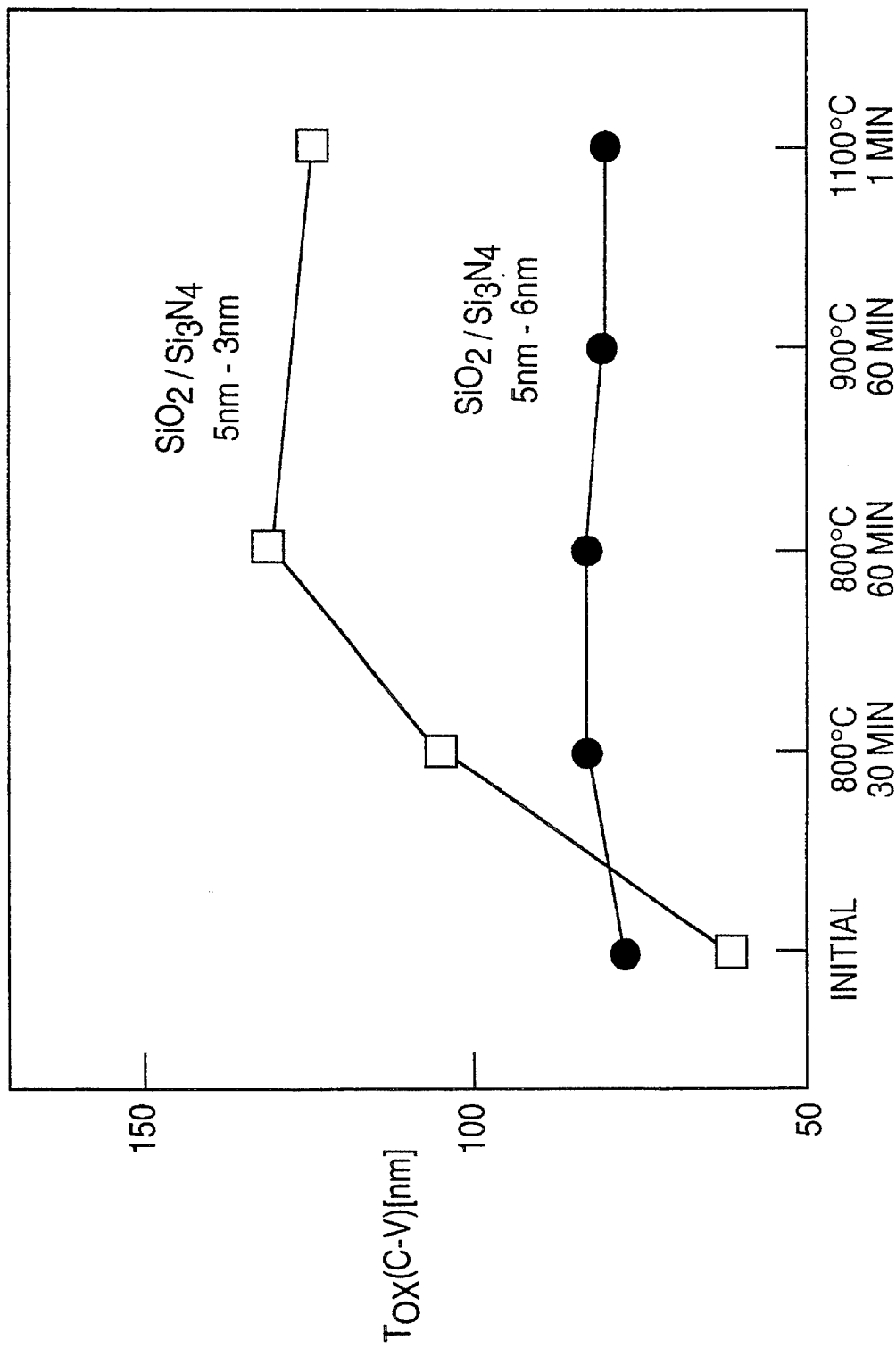

FIG. 21

| SIMS CONDITIONS | THIS EXPERIMENT [N] |
|---|---|
| PRIMARY ION | $O_2^+$ |
| ACCELERATION ENERGY | 2kV |
| CURRENT | 28nA |
| SPUTTER RATE | 0.018 nm/SEC |
| DATUM POINTS IN 5nm OXIDE | 140 points |

FIG. 24

| | | $T_{OX}$(C-V) (nm) | NITROGEN CONCENTRATION (atom%) |
|---|---|---|---|
| "PO" | $SiO_2$ 5nm | 5.1 | 0 |
| "NO" NITRIDED OXIDE FILM | $SiO_2 \rightarrow RTN \rightarrow RTO$<br>800°C 10 SEC<br>850°C 10 SEC<br>900°C 5 SEC<br>900°C 20 SEC<br>900°C 60 SEC<br>1000°C 60 SEC | 5.2<br>5.2<br>5.2<br>5.1<br>5.1<br>5.1 | 0.13<br>0.24<br>0.54<br>1.7<br>3.0<br>4.4 |

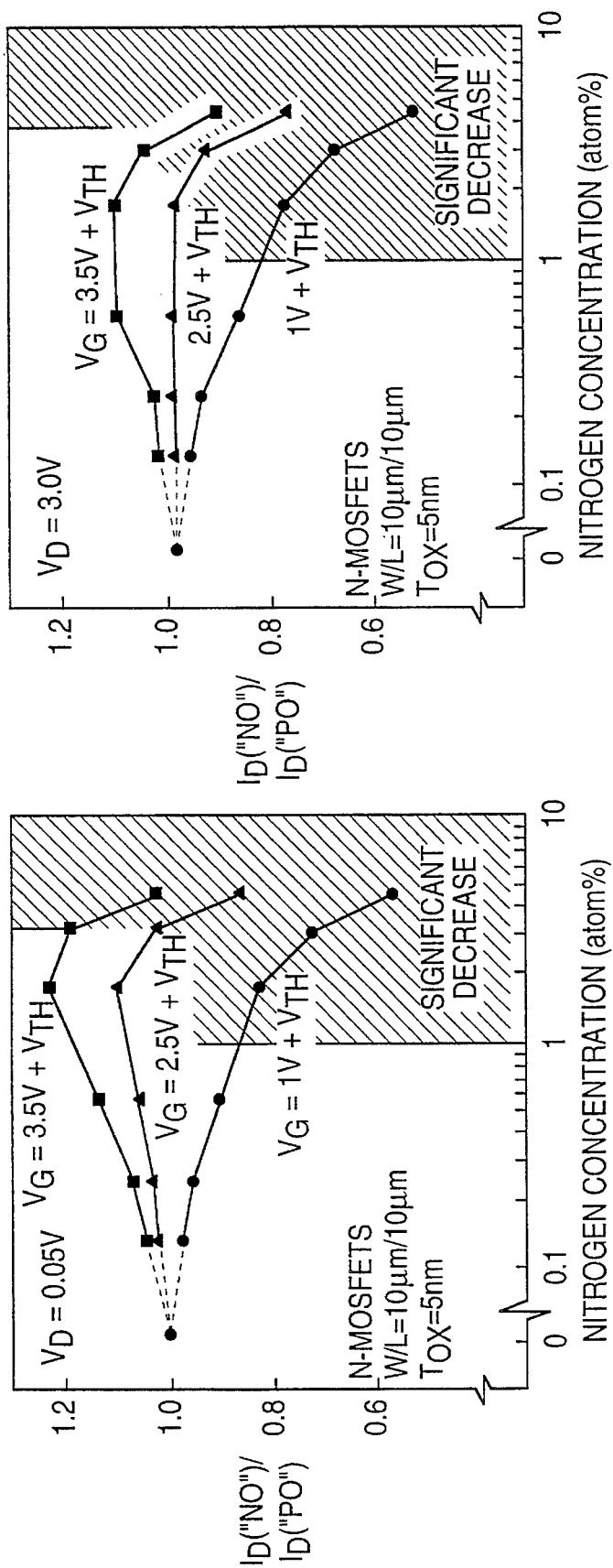

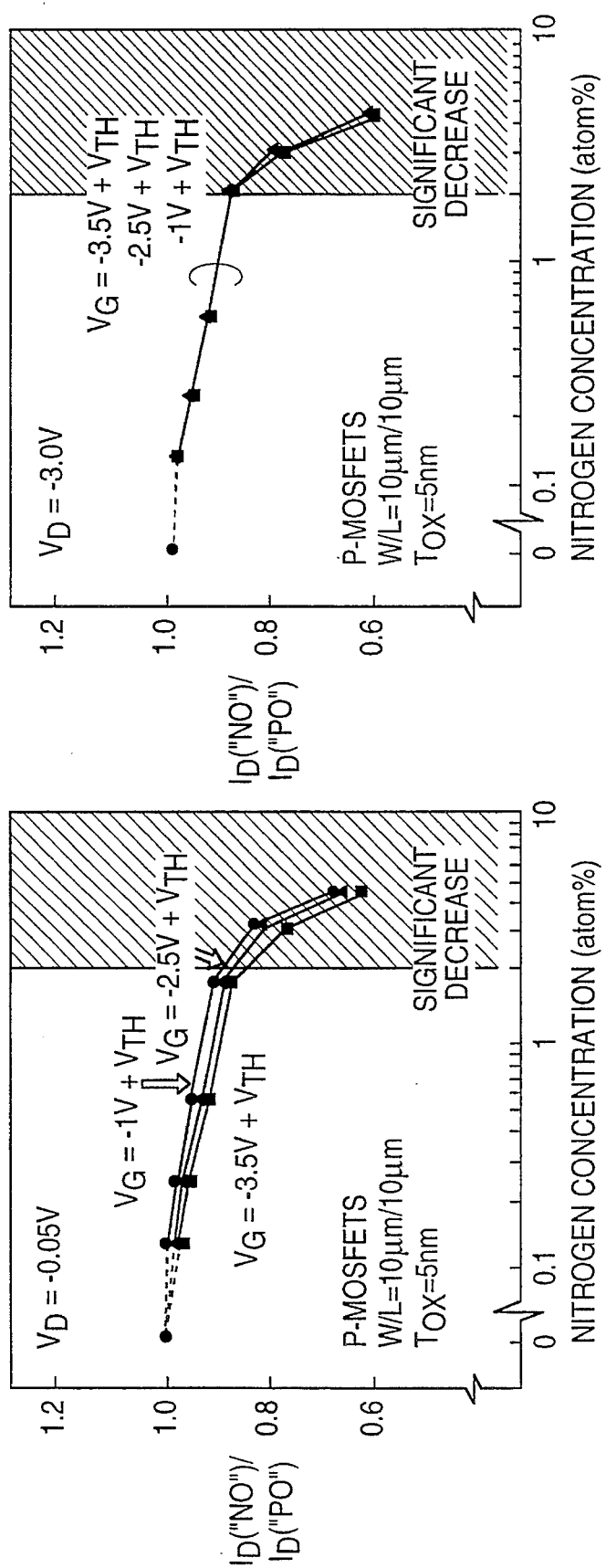

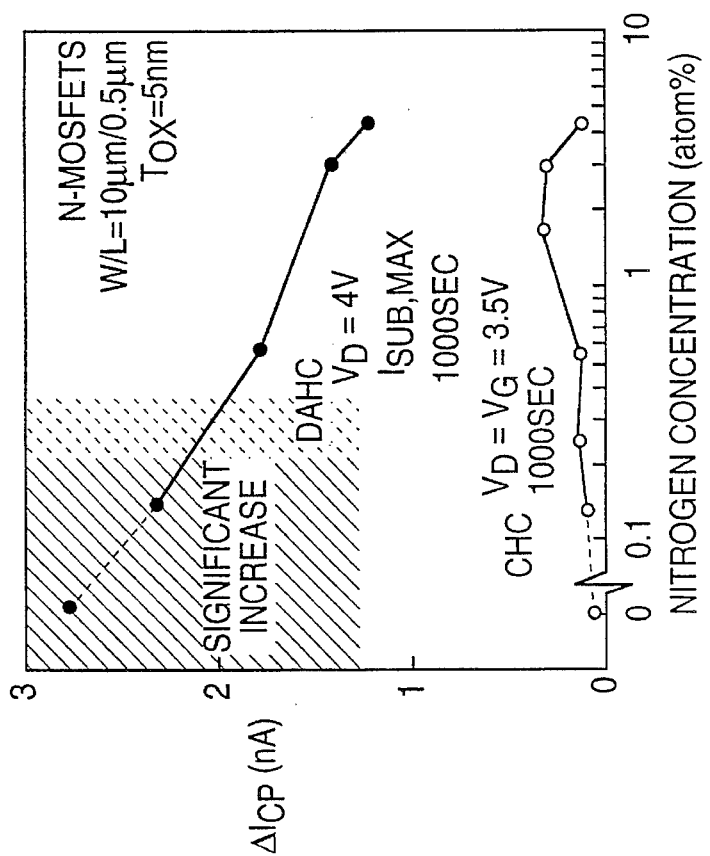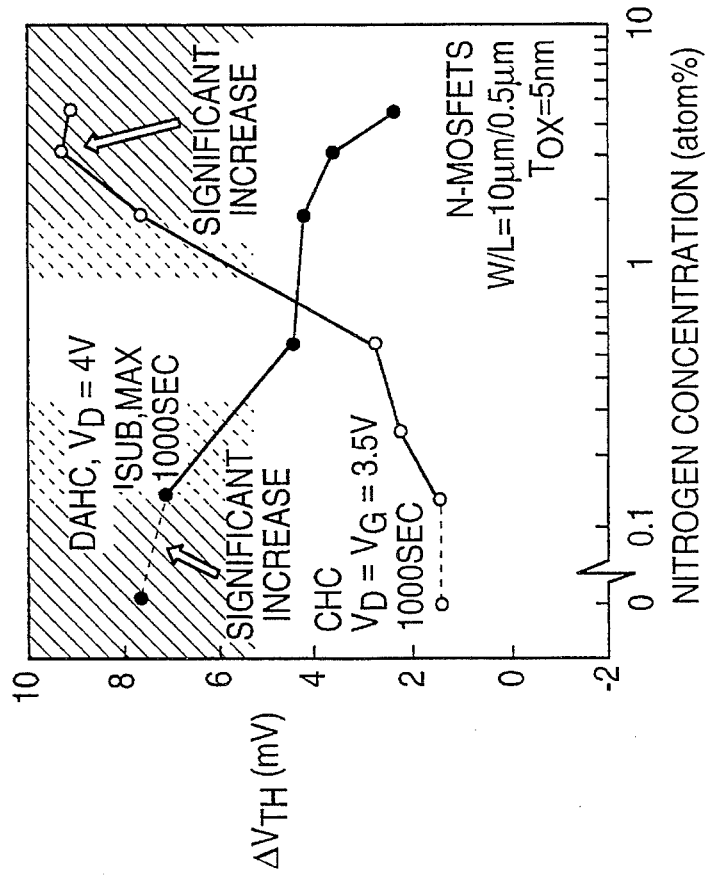
FIG. 31A
FIG. 31B 5,489,542

METHOD FOR FABRICATING SEMICONDUCTOR DEVICE IN WHICH THRESHOLD VOLTAGE SHIFT AND CHARGE-PUMPING CURRENT ARE IMPROVED

This application is a division of application Ser. No. 07/798,098, filed Nov. 27, 1991, now U.S. Pat. No. 5,237,188.

BACKGROUND OF THE INVENTION

1. Field of the Invention

The present invention relates to a semiconductor device and to a method for fabricating the semiconductor device, and, in particular, to a MISFET transistor which is provided with highly reliable insulating films and to a method for fabricating the MISFET transistor.

2. Description of Background

Recently, large scale integrated circuits (LSIs) have been utilized in the important parts of computers and communication equipment. Therefore, to improve the performance of the LSI units, metal-insulator-semiconductor field effect transistors (MISFETs), which are fundamental LSI devices have been miniaturized.

However, the miniaturization of the device has caused several types of drawbacks according to the so-called scaling rule, so that the reliability of the device has deteriorated.

For example, the miniaturization of the device in the MISFETs results in the gate insulating films becoming thin so that a so-called time dependent dielectric breakdown (TDDB) phenomenon is generated. Therefore, the insulation reliability of the gate films deteriorates in cases where the device is utilized for a long time.

Moreover, in cases where the gate electrodes are made from polycrystalline silicon in a first conventional MISFET transistor, impure atoms existing in the gate electrodes penetrate through the thinned gate insulating films so that the impure atoms are diffused over the surface area of a substrate in several processes including thermal oxidation treatment performed after the fabrication of gate electrodes. As a result, the impurity concentration in a channel region fabricated in the surface area of the substrate is shifted, so that control of the threshold voltage of the device becomes difficult. Therefore, malfunctions are easily caused and the operational reliability of the device deteriorates in a conventional MISFET transistor.

Therefore, to solve drawbacks caused in the gate insulating films, nitrogen atoms are added to the gate insulating film in the conventional MISFET transistor.

FIGS. 1A, 1B, and 1C are respectively cross sectional views of a second conventional MISFET transistor, showing the fabricating processes for adding the nitrogen atoms to the gate insulating films in the transistor.

As shown in FIG. 1A, a thin thermally oxidized film 14 is initially produced by a thermal oxidation method on a P-type silicon substrate 11 in which an N well region 12 and field oxide films 18 are produced. Thereafter, for example, a first ramp heating process is performed for 60 seconds at a temperature of 1150° C. in a gas atmosphere which includes ammonia $NH_3$, then a second ramp heating process is performed for 60 seconds at a temperature of 1150° C. in a dry oxygen atmosphere, so that nitrogen atoms are added to the thin thermally oxidized film 14. Thereafter, a polycrystalline silicon film 15 is deposited over the entire silicon substrate 11, and high doses of $BF_2$ ions are then implanted into the polycrystalline silicon film 15 so that P type silicon film 16 is produced.

Thereafter, as shown in FIG. 1B, a resist pattern is drawn on the P type silicon film 16 by a photolithography method, and the P type silicon film 16 and the thin thermally oxidized film 14 are then etched while parts of the P type silicon film 18 on which the resist pattern is drawn are masked, so that a gate insulating film 17 formed by the remaining thermally oxidized film 14 and a gate electrode 18 formed by the remaining P type silicon film 16 are produced. Thereafter, boron ions are implanted into the silicon substrate 11 while utilizing the gate electrode 18 as a mask for preventing the boron ions from being implanted into the gate insulating film 17, so that a source field 19 and a drain field 20 are produced in self-alignment with the insulating film 17.

Finally, as shown in FIG. 1C, a layer insulating film 21 is fabricated over the entire silicon substrate 11, then parts of the layer insulating film 21 are opened to produce contact holes through which the source field 19 and the drain field 20 are respectively exposed. Thereafter, wire fields 22 are deposited, and a passivation film 23 is then deposited over the entire silicon substrate 11, so that a device formed by a gate region 17, 18, the source region 19, the drain region 20 and the like is fabricated. Therefore, a second conventional MISFET transistor 24 formed by many devices is fabricated.

In the MISFET transistor 24 fabricated by the above mentioned processes, a thin film 25 with added nitrogen atoms is produced in an interface of the N well region 12 adjacent to the gate insulating film 17 because the nitrogen atoms added to the gate insulating film 17 are diffused in the N well region 12. Therefore, the thin film produced in the interface 25 prevents the boron atoms implanted in the gate electrode 18 from diffusing into the N well region 12 through the gate insulating film 17. As a result, the performance in controlling the threshold voltage can be improved in the MISFET transistor 24, so that the operational reliability of the devices in the MISFET transistor 24 is improved. Moreover, because the number of defects in the gate insulating film 17 is decreased, the TDDB characteristics are improved, so that the operational reliability of the gate insulating film 17 is ensured.

However, when the thin thermally oxidized film 14 is produced by the thermal oxidation method and when the nitrogen atoms are added to the thin thermally oxidized film 14, stress is generated on the surface of the silicon substrate 11, so that tensile stress is produced in the silicon substrate 11. Therefore, when the effective gate length (the channel length) is short, there is a new drawback in that the threshold voltage is shifted so that the operational reliability of the MIS transistor 23 deteriorates.

FIG. 2 is a graphic view of experimental results showing the shift of the threshold voltage.

The X-axis indicates the effective gate length $L_{eff}$ and the Y-axis indicates the threshold voltage $V_{th}$. Moreover, a curve A connecting the white circles indicates experimental results obtained when the tensile stress caused in the silicon substrate 11 is comparatively small. On the other hand, a curve B connecting the black triangles indicates experimental results obtained when the tensile stress caused in the silicon substrate 11 is comparatively large.

As shown in FIG. 2, in cases where the tensile stress caused in the silicon substrate 11 is comparatively small, the threshold voltage is not shifted even if the effective gate length is shortened to about 2 μm. On the other hand, in cases where the tensile stress caused in the silicon substrate 11 is comparatively large, the threshold voltage is distinctly shifted even if the effective gate length is very large.

To improve the performance of each device, the improvement of the electronic performance of the conventional MISFET transistor is described.

FIG. 3 is a cross sectional view of a third conventional MISFIT transistor.

As shown in FIG. 3, in the third conventional MISFET transistor, a silicon oxide film 27 is, for example, produced by the thermal oxidation method in the same manner as the gate insulating film 17 in the second conventional MISFET transistor. Thereafter, a silicon nitride film 26 is deposited on the silicon oxide film 27 by a liquid phase chemical vapor deposition (LPCVD) method, so that a lamination layer consisting of the silicon oxide and silicon nitride films 26, 27 is formed as a gate insulating film 28.

In the above configuration of the third conventional MIS transistor, because the silicon nitride film 26 is deposited in exchange for the upper part of the silicon oxide 17, the permittivity of the gate insulating film 28 is higher than that of the gate insulating film 17 formed by only the silicon oxide film. Therefore, the capacitance of the gate insulating film 28 formed by the laminated layers is increased so that load drivability (that is, drain current Id) of the third conventional MISFET transistor is improved.

However, the third conventional MISFET transistor with the laminated gate insulating film 28 has a drawback in that device characteristics such as the threshold value and charge-pumping current are easily shifted by the hot-carrier phenomenon.

To describe the above drawback in detail, many experimental results relating to the shift of the threshold value and the charge-pumping current were obtained as follows.

FIG. 4 shows, in tabular form, sample fabrication conditions for the nitrified silicon oxide films 26 and the pure silicon oxide films 27 with various thicknesses in the third conventional MISFET transistor.

As shown in FIG. 4, various combinations of nitride and oxide thicknesses were chosen for the experiments. A symbol "PO" represents the first conventional MISFET transistor which is provided with only a pure silicon oxide film as the gate insulating film. The experimental results of the first conventional MISFET transistor are shown for reference. On the other hand, a symbol "ON" represents the third conventional MISFET transistor which is provided with laminated gate insulating film 28 formed by the silicon nitride oxide film 26 and the pure silicon oxide film 27.

The experimental results are designated by the symbols "ON x"s and "PO". Fort example, "ON 5–6n" represents the third conventional MISFET transistor provided with the pure silicon oxide film 27 (5 nm in thickness) and the silicon nitride film 26 (6 nm in thickness).

FIG. 5 shows the dependence of a drain current $I_{D0}$ at a drain voltage $V_D=3$ V and an effective gate voltage $V_G-V_{TH}=3$ V on the physical thickness of the gate insulating film 28 for the various types of films.

In FIG. 5, the X-axis indicates the physical thickness of the gate insulating film 28. The Y-axis indicates the drain current $I_{D0}$ designating the load drivability.

As shown in FIG. 5, the third conventional MISFET transistors has excellent drivability compared with those of the first conventional MISFET transistors with the pure silicon oxide film. The reason is that the nitrified silicon oxide film has high permittivity.

FIGS. 6A and 6B show the initial threshold voltage of the n-channel and p-channel MISFET transistors before the hot carrier stress is applied to the MISFET transistors, the transistors being provided with the various gate films 26, 27 shown in FIG. 4.

In FIGS. 6A and 6B, the X-axis indicates an oxide equivalent thickness Tox of the laminated gate film 28. The oxide equivalent thickness is calculated by converting the thickness of the silicon nitride film 26 into the equivalent thickness of the silicon oxide film without changing the capacitance. The Y-axis indicates the threshold voltage $V_{th}$.

As shown in FIGS. 6A and 6B, the absolute values of the threshold voltage $V_{th}$ increase with an increase of the film thickness of the silicon nitride film 26.

FIGS. 7A and 7B show the initial charge-pumping current of the n-channel and p-channel MISFET transistors before hot carrier stress is applied to the transistors, the transistors being provided with the various gate films 26, 27 shown in FIG. 4.

In FIGS. 7A and 7B, the X-axis indicates the oxide equivalent thickness Tox of the laminated gate insulating film 28. The Y-axis indicates the initial charge-pumping current $I_{CP}$.

As shown in FIGS. 7A and 7B, the absolute values of the initial charge-pumping currents $I_{CP}$ increase with the increase of the film thickness of the nitrified silicon oxide film 26.

FIGS. 8A and 8B are graphic views of experimental results respectively showing the shift of the threshold voltage caused by the hot carrier stress applied to the third conventional MISFET transistor for 1000 seconds, the transistor being provided with the laminated gate insulating film 28 shown in FIG. 4.

The experimental result shown in FIG. 8A were obtained in an N channel MIS transistor provided with a gate insulating film formed with a channel length of 1 μm and a channel width of 10 μm. Each experimental result shown in FIG. 8B is obtained in an P channel MIS transistor provided with a gate film formed by a channel length 1 μm and a channel width 10 μm.

To cause hot carrier stress in the substrate, a drain voltage of 5 V was applied to the N channel MIS transistor (a drain voltage of –5 V for the P channel MIS transistor) and a specific voltage was applied to a gate electrode for 1000 seconds so as to generate the maximum substrate current. The substrate current was generated by a prescribed voltage applied to the gate electrode so as to discharge the electric charges trapped in the gate insulating film to the substrate.

In FIGS. 8A and 8B, the X-axis is the oxide equivalent thickness Tox of the laminated gate insulating film 28. The Y-axis is the threshold voltage shift $\Delta V_{th}$ which was obtained by subtracting a threshold voltage value measured before the hot carrier stress was applied to the substrate from another threshold voltage value measured after the hot carrier stress was applied to the substrate.

As shown in FIGS. 8A and 8B, the threshold voltage shift is extremely large in the case of 6 nm nitride samples "ON 3–6n" and "ON 5–6n". The reason is that electrons can be easily trapped in the silicon nitride film 26. This means that the silicon nitride film 26 needs to be equal to or less than 4 nm in thickness, and as small as 3 nm if possible.

FIGS. 9A and 9B are graphic views of the experimental results showing the shift of the charge-pumping current caused by the hot carrier stress applied to the third conventional MIS transistors for 1000 seconds, the transistors being provided with the laminated gate insulating film 28 shown in FIG. 4.

The experimental results shown in FIG. 9A were obtained by an N channel MIS transistor provided with a gate insulating film formed with a channel length of 1 μm and a channel width of 10 μm. The experimental results shown in FIG. 9B were obtained by an P channel MIS transistor provided with a gate insulating film formed with a channel length of 1 μm and a channel width of 10 μm.

To cause hot carrier stress in the substrate, a drain voltage of 5 V was applied to the N channel MIS transistor (a drain voltage of −5 V for the P channel MIS transistor) and a specific voltage was applied to a gate electrode for 1000 seconds, so as to generate the maximum substrate current.

In FIGS. 9A and 9B, the X-axis is an oxide equivalent thickness Tox of the laminated gate insulating film 28 in the same manner as in FIGS. 8A and 8B. The Y-axis is a charge-pumping current shift ΔIcp which was obtained by subtracting a charge-pumping current measured before the hot carrier stress was applied to the substrate from another charge-pumping current measured after the hot carrier stress was applied to the substrate. The charge-pumping current shift ΔIcp designates the number of generated hot carriers or the density of interface-states resulting from the hot carriers because the charge-pumping current is proportional to the density of the interface-states.

As shown in FIG. 9A, the dependence of the charge-pumping current shift $\Delta I_{CP}$ on the film thickness of the silicon nitride film 26 is weak in the n-channel MISFET transistors. On the other hand, as shown in FIG. 9B, the dependence of the charge-pumping currents shift $\Delta I_{CP}$ on the film thickness of the silicon nitride film 26 is strong in the p-channel MISFET transistors. The reason is that a large number of interface states are generated when the film thickness of the silicon nitride film 26 is small, particularly in the 3 nm case.

Accordingly, to withstand the hot carrier stress, the MISFET transistor must be formed by the laminated gate insulating film in which the film thickness of the silicon nitride is more than 3 nm.

Moreover, as shown in FIGS. 8B and 8B, it is difficult to reduce both the threshold voltage shift $\Delta V_{th}$ and the charge-pumping current shift ΔIcp at any film thickness in the MISFET transistor.

Accordingly, there is a drawback in that the operational reliability of the MIS transistor with the laminated gate insulating film deteriorates regardless of whether the P channel MIS transistor is provided with a thin or thick silicon nitride film.

Conventionally, a MOSFET transistor comprises:

a substrate;

a source region produced in the substrate;

a gate region produced in the substrate adjacent to the source region;

a drain region, produced in the substrate adjacent to the gate region, for receiving charges provided from the source region, a gate oxidation film produced on the gate region;

a gate electrode produced on the gate oxidation film;

a source electrode; and a drain electrode.

In the above configuration of the MOSFET transistor, to prevent impure atoms existing in the gate electrode from diffusing to the substrate and to improve the operational reliability of the MOS transistor, the nitrogen concentration of the gate oxidation film is set from 2% to 10%. In other words, the nitrogen concentration of the gate oxidation film is very high.

However, because the nitride is highly concentrated in the gate oxidation film, a great deal of Coulomb scattering is generated by fixed charges existing in the gate oxidation film. Therefore, the transconductance Gm deteriorates in the conventional P channel and N channel MOSFET transistors.

Moreover, because the nitride is highly concentrated in the gate oxidation film, the tensile stress is caused in the P type substrate. Therefore, the drivability (drain current) deteriorates in the conventional P channel MOSFET transistor.

SUMMARY OF THE INVENTION

One object of the present invention is to provide, with due consideration to the drawbacks of a conventional semoconductor device, a method for fabricating a semiconductor device in which the operational reliability designated by the threshold voltage shift and the charge-pumping current is improved and to provide the semiconductor device fabricated by the method.

Another object of the present invention is to provide a method for fabricating a semiconductor device in which the transconductance and drivability are improved and to provide the semiconductor device fabricated by the method.

The above object is achieved by the provision of a method for fabricating a semiconductor device on a silicon substrate, comprising:

a silicon oxide film producing step for producing a silicon oxide film on the silicon substrate;

a silicon nitride film producing step for producing a thin silicon nitride film on the silicon oxide film;

a thermal nitridation step for thermally nitriding the silicon nitride film in an atmosphere of nitrogenous gas;

a conductive film producing step for producing a conductive film on the silicon nitride film nitrided in the atmosphere of the nitrogenous gas;

a gate region producing step for producing a gate region from the silicon oxide film produced in the silicon oxide film producing step, the silicon nitride film nitrided in the thermal nitridation step, and the conductive film produced in the conductive film producing step, a channel region being positioned under the gate region in the silicon substrate;

a source region producing step for producing a source region in the silicon substrate adjacent to one side of the channel region;

a drain region producing step for producing a drain region in the silicon substrate adjacent to another side of the channel region; and a wiring region producing step for producing wiring regions on the source region, the drain region, and the gate region, the semiconductor device being fabricated by the gate region, the channel region, the source region, the drain region, and the wiring regions.

In the above method, many silicon atoms not bonded to other atoms are generated in the silicon nitride film, for example, by a liquid phase chemical vapor deposition method. Therefore, many interface states are generated by the silicon atoms not bonded to other atoms in the silicon nitride film, so that threshold voltage is greatly shifted after hot carrier stress is applied to the device.

To reduce the interface states, the silicon nitride film is heated and nitrided in an atmosphere of nitrogenous gas, for example, at temperatures ranging from 700° C. to 1200° C.

for a short time, so that the silicon atoms not bonded to other atoms are bonded to nitrogen atoms. In other words, the silicon nitride film is densified and the number of interface states is reduced.

Therefore, even if hot carriers are generated in the channel region, the hot carriers are transmitted between the source and drain regions without being trapped by the interface states generated in the silicon nitride film.

Accordingly, the semoconductor device fabricated by the above method does not deteriorate as a result of the hot carriers during the operation. That is, the operational performance such as threshold voltage and charge-pumping current is not shifted.

According to the above method, a semiconductor device fabricated on a silicon substrate, comprising:

a source region which is produced in one upper region of the silicon substrate;

a drain region for receiving a drain current from the source region through a channel region, the drain region being produced in another upper region of the silicon substrate;

a silicon oxide film for insulating gate charge from the channel region of the silicon substrate, the film being positioned on the channel region;

a thin silicon nitride film positioned on the silicon oxide film for insulating the gate charge from the channel region of the silicon substrate, the number of interface states in the thin silicon nitride film being reduced by a rapid thermal nitridation in an atmosphere of nitrogenous gas;

a gate electrode for accumulating the gate charge, the gate electrode being positioned on the thin silicon nitride film; and wiring regions for applying the gate charge to the gate electrode and the drain current to the source region and receiving the drain current from the drain region.

In the above configuration, hot carriers generated in The channel region are not trapped in the thin silicon nitride film because the number of interface states is reduced.

Accordingly, the deterioration of the device resulting from threshold voltage shift and the like can be prevented.

Moreover, the object is further achieved by the provision of a method for fabricating a semiconductor device on a silicon substrate, comprising:

a silicon oxide film producing step for producing a silicon oxide film on the silicon substrate;

a silicon nitride film producing step for producing a thin silicon nitride film on the silicon oxide film;

a thermal nitridation step for thermally nitriding the silicon nitride film in an atmosphere of nitrogenous gas;

a silicon nitride film oxidizing step for oxidizing the silicon nitride film nitrided in the thermal nitridation step;

a conductive film producing step for producing a conductive film on the silicon nitride film oxidized by the dry oxygen;

a gate region producing step for producing a gate region from the silicon oxide film produced in the silicon oxide film producing step, the silicon nitride film oxidized in the silicon nitride film oxidizing step, and the conductive film produced in the conductive film producing step, a channel region being positioned under the gate region in the silicon substrate;

a source region producing step for producing a source region in the silicon substrate adjacent to one side of the channel region;

a drain region producing step for producing a drain region in the silicon substrate adjacent to another side of the channel region; and a wiring region producing step for producing wiring regions on the source region, the drain region, and gate region, the semiconductor device being fabricated by the gate region, the channel region, the source region, the drain region, and the wiring regions.

In the above method, the silicon nitride film is heated and nitrided in an atmosphere of nitrogenous gas, for example, at temperatures ranging from 700° C. to 1200° C. for a short time to reduce the number of interface states. Moreover, the silicon nitride film is oxidized by the dry oxygen in a furnace atmosphere, for example, at a temperature of 800° C. for 30 minutes.

Therefore, the silicon atoms not bonded to other atoms are bonded to nitrogen atoms. In other words, the silicon nitride film is densified and many interface states are reduced.

Moreover, leak currents resulting from tunnel currents penetrating from the conductive film into the silicon substrate can be prevented by the oxidized surface of the silicon nitride film.

Accordingly, even if hot carriers are generated in the channel region, the hot carriers are transmitted between the source and drain regions without being trapped by the interface states generated in the silicon nitride film.

Moreover, the operational characteristics of the semiconductor device fabricated by the above method do not deteriorate, so that load drivability and hot carrier reliability can be maintained at a high level.

Further, the object is achieved by the provision of a method for fabricating a semiconductor device on a silicon substrate, comprising:

a silicon oxide film producing step for producing a silicon oxide film on the silicon substrate;

a silicon nitride film producing step for producing a thin silicon nitride film on the silicon oxide film;

a thermal annealing step for annealing the silicon nitride film in an atmosphere of argon gas;

a conductive film producing step for producing a conductive film on the silicon nitride film annealed in the atmosphere of argon gas;

a gate region producing step for producing a gate region from the silicon oxide film produced in the silicon oxide film producing step, the silicon nitride film annealed in the thermal annealing step, and the conductive film produced in the conductive film producing step, a channel region being positioned under the gate region in the silicon substrate;

a source region producing step for producing a source region in the silicon substrate adjacent to one side of the channel region;

a drain region producing step for producing a drain region in the silicon substrate adjacent to another side of the channel region; and a wiring region producing step for producing wiring regions on the source region, the drain region, and the gate region, the semiconductor device being fabricated by the gate region, the channel region, the source region, the drain region, and the wiring regions.

In the above method, the silicon nitride film is heated and annealed in an atmosphere of argon gas, for example, at temperatures ranging from 700° C. to 1200° C. for a short time to reduce the number of interface states. As a result, the silicon atoms not bonded to other atoms are bonded to nitrogen atoms. In other words, the silicon nitride film is densified and many interface states are reduced.

Therefore, even if hot carriers are generated in the channel region, the hot carriers are transmitted between the source and drain regions without being trapped by the interface states generated in the silicon nitride film.

Accordingly, the semiconductor device fabricated by the above method does not deteriorate as a result of the hot carriers during the operation. That is, the operational performance such as threshold voltage and charge-pumping current is not shifted.

The object is further achieved by the provision of a method for fabricating a semiconductor device on a silicon substrate, comprising:

a silicon oxide film producing step for producing a silicon oxide film on the silicon substrate;

a silicon nitride film producing step for producing a thin silicon nitride film of the silicon oxide film;

a rapid thermal annealing step for anealing the silicon nitride film in an atmosphere of argon gas at temperatures ranging from 700° C. to 1200° C. for a short time;

a silicon nitride film oxidizing step for oxidizing the surface of the annealed silicon nitride film by dry oxygen in a furnace atmosphere at a temperature of 800° C. for 30 minutes;

a conductive film producing step for producing a conductive film on the silicon nitride film oxidized by the dry oxygen;

an etching step for etching the silicon oxide and nitride films and the conductive film to a prescribed pattern so as to produce a gate region formed by the remaining silicon oxide and nitride films and the remaining conductive film, a channel region being positioned under the gate region in the silicon substrate;

a source region producing step for producing a source region in the silicon substrate adjacent to one side of the channel region;

a drain region producing step for producing a drain region in the silicon substrate adjacent to another side of the channel region; and a wiring region producing step for producing wiring regions on the source region, the drain region, and the gate region.

In the above method, the silicon nitride film is annealed in an atmosphere of argon gas, for example, at temperatures ranging from 700° C. to 1200° C. for a short time to reduce the number of interface states. Moreover, the surface of the silicon nitride film is oxidized by the dry oxygen in a furnace atmosphere at a temperature of 800° C. for 30 minutes.

Therefore, the silicon atoms not bonded to other atoms are bonded to nitrogen atoms. In other words, the silicon nitride film is densified and the number of interface states is reduced.

Moreover, leak currents resulting from tunnel currents penetrating from the conductive film to the silicon substrate can be prevented by the oxidized surface of the silicon nitride film.

Accordingly, even if hot carriers are generated in the channel region, the hot carriers are transmitted between the source and drain regions without being trapped by the interface states generated in the silicon nitride film.

Moreover, the operational characteristics of the semiconductor device fabricated by the above method do not deteriorate, so that load drivability and hot carrier reliability can be maintained at a high level.

The object is further achieved by the provision of a method for fabricating a semiconductor device on a silicon substrate, comprising:

a silicon oxide film producing step for producing a silicon oxide film on the silicon substrate by a liquid phase deposition method;

a silicon oxide film densifying step for densifying the silicon oxide film by vaporizing water included in the silicon oxide film;

a thermal nitridation step for thermally nitriding the silicon oxide film densified in the silicon oxide film densifying step;

a nitrided silicon film re-oxidizing step for re-oxidizing the surface of the nitrided silicon oxide film in an atmosphere of dry oxygen at temperatures around 1100° C. for a short time;

a conductive film producing step for producing a conductive film on the re-oxidized silicon nitride film;

a gate region producing step for producing a gate region from both the silicon oxide film produced in the silicon oxide film producing step and the conductive film produced in the conductive film producing step, a channel region being positioned under the gate region in the silicon substrate;

a source region producing step for producing a source region in the silicon substrate adjacent to one side of the channel region;

a drain region producing step for producing a drain region in the silicon substrate adjacent to another side of the channel region; and a wiring region producing step for producing wiring regions on the source region, the drain region, and the gate region, the semiconductor device being fabricated by the gate region, the channel region, the source region, the drain region, and the wiring regions.

In the above method, the silicon oxide film is densified, nitrided and re-oxidized. Therefore, a large amount of tensile stress is not generated as compared with a silicon oxide film produced by a thermal oxidization method.

Accordingly, the threshold voltage is not decreased greatly even if the gate length is shortened. Therefore, a short channel effect can be prevented.

Another object is achieved by the provision of a method for fabricating a semiconductor device on a silicon substrate, comprising:

a silicon oxide film producing step for producing a silicon oxide film on the silicon substrate;

a rapid thermal nitridation step for thermally nitriding the silicon oxide film in an atmosphere of nitrogenous gas by a rapid thermal nitridation method so as to produce an interface region in which the nitrogen concentration is between 0.2 atom % and 1.0 atom %, the interface region being positioned between the silicon oxide film and the silicon substrate;

a conductive film producing step for producing a conductive film on the silicon oxide film;

a gate region producing step for producing a gate region from both the silicon oxide film nitrided in the rapid thermal nitridation step and the conductive film produced in the conductive film producing step, a channel region being formed under the gate region in the silicon substrate;

a source region producing step for producing a source region in the silicon substrate adjacent to one side of the channel region;

a drain region producing step for producing a drain region in the silicon substrate adjacent to another side of the channel region; and a wiring region producing step for producing wiring regions on the source region, the drain region, and the gate region, the semiconductor device being fabricated by the gate region, the channel region, the source region, the drain region, and the wiring regions.

In the above method, because the nitrogen concentration of the interface region is between 0.2 atomic % and 1.0 atomic %, Coulomb scattering and tensile stress are reduced after hot carrier stress is applied.

Accordingly, characteristics such as threshold voltage, interface state, initial load drivability and transconductance do not deteriorate.

Moreover, the characteristics do not deteriorate even if the hot carrier stress is applied.

According to the above method, a semiconductor device fabricated on a silicon substrate, comprises:

a source region which is produced in one upper region of the silicon substrate;

a drain region for receiving a drain current from the source region through a channel region, the drain region being produced in another upper region of the silicon substrate;

a silicon oxide film positioned on the channel region for insulating gate charge from the channel region of the silicon substrate, the film being nitrided by a rapid thermal nitridation method in an atmosphere of nitrogenous gas;

an interface region in which the nitrogen concentration is between 0.2 atom % and 1.0 atomic %, the interface region being formed between the silicon oxide film and the silicon substrate;

a gate electrode for accumulating the gate charge, the gate electrode being positioned on the silicon oxide film; and wiring regions for applying the gate charge to the gate electrode and the drain current to the source region and receiving the drain current from the drain region.

In the above configuration, because the nitrogen concentration of the interface region is between 0.2 atomic % and 1.0 atomic %, the number of fixed charge in the interface region is reduced. Therefore, Coulomb scattering in the interface region is reduced.

Moreover, tensile stress is reduced so that drivability is not reduced.

BRIEF DESCRIPTION OF THE DRAWINGS

FIG. 4 shows sample fabrication conditions for nitrified silicon oxide films and pure silicon oxide films with various thicknesses in the third conventional MISFET transistor in tabular form.

FIG. 12 shows the sample fabrication conditions for a gate insulating film formed by a silicon nitride film and a heated pure silicon oxide film in MISFET transistors according to the first and third embodiments in tabular form.

FIGS. 16A and 16B are graphic views of experimental results showing the dependence of charge-pumping current change induced by hot carrier on the equivalent film thickness Tox of a gate insulating film for MISFET transistors listed in FIG. 12.

FIG. 19 is a graphic view of experimental results showing the dependence of the equivalent film thickness Tox of a "ON" sample on re-oxidation.

FIG. 21 shows SIMS measurement conditions in tabular form.

FIG. 24 shows the ramp heating process conditions, the oxide equivalent thicknesses Tox, and the nitrogen concentrations of samples.

FIGS. 30A, 30B, 30C, and 30D show the dependence of the initial drain current $I_D$ on the nitrogen concentration with the gate voltage $V_G$ as a parameter, the initial drain current $I_D$ being normalized to that of a "PO" sample.

FIGS. 31A, 31B, 31C, and 31D show the dependence of hot carrier degradation on nitrogen concentration.

DETAILED DESCRIPTION OF THE PREFERRED EMBODIMENTS

Preferred embodiments of a semiconductor device and a method for fabricating the semiconductor device according to the present invention are described with reference to the drawings.

FIGS. 10A to 10F are respectively cross sectional views of a MIS transistor according to a first embodiment of the present invention, showing the fabricating processes.

Figure 10A:
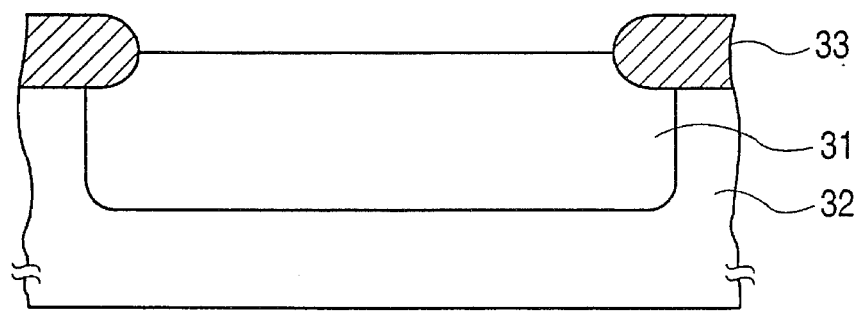
FIGS. 10A to 10F are respectively cross sectional views of a MIS transistor according to a first embodiment of the present invention, showing the fabricating processes.

As shown in FIG. 10A, a p-type well region 31 is initially formed at an upper position on a n-type monocrystal silicon substrate 32, then field oxidation films 33 for separating devices fabricated on the n-type monocrystal silicon substrate 32 are formed.

Figure 10B:
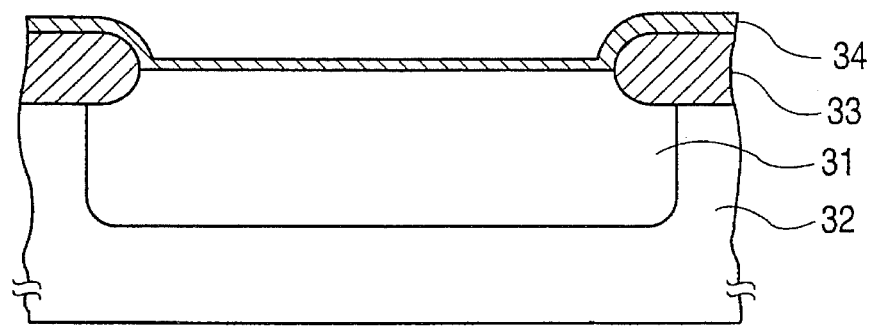

Thereafter, as shown in FIG. 10B, a heated silicon oxide film 34 is formed at about 5 nm thickness over the entire n-type monocrystal silicon substrate 32 by a thermal oxidation method.

In detail, the surfaces of the p-type well region 31 and the field oxidation films 33 are exposed to dry oxygen at a temperature of 800° C. in a furnace atmosphere to oxidize the surfaces of the region 31 and the films 33.

Figure 10C:
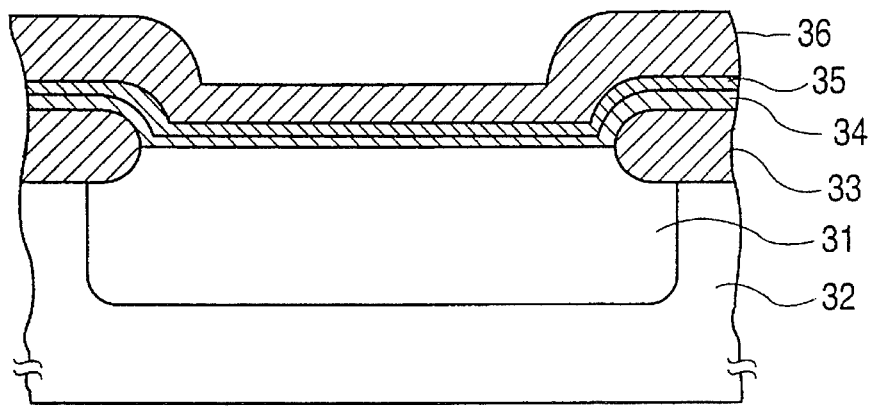

Thereafter, as shown in FIG. 10C, a silicon nitride film 35 is deposited on the heated silicon oxide film 34 to a thickness of about 3 nm by a liquid phase chemical vapor deposition (LPCVD) method.

Thereafter, to nitride the silicon nitride film 35, a ramp heating process is performed for a short time at temperatures ranging from 700° C. to 1200° C. in an atmosphere of nitrogenous gas such as an ammonia ($NH_3$) gas, $NF_3$, or $N_2O$.

As a result, the silicon nitride film 35 is nitrified, so that silicon atoms not bonded to other atoms in the silicon nitride film 35 are bonded to nitrogen atoms.

Thereafter, a polycrystalline silicon film is deposited on the silicon nitride film 35 to a thickness of about 300 nm by a LPCVD method.

Thereafter, p-type impurities such as $BF_2$ are implanted into the polycrystalline silicon film at a dose of $5 \times 10^{15}$ cm$^{-2}$ and an accelerating voltage of 35 KeV to form a $P^+$ polycrystalline silicon film 36. Therefore, a laminated film, consisting of the heated silicon oxide film 34, the silicon nitride film 35, and the $P^+$ polycrystalline silicon film 36, is formed.

Thereafter, a resist pattern is drawn on the $P^+$ polycrystalline silicon film 36.

Figure 10D:
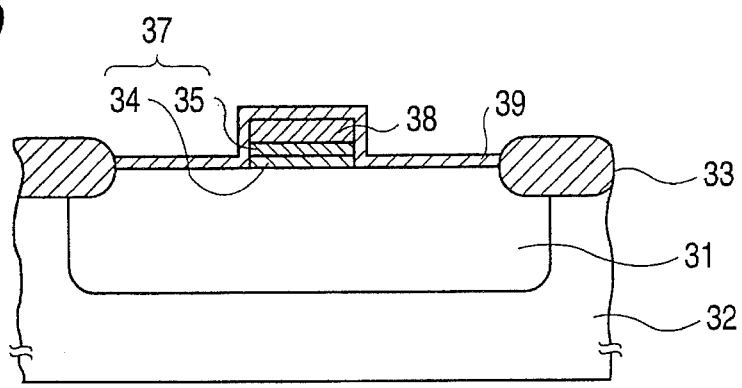

As shown in FIG. 10D, the heated silicon oxide film 34, the silicon nitride film 35, and the $P^+$ polycrystalline silicon film 36 are then etched anisotropically, so that a gate insulating film 37 is formed by the remaining parts of both the heated silicon oxide film 34 and the silicon nitride film 35, and a gate electrode 38 is formed by the remaining parts of the $P^+$ polycrystalline silicon film 36. The gate insulating film 37 and the gate electrode 38 form a gate region.

Thereafter, a silicon oxide film 39 is formed in the surface of the p-type well region 31 and the $P^+$ polycrystalline silicon film 36 to a thickness of about 12 nm at a temperature of 850° C. in an oxygen atmosphere.

Figure 10E:
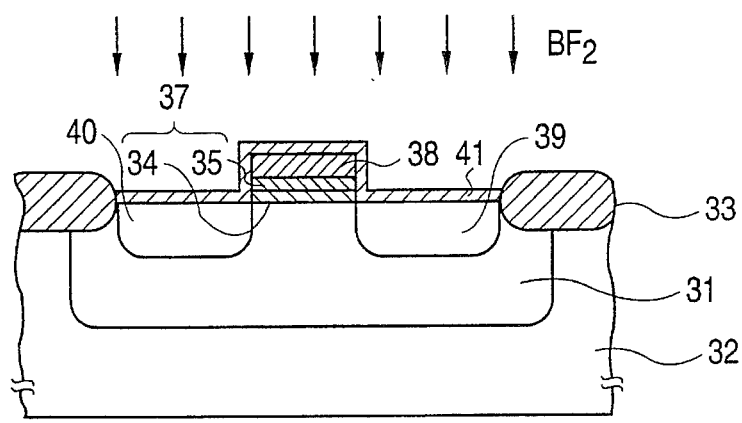

Thereafter, as shown in FIG. 10E, p-type impurities such as $BF_2$ are implanted into the p-type well region 31, except for a part of the p-type well region 31 masked by the gate electrode 38, at a dose of $5 \times 10^{15}$ cm$^{-2}$ and an accelerating voltage of 30 KeV, so that a source region 40 and a drain region 41 are respectively formed in self-alignment with the gate electrode 38.

Figure 10F:
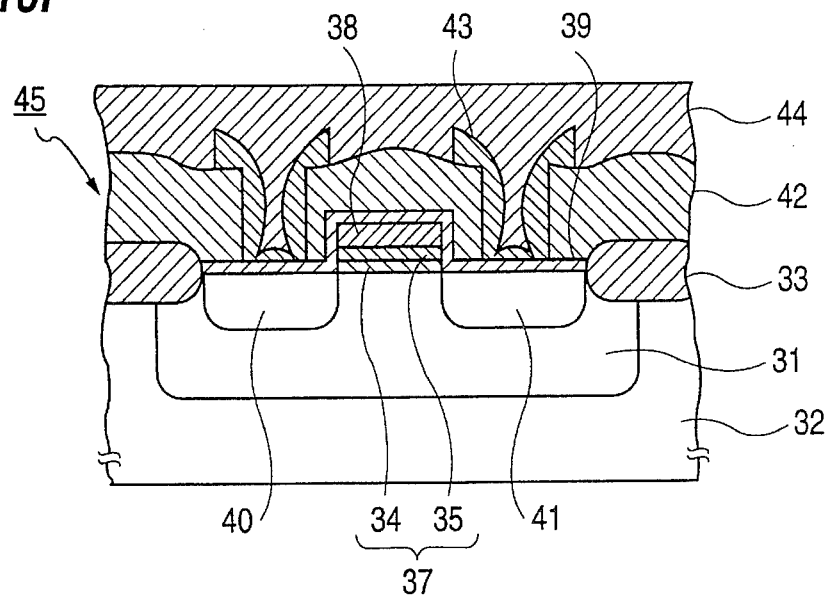

Thereafter, as shown in FIG. 10F, a layer insulating film 42 consisting of a silicon oxide ($SiO_2$) film deposited by the CVD method and a boron phospho silicate glass film are deposited to a thickness of about 900 nm over the entire n-type monocrystal silicon substrate 32. After the deposition, phosphorus is diffused into the latter insulating film 42 for 90 minutes at a temperature of 850° C., so that the layer insulating film 42 is fluidized.

The surface of the layer insulating film 42 is flattened by the diffusion of the phosphorus. In addition, the impurities included in the gate electrode 38, the source region 40, and the drain region 41 are activated.

Thereafter, parts of the layer insulating film 42 are opened by a PEP method to form contact holes through which the source region 40, the drain region 41, and the gate region are respectively exposed. Thereafter, a wiring material, such as Al—Si—Cu, is deposited on the source region 40, the drain region 41, and the gate region 37, 38 by a sputtering method. Then, a prescribed wiring pattern is drawn by a photolithography method for the wiring material deposited on the regions. Thereafter, the wiring material is etched, while pieces of the wiring material remain. As a result, a plurality of wiring fields 43 are formed.

Finally, a passivation film 44 such as a phospho silicate glass film is deposited over the entire n-type monocrystal silicon substrate 32, then parts of the passivation film 44 are opened to form pad fields (not shown). As a result, a semiconductor device is fabricated. Therefore, a MISFET transistor 45 consisting of many semiconductor devices is provided.

In the configuration of the MISFET transistor 45, the capacitance of the gate insulating film 37 is large. Therefore, the load drivability is enhanced in the same manner as in the conventional MIS transistor.

In addition, hot carriers generated in the p-type well region 31 during the operation are not easily trapped in the silicon nitride film 35. The reason is as follows.

In the silicon nitride film 26 deposited by the LPCVD method, there are many silicon atoms not bonded to other atoms. The hot carriers are easily trapped by those silicon atoms in the conventional MISFET transistor. However, the silicon atoms not bonded to other atoms are bonded to nitrogen atoms because the silicon nitride film 35 is nitrified by the ramp heating process performed after the LPCVD method. In other words, the silicon nitride film 35 is densified and the number of interface states generated by the un-bonded silicon is reduced. Therefore, even if the hot carriers are generated, the hot carriers are transmitted to the drain region 41 without being trapped in the silicon nitride film 35.

Further, the interface-states are not easily formed in the gate insulating film 37 because the densification of The gate insulating film 37 is improved.

Accordingly, the deterioration of the operational reliability resulting from the shift of the threshold value and the shift of the charge-pumping current can be prevented.

In the first embodiment, the silicon nitride film 35 is heated and nitrified in the ramp heating process by heating for a short time at temperatures ranging from 700° C. to 1200° C. in a gaseous atmosphere including nitrogen atoms such as ammonia ($NH_3$), $NF_3$, or $N_2O$. However, it is preferable that the silicon nitride film 35 be annealed in a ramp heating process by heating for a short time at a high temperature in a gas atmosphere including argon atoms. As a result, an annealed silicon nitride film 46 is produced in an MISFET transistor 47.

Moreover, it is preferable that the silicon nitride film 35 be deposited to a thickness of less than 3 nm.

Next, a method for fabricating a semiconductor device according to a second embodiment of the present invention and the semiconductor device are described.

To fabricate the semiconductor device according to the second embodiment, after producing the field oxidation films 33 and the p-type well region 31 on the n-type monocrystal silicon substrate 32 in the same manner as in the first embodiment, a silicon nitride film about 6 nm thick is deposited on the field oxidation films 33 and the p-type well region 31 by the LPCVD method in place of the heated silicon oxide film 34.

Thereafter, the gate electrode 38, the silicon oxide film 39, the source region 40, the drain region 41, the layer insulating film 42, the wiring fields 43, and the passivation film 44 are respectively produced in that order by various processes such as the ramp heating process in the same manner as in the first embodiment. As a result, the semiconductor device according to the second embodiment is fabricated. Therefore, a MISFET transistor according to the second embodiment is produced.

In the MISFET transistor according to the second embodiment, the load drivability and the hot carrier reliability are improved in the same manner as in the first embodiment.

Moreover, the producing process for producing the heated silicon oxide film 34 can be omitted. Therefore, the manufacturing time of the MISFET transistor is shortened.

Next, a method for fabricating a semiconductor device according to a third embodiment of the present invention and the semiconductor device are described.

To fabricate the semiconductor device according to the third embodiment, after producing the field oxidation films 33, the p-type well region 31, the gate insulating film 37, and the gate electrode 38 on the n-type monocrystal silicon substrate 32 in the same manner as in the first embodiment, the silicon nitride film 35 is re-oxidized to produce an oxidation film (not shown) on the silicon nitride film 35. In detail, the silicon nitride film 35 is exposed to an atmosphere of HCl gas at a temperature of 800° C. for 30 minutes in a furnace.

Therefore, in the MISFET transistor according to the third embodiment, a 3-layer gate insulating film produced by the laminated gate insulating film 37 and the oxidation film re-oxidized on the silicon nitride film 35.

Thereafter, the silicon oxide film 39, the source region 40, the drain region 41, the layer insulating film 42, the wiring fields 43, and the passivation film 44 are respectively produced in that order by various processes in the same manner as in the first embodiment.

In the MISFET transistor according to the third embodiment, the load drivability and the hot carrier reliability are improved in the same manner as in the first embodiment.

Moreover, leak currents resulting from tunnel currents penetrating from the gate electrode 38 to the p-type well region 31 can be prevented by the oxidation film produced on the gate insulating film 37. Therefore, the operational characteristics of the MISFET transistor do not deteriorate, so that the load drivability and hot carrier reliability can be maintained at a high level.

In the third embodiment, the oxidation film produced on the gate insulation film 37 is produced in the furnace atmosphere. However, it is preferable that the oxidation film produced on the gate insulation film 37 be produced by a ramp heating process in which the gate electrode 38 is exposed to oxygen gas for a short time at a temperature of 1100° C.

Moreover, after producing the oxidation film produced on the gate insulation film 37, it is preferable that the oxidation film produced on the gate insulation film 37 be nitrified in a ramp heating process by heating for a short time at temperatures ranging from 700° C. to 1200° C. in a gas atmosphere including nitrogen atoms such as an ammonia ($NH_3$) gas, $NF_3$, or $N_2O$.

Further, after producing the oxidation film produced on the gate insulation film 37, it is preferable that the oxidation film produced on the gate insulation film 37 be annealed in a ramp heating process by heating for a short time at a high temperature in argon gas.

Next, to describe the operational characteristics of the MISFET transistors according to the first and third embodiments of the present invention in detail, many experimental results are shown for the shift of the threshold value and the charge-pumping current.

Figure 11:
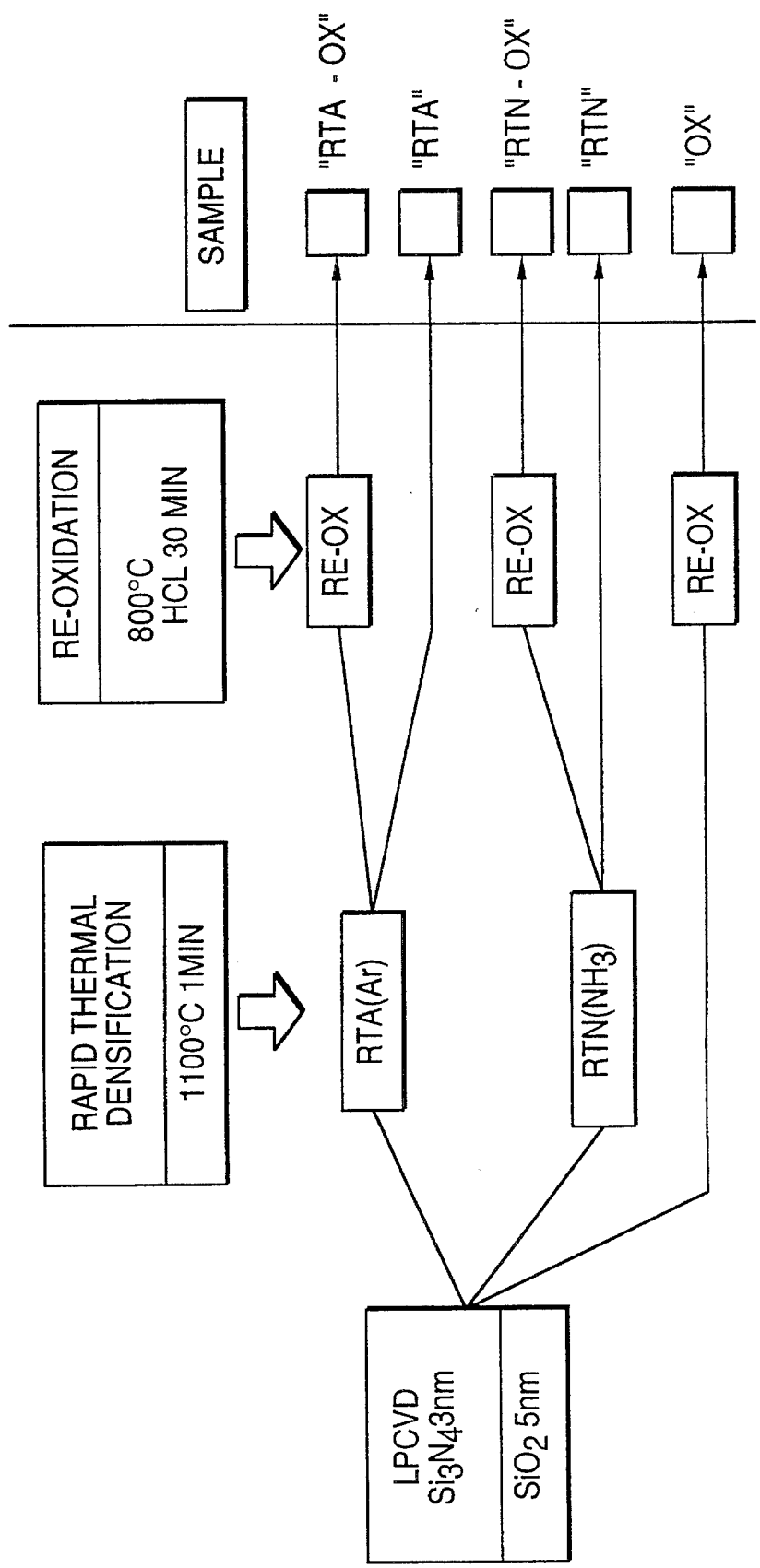
FIG. 11 is an explanatory diagram for showing the preparation of samples according to the first and third embodiment.

FIG. 11 is an explanatory diagram for showing the preparation of samples according to the first and third embodiment.

As shown in FIG. 11, the MISFET transistor according to the first embodiment in which the gate insulating film 37 is exposed to argon gas is designated by a symbol "RTA". That is, the MISFET transistor designated "RTA" is annealed in a Rapid Thermal Annealing process. On the other hand, the MISFET transistor according to the first embodiment in which the gate insulating film 37 is exposed to the ammonia (NH$_3$) gas is designated by a symbol "RTN". That is, the MISFET transistor designated "RTN" is annealed in a Rapid Thermal Nitrification process.

Moreover, the MISFET transistor fabricated by re-oxidizing the gate insulating film 37 exposed to the argon gas according to the third embodiment is designated by a symbol "RTA–OX". On the other hand, the MISFET transistor fabricated by re-oxidizing the gate insulating film 37 exposed to the ammonia gas according to the third embodiment is designated by a symbol "RTN–OX".

Further, the MISFET transistor fabricated by re-oxidizing the gate insulating film 37 without exposure to any gas is designated by a symbol "OX".

FIG. 12 shows sample fabrication conditions for the gate insulating film 37 formed by both the silicon nitride film 35 and the heated pure silicon oxide film 34 in the MISFET transistors according to the first and third embodiments in tabular form.

The oxide equivalent thicknesses Tox of the various gate insulating films 37 are shown in FIG. 12. Moreover, the annealing or nitrifying conditions are shown. In most cases, annealing or nitridation is accomplished by a rapid thermal process. Some of the samples are re-oxidized in the furnace atmosphere ("–OX" and "OX").

Figure 13A:
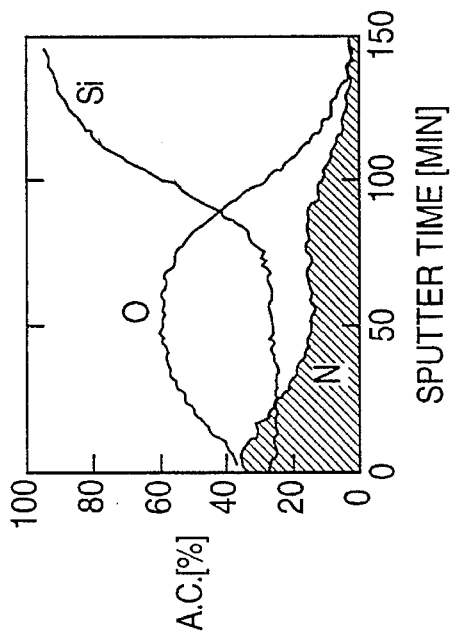
FIG. 13A shows an AES profile of a silicon nitride film of the third conventional MISFET transistor.

FIG. 13A shows an AES profile of the silicon nitride film 26 of the third conventional MISFET transistor.

Figure 13B:
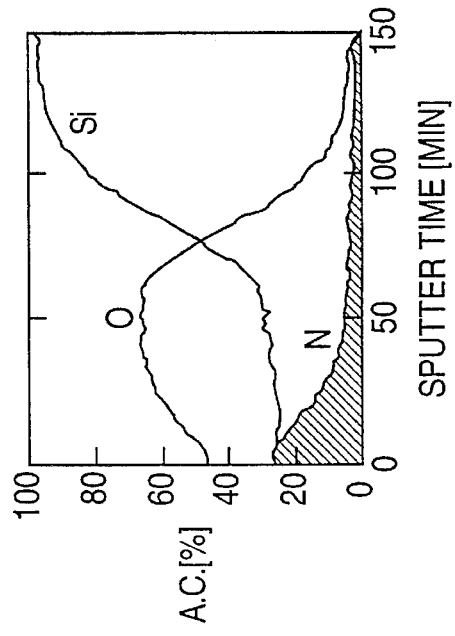
FIG. 13B shows an AES profile of a silicon nitride film of a MISFET transistor designated by "RTN".

FIG. 13B shows an AES profile of the silicon nitride film 35 of the MISFET transistor designated "RTN".

Figure 13C:
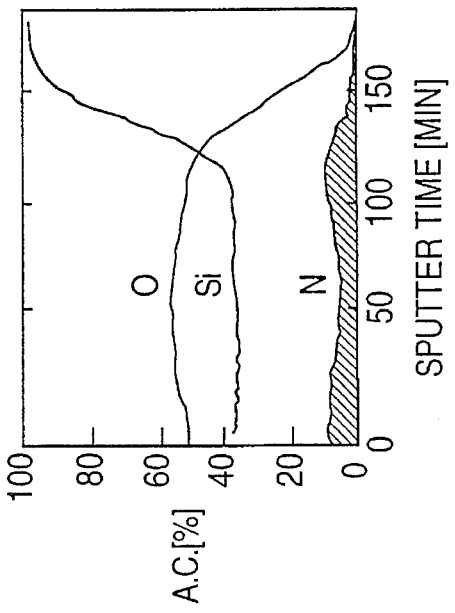
FIG. 13C shows an AES profile of a silicon nitride film of the MISFET transistor designated by "RTA".

FIG. 13C shows an AES profile of the silicon nitride film 35 of the MISFET transistor designated "RTA".

Figure 13D:
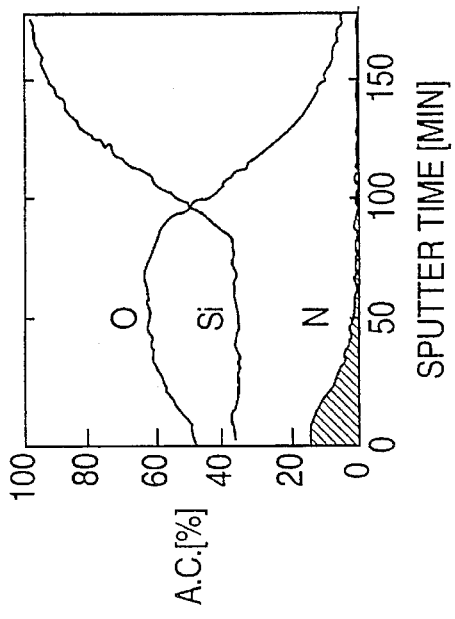
FIG. 13D shows an AES profile of a heated silicon oxide film of MISFET transistor designated by "PO", the rapid thermal nitridation process being performed at a temperature of 1200° C.

FIG. 13D shows an AES profile of the heated silicon oxide film 34 of the MISFET transistor designated "PO", the rapid thermal nitridation process being performed at a temperature of 1200° C.

As shown in FIGS. 13A to 13D, various samples are measured by Augier Electroscope (AES) analysis.

A significant increase in the nitrogen concentration (16% at the surface) is observed as shown in FIG. 13B. Moreover, nitrogen concentration at the interface is 10% as shown in FIG. 13D.

Figure 14:
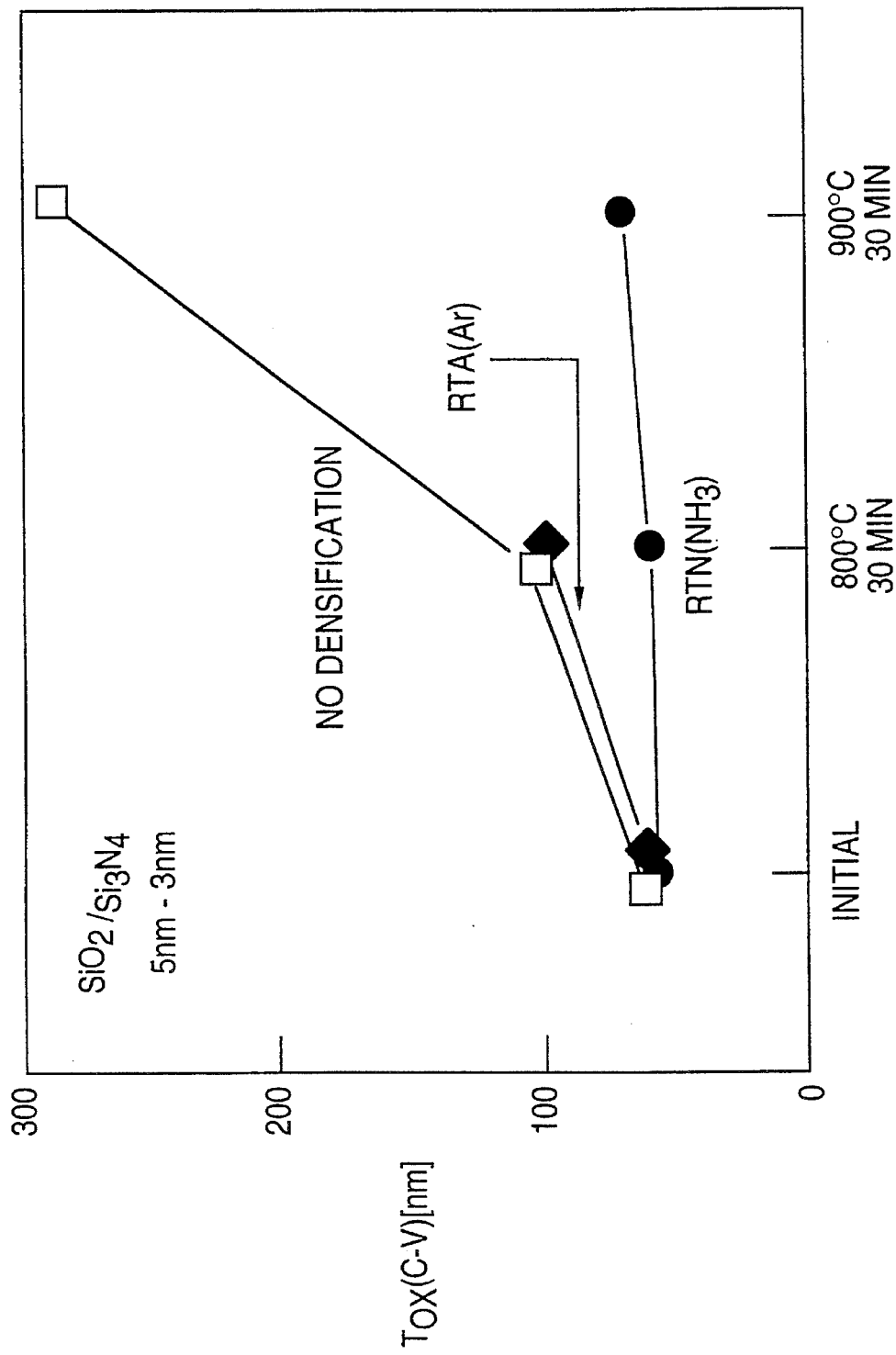
FIG. 14 is a graphic view of experimental results showing film thickness growth during re-oxidation for a rapid thermal densified film.

FIG. 14 is a graphic view of the experimental results showing the film thickness increase during the re-oxidation to obtain the rapid thermal densified film.

Figure 15B:
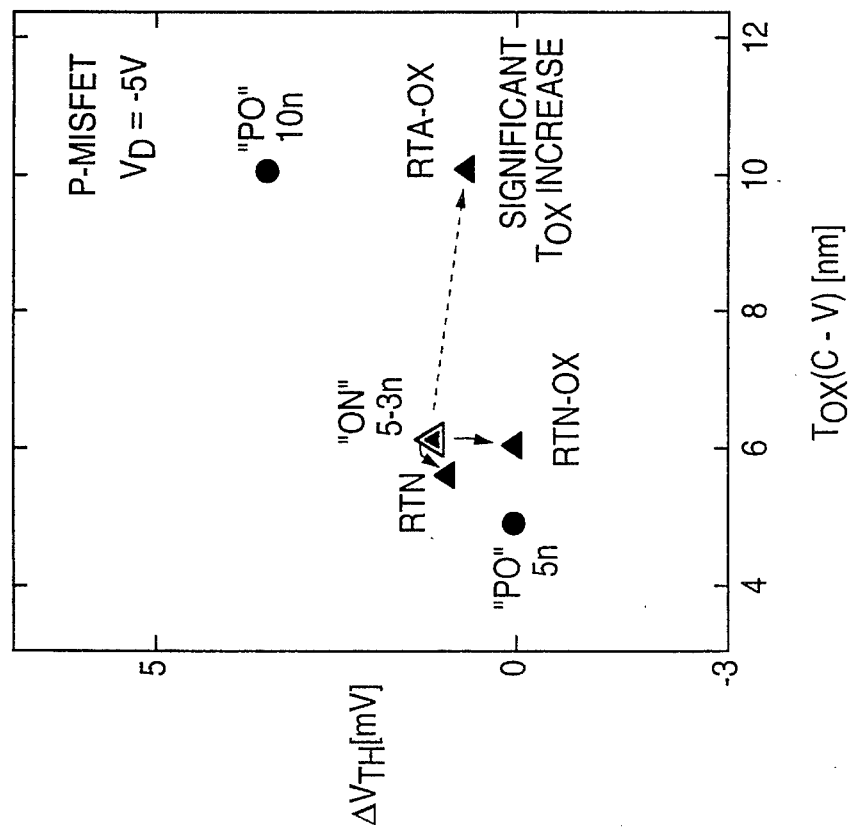
FIGS. 15A and 15B are graphic views of experimental results showing the dependence of the threshold voltage shift induced by a hot carrier on the equivalent film thickness Tox of a gate insulating film for MISFET transistors listed in FIG. 12.
Figure 15A:
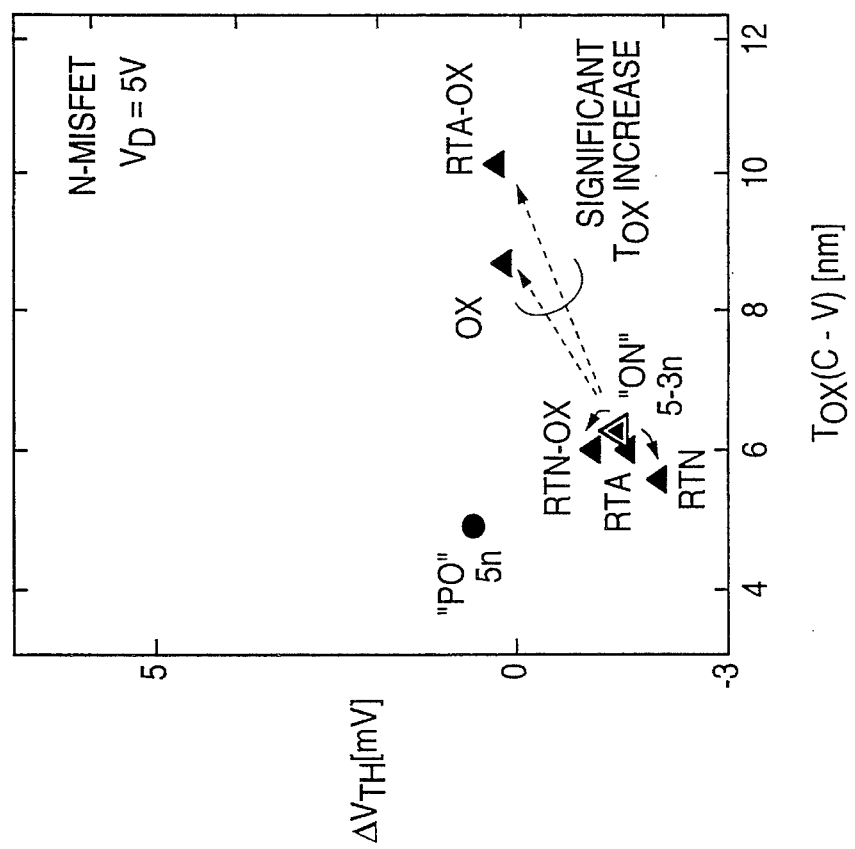

FIGS. 15A and 15B are graphic views of experimental results showing the dependence of the threshold voltage shift induced by the hot carrier on the equivalent film thickness Tox of the gate insulating film 37 for the MISFET transistors listed in FIG. 12.

FIGS. 16A and 16B are graphic views of experimental results showing the dependence of the charge-pumping current change induced by the hot carrier on the equivalent film thickness Tox of the gate insulating film 37 for the MISFET transistors listed in FIG. 12.

The experimental results shown in FIGS. 15A and 16A are obtained by the N channel MISFET transistors provided with a gate film formed with a channel length of 1 μm and a channel width of 10 μm. The experimental results shown in FIGS. 15B and 16B are obtained by the P channel MISFET transistors provided with a gate film formed with a channel length of 1 μm and a channel width of 10 μm.

To cause hot carrier stress in the substrate, a drain voltage of 5 V is applied to the N channel MIS transistors (a drain voltage of −5 V for the P channel MIS transistors) and a specific voltage is applied to a gate electrode so as to generate the maximum substrate current. The hot carrier stress is applied to the transistors for 1,000 seconds.

In FIGS. 15A, 15B, 16A, and 16B, the X-axis is the oxide equivalent thickness Tox of the laminated gate insulating film 37. In FIGS. 15A and 15B, the Y-axis is the threshold voltage shift $\Delta V_{th}$, which is obtained by subtracting a threshold voltage value measured before the hot carrier stress is applied to the transistors from another threshold voltage value measured after the hot carrier stress is applied to the transistors. In FIGS. 16A, and 16B, the Y-axis is the charge-pumping current-change $\Delta Icp$ which is obtained by subtracting a charge-pumping current value measured before the hot carrier stress is applied to the transistors from another charge-pumping current value measured after the hot carrier stress is applied to the transistors.

Figure 8B:
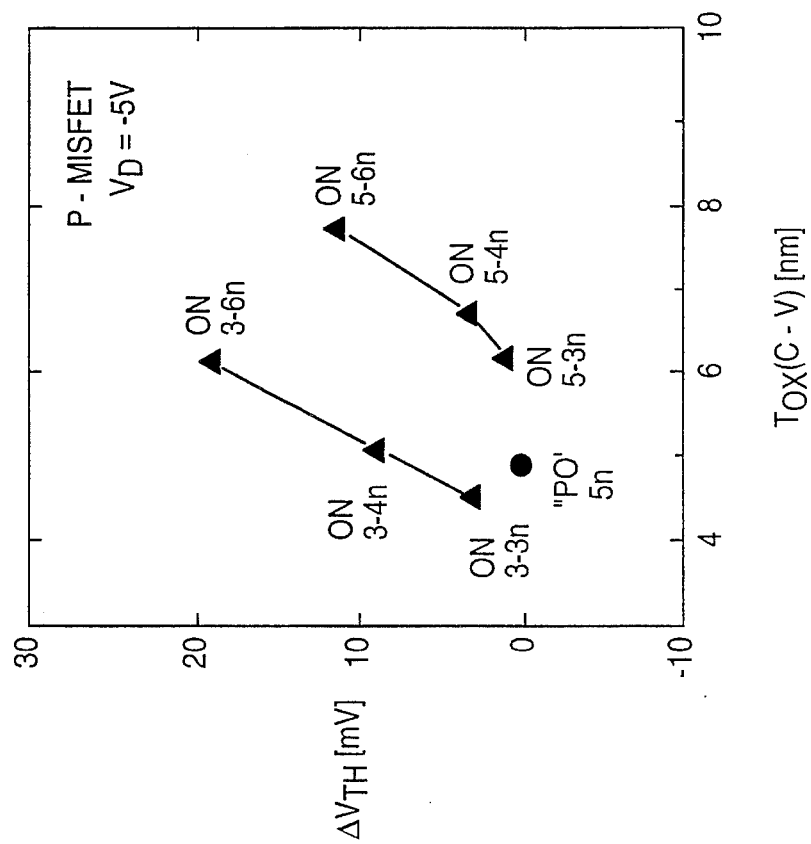
FIGS. 8A and 8B are graphic views of experimental results respectively showing the shift of threshold voltage caused by hot carrier stress applied to the third conventional MIS transistors for 1,000 seconds, the transistors being provided with a laminated gate insulating film shown in FIG. 4.
Figure 8A:
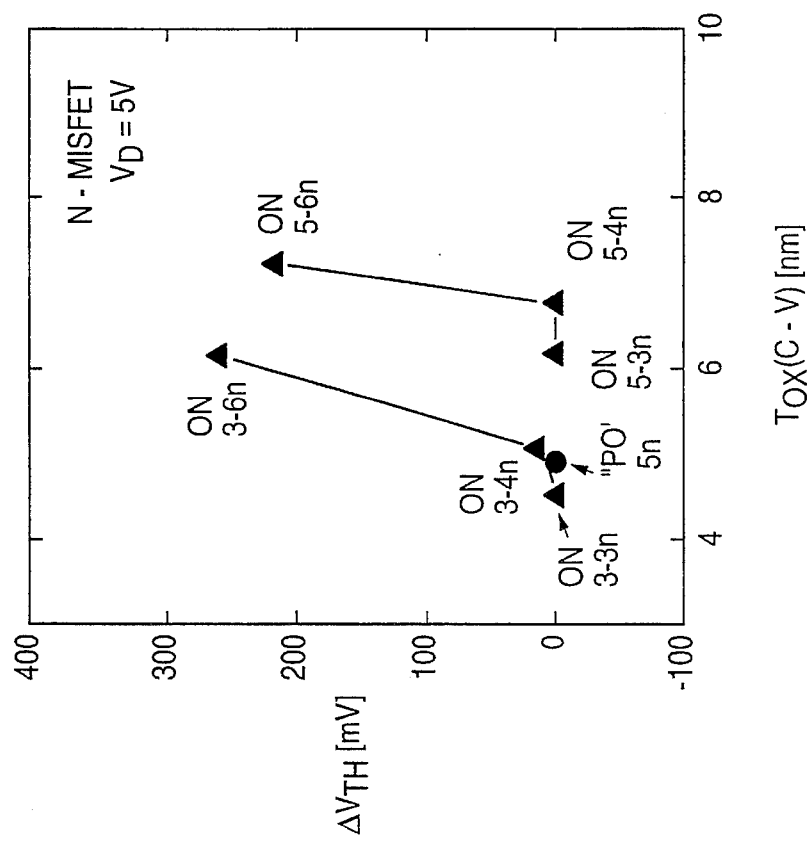

As shown in FIGS. 15A and 15B, the shifts in the threshold voltage are extremely small both in the n-channel and p-channel MISFET transistors in comparison with those of the transistors shown in FIGS. 8A and 8B. The reason is as follows.

Figure 9B:
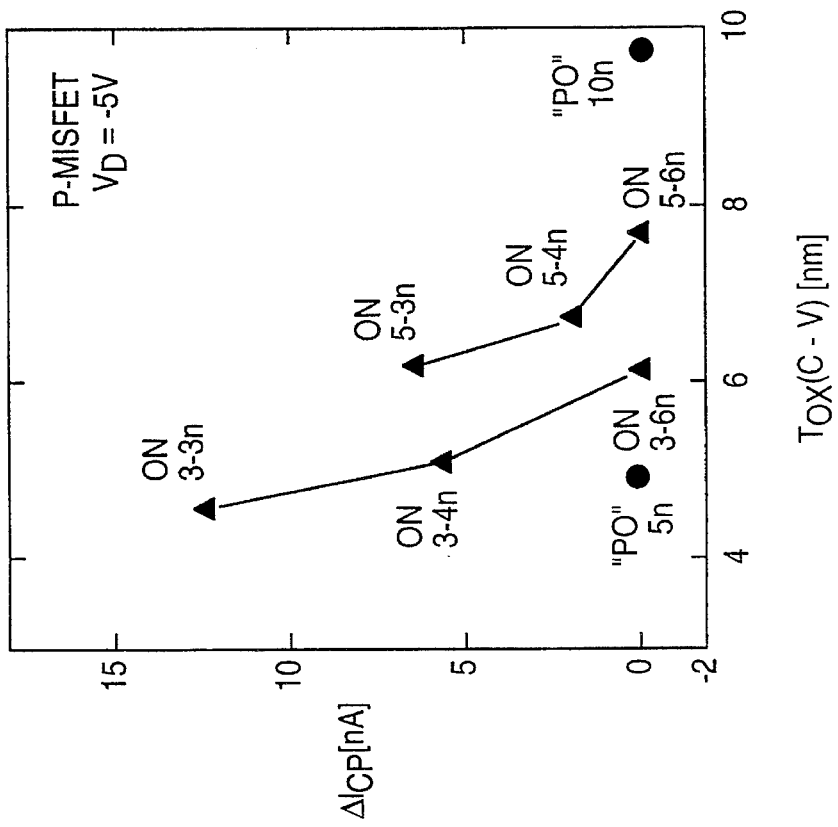
FIGS. 9A and 9B are graphics of experimental results showing the shift of charge-pumping current caused by hot carrier stress applied to the third conventional MIS transistors for 1,000 seconds, the transistors being provided with a laminated gate insulating film shown in FIG. 4.
Figure 9A:
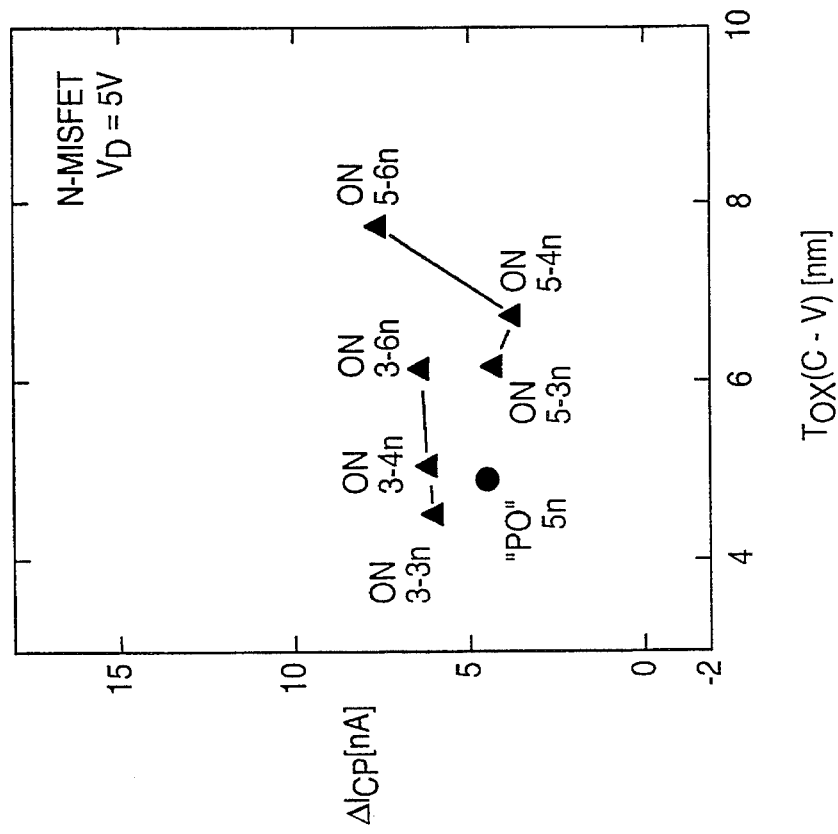

In the n-channel MISFET transistors, a small number of interface states are generated in the silicon nitride film 35, as shown in FIG. 9A, because the thickness of the silicon nitride films 35 is only 3 nm. Therefore, the number of hot carriers trapped in the silicon nitride films 35 is small, so that the n-channel MISFET transistors deteriorate. On the other hand, in the p-channel MISFET transistors, a large number of interface states are generated in the silicon nitride film 35 as shown in FIG. 9B because the thickness of the silicon nitride films 35 is only 3 nm. However, the number of hot carriers trapped in the silicon nitride films 35 is small because of a tunnel effect. Therefore, the p-channel MISFET transistors do not deteriorate.

However, the oxide equivalent thicknesses Tox of the samples "OX" and "RTA–OX" are larger than 8 nm, so that the capacitance is reduced. Therefore, the samples "OX" and "RTA–OX" are not desirable.

As shown in FIG. 16A, the sample "RTA" does not lead to any improvement. That is, the film quality of "RTA" does not improve as anticipated. On the contrary, as shown in FIGS. 16A and 16B, the film quality of "RTN", "RTN–OX", "RTA–OX", and "OX" drastically improve. One reason is because, for example, the SiN bonding of the sample "RTN" tightens within the silicon nitride film 35. In the p-channel MISFET transistor, "RTN–OX" interface state generation related to the charge-pumping current is further reduced.

However, the oxide equivalent thicknesses Tox of "OX" and "RTA–OX" are larger than 8 nm, so that the capacitance is reduced. Therefore, "OX" and "RTA–OX" are not desirable.

Figure 17B:
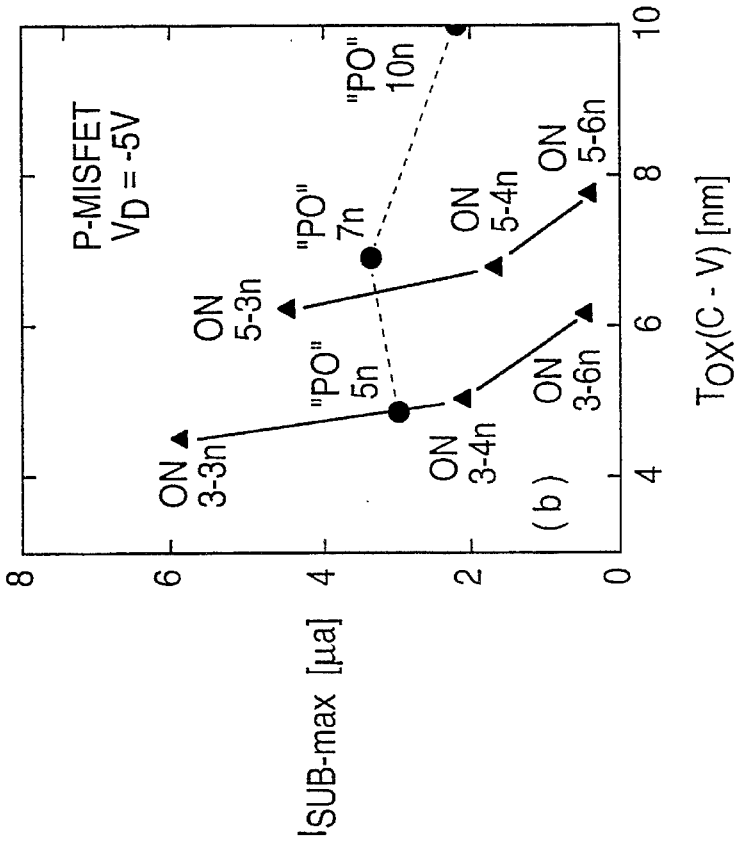
FIGS. 17A and 17B are graphic views of experimental results showing dependence of the maximum substrate current on the equivalent film thickness Tox of a gate insulating film for MISFET transistors listed in FIG. 4.
Figure 17A:
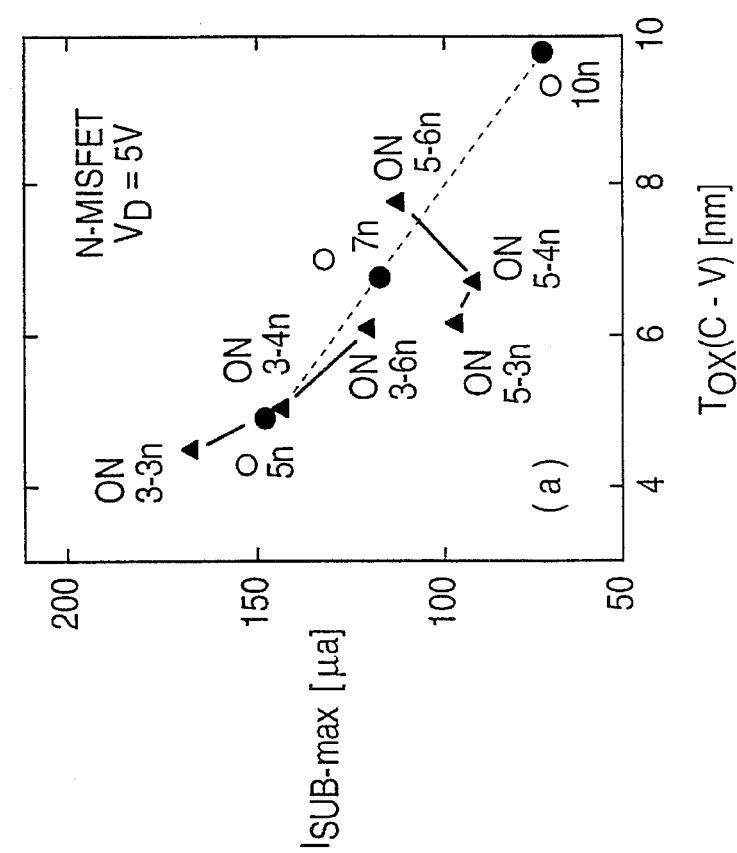

FIGS. 17A and 17B are graphic views of experimental results showing the dependence of the maximum substrate current on the equivalent film thickness Tox of the gate insulating film 28 for the conventional MISFET transistors listed in FIG. 4.

Figure 18A:
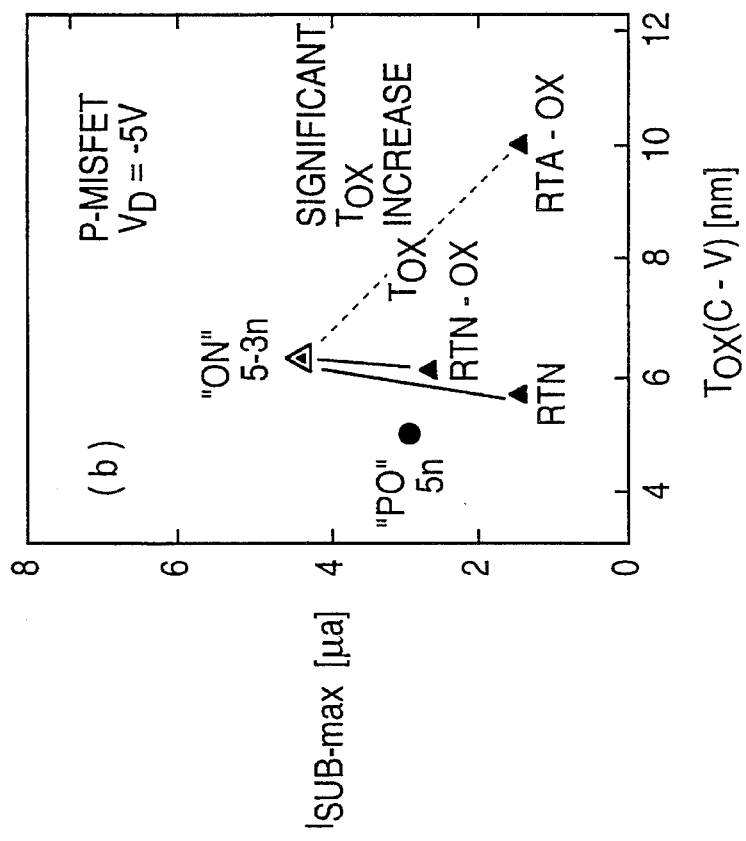
FIGS. 18A and 18B are graphic views of experimental results showing the dependence of the maximum substrate current on the equivalent film thickness Tox of a gate insulating film for the MISFET transistors listed in FIG. 11.
Figure 18B:
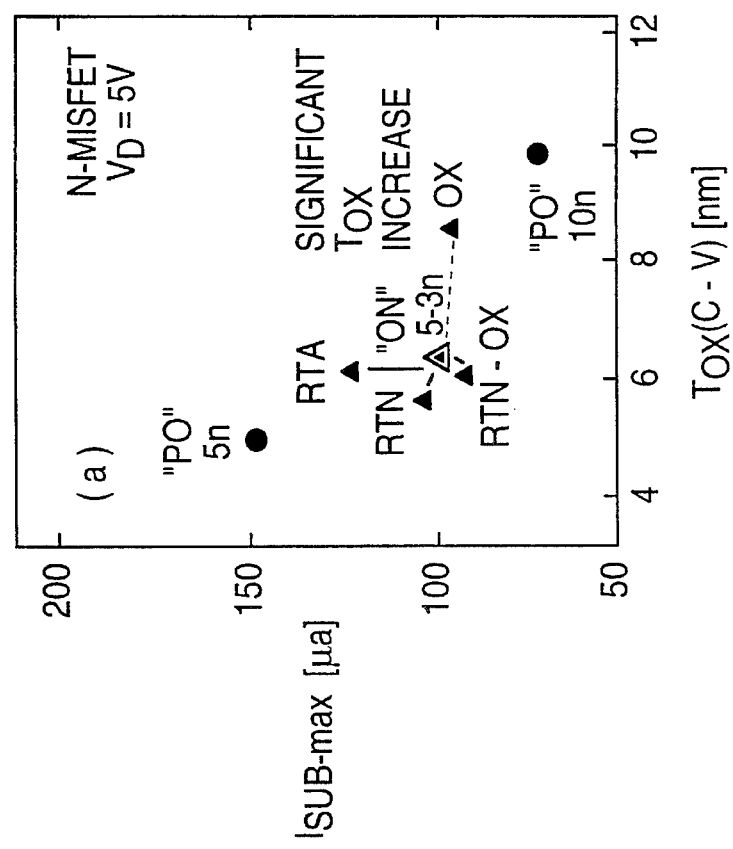

FIGS. 18A and 18B are graphic views of experimental results showing the dependence of the maximum substrate current on the equivalent film thickness Tox of the gate insulating film 37 for the MISFET transistors listed in FIG. 12.

The experimental results shown in FIGS. 17A and 18A were obtained for the N channel MISFET transistors provided with a gate film formed with a channel length of 1 μm and a channel width of 10 μm. The experimental results shown in FIGS. 17B and 18B were obtained for the P channel MISFET transistors provided with a gate film formed with a channel length of 1 μm and a channel width of 10 μm.

In FIGS. 17A, 17B, 18A, and 18B, the X-axis is the oxide equivalent thickness Tox of the gate insulating film 28 or the gate insulating film 37. The Y-axis is the maximum substrate current.

As shown in FIGS. 17B and 18B, it is evident that the substrate current or the hot carrier generation corresponds to the interface state generation or the charge-pumping current. Thus, the significant interface generation in the p-channel MISFET transistor is due to the high rate of hot carrier generation or large substrate current.

However, the interface state generation of "ON 5–3n" is significantly improved by rapid thermal nitridation or rapid thermal annealing because the hot carrier generation or the substrate current is reduced as shown in FIG. 18B.

As shown in FIGS. 17A and 18A, no such universal relationship between the substract current and degradation is observed, and the improvement in the interface generation for the "RTN" in FIG. 16A is due to the improvement of film quality in spite of the increase in substrate current in FIG. 18A.

FIG. 19 is a graphic view of experimental results showing the dependence of the equivalent film thickness Tox of the "ON" sample on the re-oxidation.

As shown in FIG. 19, the equivalent film thickness Tox is shifted relative to the operation time of the re-oxidation process.

As mentioned above with reference to FIGS. 10 to 19, the improvement of hot carrier reliability in the MISFET transistors with the silicon nitride film 35 deposited by the LPCVD method is investigated. When the silicon nitride film 35 is thick, the shift in the threshold voltage due to electrons trapped in the silicon nitride film 35 is significant. This shift falls to the level of the shift in pure oxide samples when the film thickness of the silicon nitride film 35 is decreased to 3 nm or 4 nm. Densification of the silicon nitride film 35 by high temperature RTP is investigated for any further film quality improvements. Simple rapid thermal annealing performed on the silicon nitride film 35 does not improve the quality at all. On the other hand, the rapid thermal nitridation performed on the silicon nitride film 35 significantly improves the quality. Interface state state generation by the hot carriers fall significantly. After rapid thermal nitridation is performed on the silicon nitride film 35, the sample "RTN" can withstand re-oxidation, while the sample "RTA" cannot withstand re-oxidation.

Accordingly, the rapid thermal nitridation performed on the silicon nitride film 35 is essential in order to improve the hot carrier reliability.

The present invention is not limited by the above embodiments. For example, in the above embodiments, a single layer wiring is performed. However, multi-layer wiring is possible.

In detail, after producing a first wiring in a first layer, a silicon oxide film is deposited on the wiring by a plasma CVD method at a relatively how temperature without adverse effect on the wire. Thereafter, via holes are produced to expose the wire in desired positions, then a second wiring is deposited on the silicon oxide film and the via holes. Thereafter, the same process is repeated to produce the multi-layer wiring. Finally, the wire in the top layer is covered by a passivation film, then parts of the passivation film are opened to produce pad sections.

In the above embodiments, n-channel-MISFET transistors are utilized. However, the present invention can be applied to a dual gate CMIS circuit.

Further, in the above embodiments, the silicon nitride film 35 is produced by the LPCVD method. However, it is preferable that the silicon nitride film 35 be deposited by, for example, a sputter method.

The MISFET transistor is provided with the silicon nitride film 35. However, it is preferable that the MISFET transistor be provided with a ferroectric film such as tantalum oxide ($Ta_2O_5$) in place of the silicon nitride film 35.

The MISFET transistor is provided with the p-type well region 31. However, the p-type well region 31 is not necessarily required. That is, it is preferable that the gate insulating film 37 be produced on the n-type monocrystal silicon substrate 32.

The present invention is not limited to the n-type monocrystal silicon substrate 32. That is, it is preferable that the gate insulating film 37 be produced on an n-type or p-type silicon substrate.

In the above embodiments, a single layer of gate electrode 38 formed by the $P^+$ polycrystalline silicon film 36 is utilized. However, it is preferable that a silicide film formed by a high melting point metal such as Ti, Co, or Ni be produced on the gate electrode 38 to make a multi-layer gate electrode.

Moreover, it is preferable that a silicide film formed by a metal silicide be produced on the gate electrode 38 to make a multi-layer gate electrode.

Next, a method for fabricating a semiconductor device according to a fourth embodiment of the present invention and the semiconductor device are described with reference to FIGS. 20 to 34.

FIGS. 20A to 20H are respectively cross sectional views of a semiconductor device produced in a CMOS transistor according to a fourth embodiment of the present invention, showing a method for fabricating the semiconductor device.

Figure 20A:
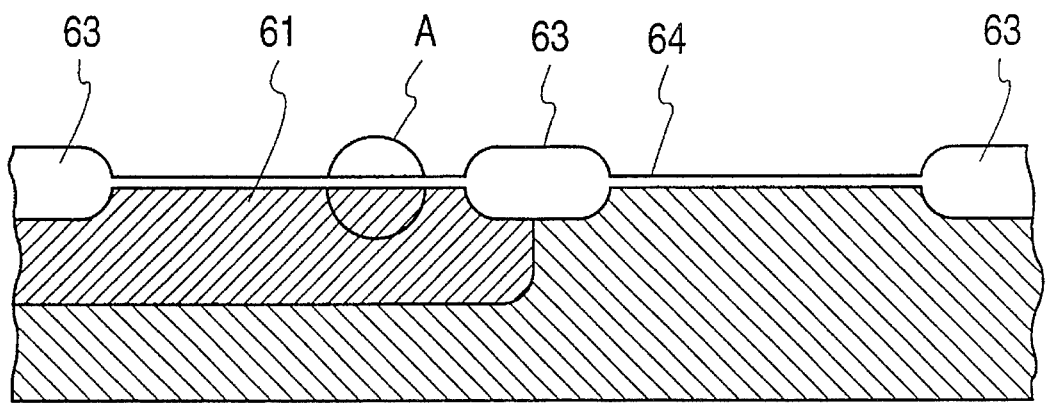
FIGS. 20A to 20H are respectively cross sectional views of a semiconductor device produced in a CMOS transistor according to a fourth embodiment of the present invention, showing a method for fabricating the semiconductor device.
Figure 20B:
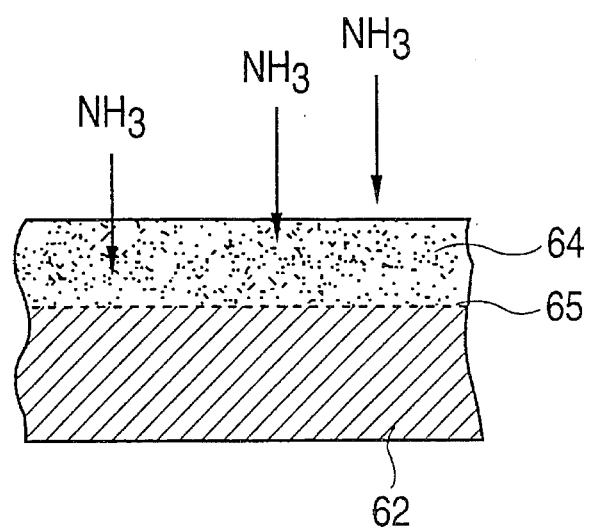

As shown in FIG. 20A, a p-type well region 61 is initially formed on the upper half of a n-type monocrystal silicon substrate 62, then field oxidation films 63 for separating devices fabricated on the n-type monocrystal silicon substrate 62 are formed. In this case, a half region with the p-type well region 61 between the field oxidation films 63 is provided for fabricating an n-channel semiconductor device. The half region is called an NMOS field. On the other hand, another half region with no p-type well region 61 between The field oxidation films 63 is provided for fabricating an p-channel semiconductor device. The other half region is called a PMOS field.

Thereafter, the surface of the n-type monocrystal silicon substrate 62 is oxidized by a dilute HCl gas to produce a silicon oxide film with a thickness of about 50 Å (5 nm). Thereafter, a ramp heating process is performed to nitride the silicon oxide film, for example, at a temperature of 900° C. for 5 seconds in an ammonia (or, $N_2O$, $N_2$, or $NF_3$ gas) atmosphere. In addition, the nitrided silicon oxide film is re-oxidized under the same temperature and time condition as in the ramp heating process. Therefore, a gate insulating film 64 formed by the re-oxidized and nitrided silicon oxide film is produced. In this case, as illustrated by a section A shown in FIG. 20A and shown on an enlarged scale in FIG. 20B, an interface region 65 about 10 Å thick is produced between the n-type monocrystal silicon substrate 62 and the gate insulating film 64. The nitrogen concentration of the interface region 65 becomes, for example, less than 1 atom % on average.

Figure 20C:
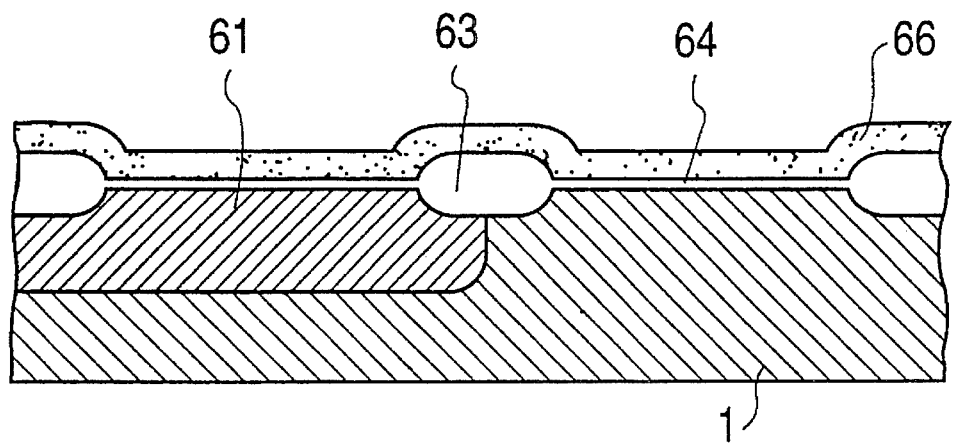

Thereafter, as shown in FIG. 20C, a polycrystalline-silicon film 66 about 4000 Å thick is deposited on the gate insulating film 64 by the LPCVD method.

Figure 20D:
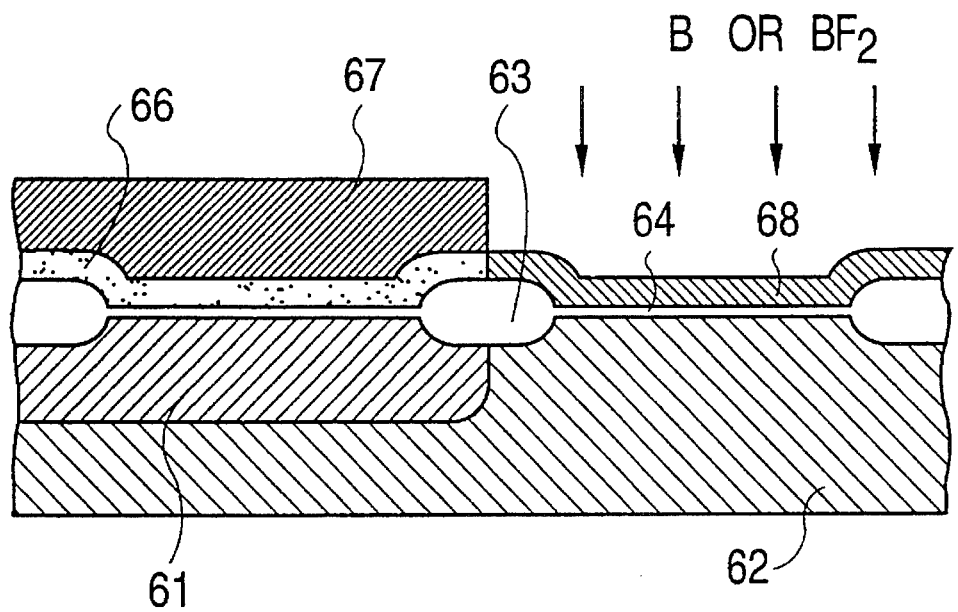

Thereafter, as shown in FIG. 20D, a resist mask 67A is deposited on the polycrystalline-silicon film 66 at the NMOS region, then boron (or, $BF_2$) at a dose of $1 \times 10^{15}$ cm$^2$ is implanted in the polycrystalline-silicon film 66 in the PMOS region, so that the polycrystalline-silicon film 66 is changed to a P$^+$ type polycrystalline-silicon film 68.

Figure 20E:
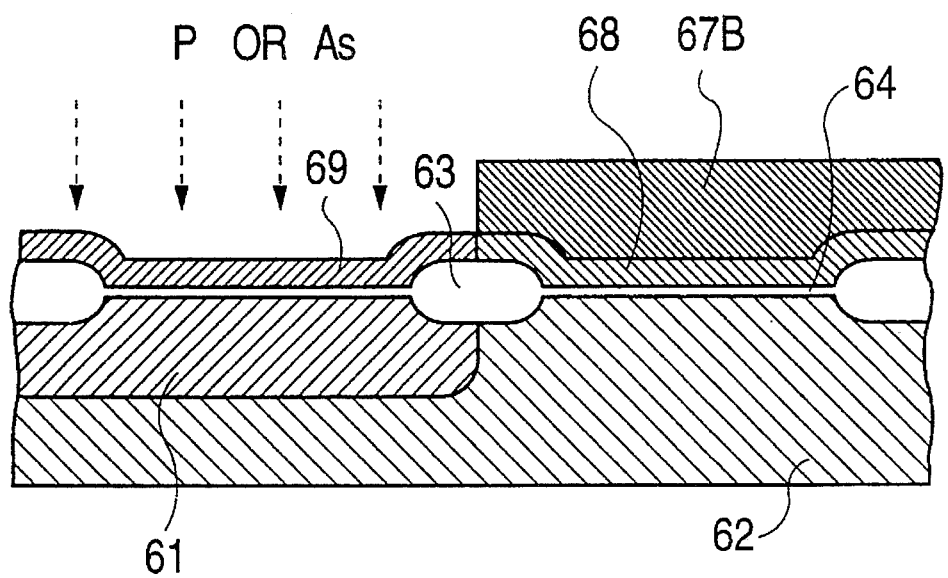

Thereafter, as shown in FIG. 20E, a resist mask 67B is deposited on the polycrystalline-silicon film 38 in the p-MOS region, then phosphorus (or, arsenic) at a dose of $2 \times 10^{15}$ cm$^{-2}$ is implanted in the remaining polycrystalline-silicon film 66 into the n-MOS region, so that the remaining polycrystalline-silicon film 66 is changed to an N$^+$ type polycrystalline-silicon film 69.

Figure 20F:
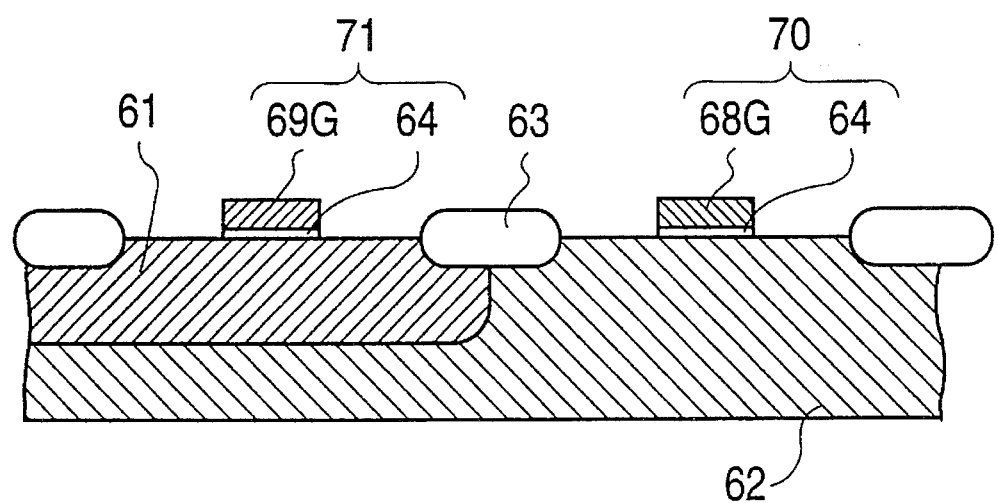

Thereafter, as shown in FIG. 20F, a resist pattern is drawn on the P$^+$ and N$^+$ type polycrystalline-silicon films 68, 69. Then the films 68, 69 and the gate insulating film 64 are etched by an anisotropic etching method. As a result, a P$^+$ type gate electrode 68G is formed by the remaining P$^+$ type polycrystalline-silicon film 68, and an N$^+$ type gate electrode 69G is formed by the remaining N$^+$ type polycrystalline-silicon film 69. A region formed by the P$^+$ type gate electrode 68G and the remaining gate insulating film 64 is called a P$^+$ type gate region 70, and a region formed by the N$^+$ type gate electrode 69G and the remaining gate insulating film 64 is called a N$^+$ type gate region 71. The length of the gate regions 70, 71 is 10 μm and the width of the gate regions 70, 71 is 10 μm.

Figure 20G:
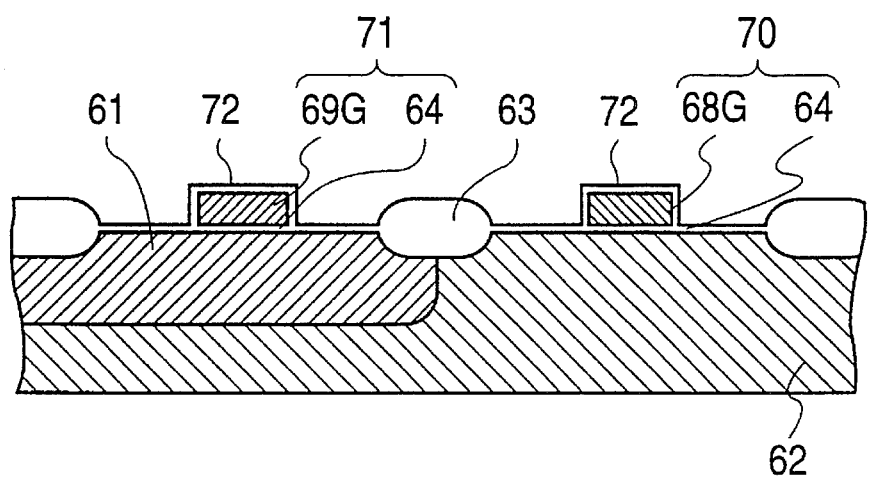

Thereafter, as shown in FIG. 20G, a silicon oxide film 72 is produced to a thickness of about 100 Å at the surface of the p-type well region 61, the n-type monocrystal silicon substrate 62, and the gate regions 70, 71 at a temperature of 850° C. in an atmosphere of oxygen.

Figure 20H:
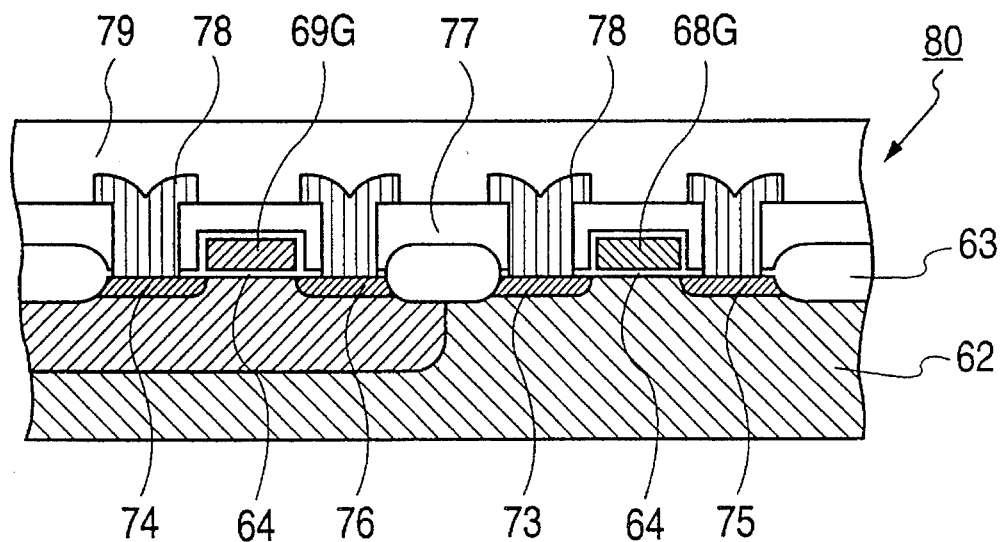

Thereafter, as shown in FIG. 20H, a p-type source region 73 is produced in the upper region of the n-type monocrystal silicon substrate 62 at the p-MOS region by implanting p-type impurities such as boron or $BF_2$ in self-alignment with one side of the P$^+$ type gate region 70. In the same manner, an n-type source region 74 is produced in the upper region of the p-type well region 61 at the n-MOS region in self-alignment with one side of the N$^+$ type gate region 71.

Moreover, a p-type drain region 75 is produced in the upper region of the n-type monocrystal silicon substrate 62 at the p-MOS region by implanting p-type impurities such as phosphorus or the arsenic in self-alignment with one side of the P$^+$ type gate region 70. In the same manner, an n-type drain region 76 is produced in the upper region of the p-type well region 61 at the n-MOS region in self-alignment with another side of the N$^+$ type gate region 71.

Thereafter, a silicon oxide film 77 is deposited over The entire n-MOS and p-MOS region by the CVD method. Thereafter, parts of the silicon oxide film 77 are opened to form contact holes through which the source regions 73, 74 and the drain regions 75, 76 are respectively exposed. Thereafter, aluminium is deposited in the contract holes by the sputtering method, then a prescribed wiring pattern is drawn on the deposited aluminium. Thereafter, pieces of the deposited aluminium are etched so that a plurality of Al wiring fields 78 are formed. Finally, a passivation film 79 such as a phosphosilicate glass film is deposited over the entire n-MOS and p-MOS region by the CVD method to fabricate a semiconductor device of a CMOS transistor 80. Therefore, the CMOS transistor 80 consisting of many semiconductor devices is provided.

In the above CMOS transistor 80, to determine the most optimum nitrogen concentration in the gate insulating film 64, many samples of the gate regions 70, 71 were prepared by changing the nitridation conditions in the ramp heating process at temperatures ranging from 800° C. to 1000° C. and at a heating time ranging from 5 seconds to 60 seconds. These samples were not provided with the silicon oxide film 72 at the surfaces of the gate regions 70, 71, so that the configuration of the samples is shown in FIG. 20F.

Thereafter, a secondary ion microscopy (SIMS) measurement and an Augier electro microscopy (AES) measurement were performed to measure concentration profiles of silicon, oxygen, and nitrogen in the gate insulating film 64 in the depth direction for each sample.

The SIMS measurement was initially performed to measure detailed profiles of the nitrogen concentration because the SIMS measurement is superior to the AES measurement at low concentrations.

In detail, as shown in FIG. 21, primary ions $O_2^+$ are emitted in the gate regions 70, 71 at an acceleration energy of 2 kV and a sputter rate of 0.018 nm/sec to obtain secondary nitrogen ions.

Figure 22:
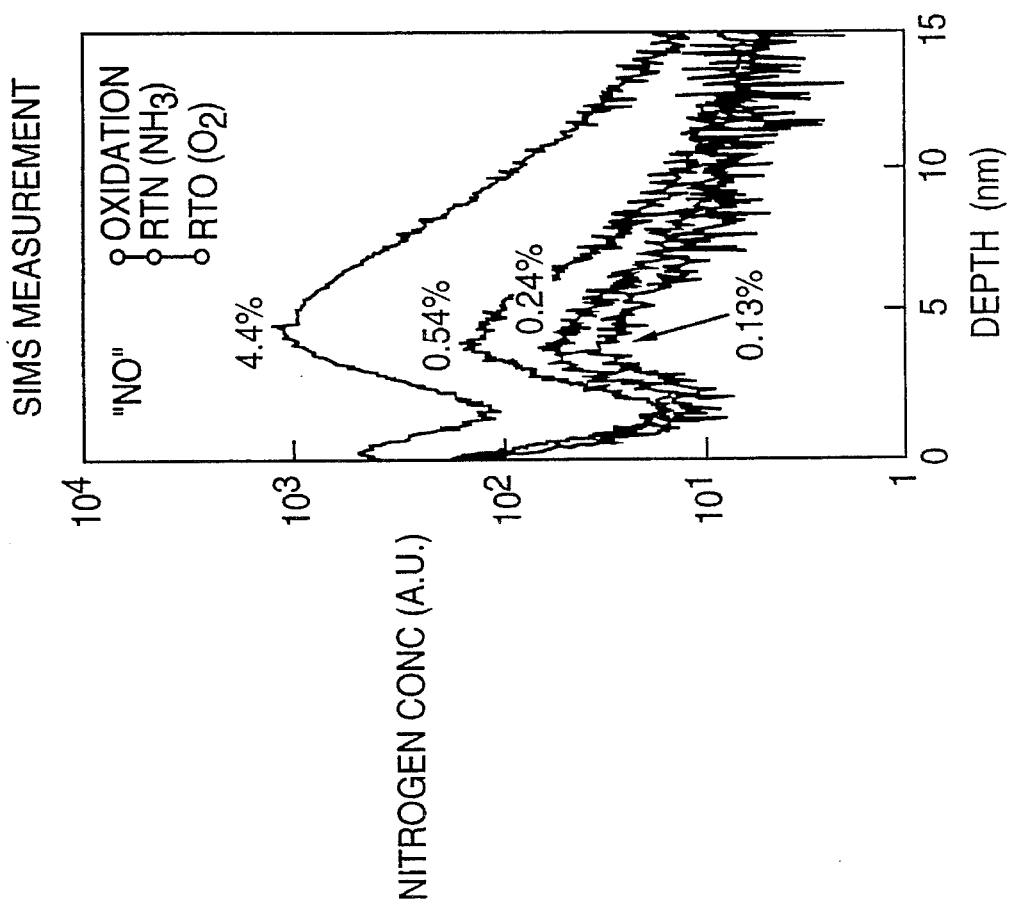
FIG. 22 is a graphic view of SIMS measurement results showing the concentration profiles of nitrogen, and showing the nitrogen concentration in arbitrary units.

FIG. 22 is a graphic view of SIMS measurement results showing the concentration profile of nitrogen, with the nitrogen concentration in arbitrary units.

As shown in FIG. 22, a concentration profile with the highest nitrogen concentration has a peak point at a depth of 5 nm in the gate regions 70, 71. However, an absolute nitrogen concentration value was not determined.

Thereafter, the AES measurement was performed for a specific sample with the highest nitrogen concentration determined by the SIMS measurement to obtain the concentration profiles because the AES measurement is superior to the SIMS measurement to determine the concentration profiles quantitatively.

Figure 23:
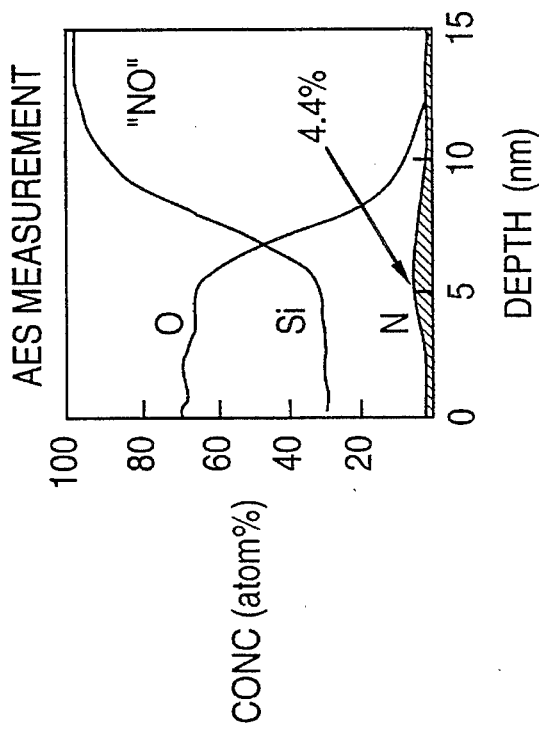
FIG. 23 is a graphic view of AES measurement results showing the concentration profiles of silicon, oxygen, and nitrogen.

FIG. 23 is a graphic view of AES measurement result showing the concentration profiles of silicon, oxygen, and nitrogen.

As shown in FIG. 23, the nitrogen concentration value was 4.4 atom % at a depth of 5 nm at which the highest nitrogen concentration profile is shown in FIG. 22 as the peak point.

Therefore, the peak nitrogen concentration value of the highest concentration profile shown in FIG. 22 was calibrated to 4.4 atom % by AES measurement.

Thereafter, the peak nitrogen concentration values of the other concentration profiles shown in FIG. 22 were calibrated to 0.54 atom %, 0.24 atom %, and 0.13 atom % in comparison with the peak point of the 4.4 atom % sample.

Other samples were calibrated to 1.7 atom % and 3.0 atom % in the same manner.

FIG. 24 shows the ramp heating process conditions, the oxide equivalent thicknesses Tox, and the nitrogen concentrations of the samples.

In FIG. 24, each sample was subjected to the rapid thermal nitridation (RTN) by the ramp heating process and a rapid thermal re-oxidation (RTO) under the same temperature and time conditions as in the RTN.

As shown in FIG. 24, the 0.13 atom % sample was nitrided at an temperature of 800° C. for 10 seconds and re-oxidized under the same conditions, so that the oxide equivalent thickness Tox was 5.2 nm and the nitrogen concentration was 0.13 atom %. In the same manner, the 0.24 atom % sample was produced under the conditions of 850° C. and 10 seconds, so that the Tox was 5.2 nm and the nitrogen concentration was 0.24 atom %. The 0.54 atom % sample was produced under the conditions of 900° C. and 5 seconds, so that the Tox was 5.2 nm and the nitrogen concentration was 0.54 atom %. The 1.7 atom % sample was produced under the conditions of 900° C. and 20 seconds, so that the Tox was 5.1 nm and the nitrogen concentration was 1.7 atom %. The 3.0 atom % sample was produced under the conditions of 900° C. and 60 seconds, so that the Tox was 5.1 nm and the nitrogen concentration was 3.0 atom %. The 4.4 atom % sample was produced under the conditions of 1000° C. and 60 seconds, so that the Tox was 5.1 nm and the nitrogen concentration was 4.4 atom %.

The six samples are generally called "NO" samples. Moreover, the samples formed by the gate region 70 are called n-MOSFETs, and the samples formed by the gate region 71 are called p-MOSFETs. In addition, a sample "PO" is utilized for reference. The nitrogen concentration of the sample "PO" is 0 atom %.

Accordingly, the gate insulating films 64 with a low nitrogen concentration of 0.1 atom % to 1.0 atom % can be easily produced by changing the RTN and RTO conditions.

The method for producing the gate insulating films 64 is changeable. That is, it is preferable that the gate insulating film be annealed by ammonia, $N_2O$, $N_2$, or $NF_3$ in a furnace atmosphere in place of the RTN.

Moreover, it is preferable that the gate insulating film be oxidized and nitrided in an atmosphere of $N_2O$ in place for the RTN and RTO.

Further, it is preferable that the gate insulating film be nitrided by ammonia, $N_2O$, $N_2$, or $NF_3$ in a furnace atmosphere in place of the RTN before the gate insulating film is re-oxidized by oxygen in a furnace atmosphere.

In the above methods, the conditions for re-oxidizing the gate insulating film are determined so as not to increase the oxide equivalent thickness Tox rapidly.

Next, the characteristics of the samples are described.

In cases where the samples have not yet been subjected to hot carrier stress, the characteristics are designated at the initial condition.

Figure 25:
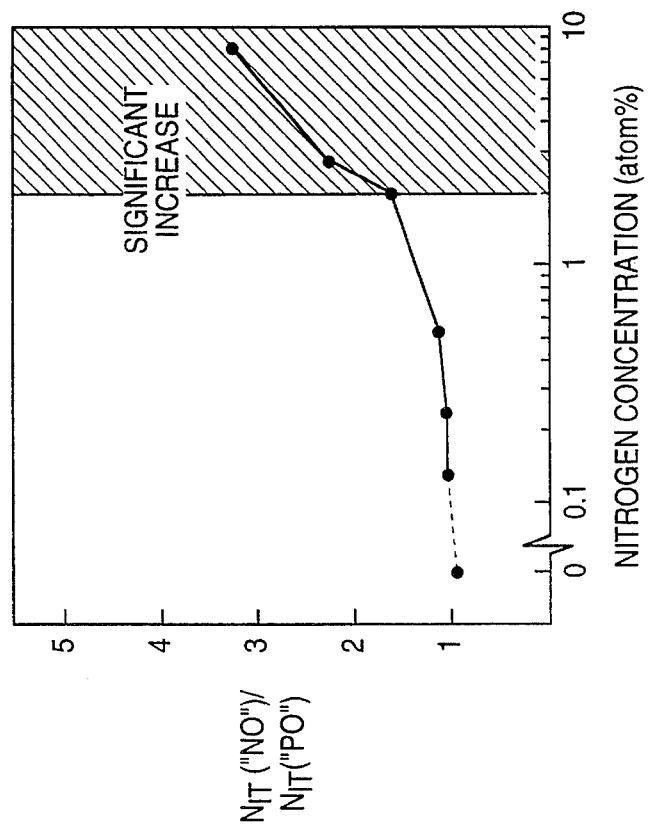
FIG. 25 shows the dependence of the initial threshold voltage on nitrogen concentration in the case of NMOSFETs and PMOSFETs.

FIG. 25 shows the dependence of the initial threshold voltage on the nitrogen concentration in the case of the n-MOSFETs and p-MOSFETs.

As shown in FIG. 25, when the nitridation concentration is high, the initial-threshold voltage is shifted to increase the positive fixed charges in the channeling region. In particular, when the nitridation concentration is more than 3 atom %, the initial threshold voltage is shifted rapidly.

Accordingly, the optimum nitrogen concentration in the gate insulating film 64 is equal to or less than 2 atom %.

Figure 26:
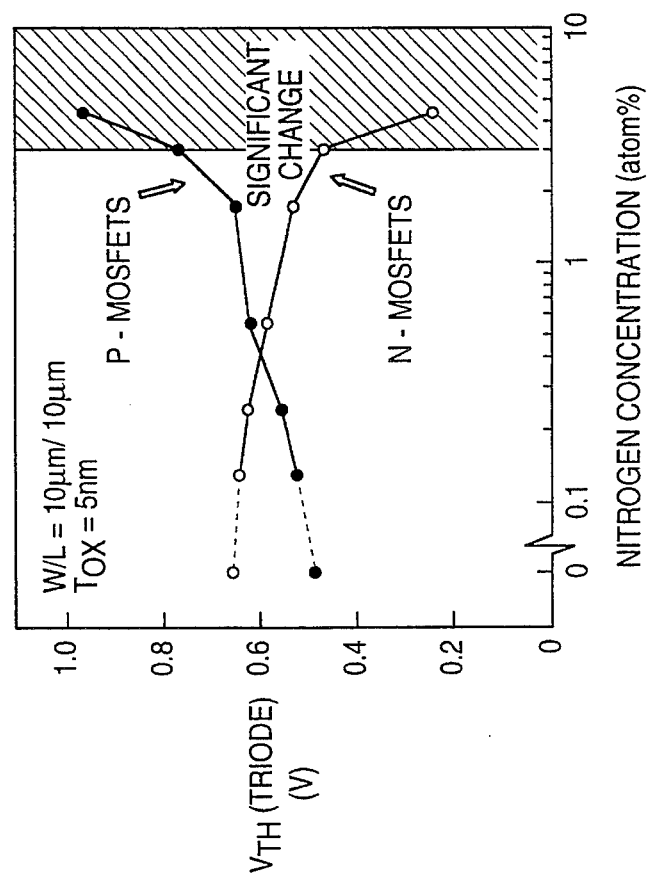
FIG. 26 shows the dependence of the initial interface state density on nitrogen concentration in the case of NMOSFETs and PMOSFETs.

FIG. 26 shows the dependence of the initial interface state density on the nitrogen concentration in the case of the n-MOSFETs and the p-MOSFETs. The initial interface state density is determined by measuring the charge-pumping current and the increase rate of the initial interface state density is shown in comparison with the sample "PO".

As shown in FIG. 26, when the nitridation concentration is more than 2 atom %, the initial interface state density is increased rapidly.

Accordingly, the optimum nitrogen concentration in the gate insulating film 64 is equal to or less than 1 atom %.

Accordingly, the optimum nitrogen concentration in the gate insulating film 64 is equal to or less than 1 atom %.

Figure 27B:
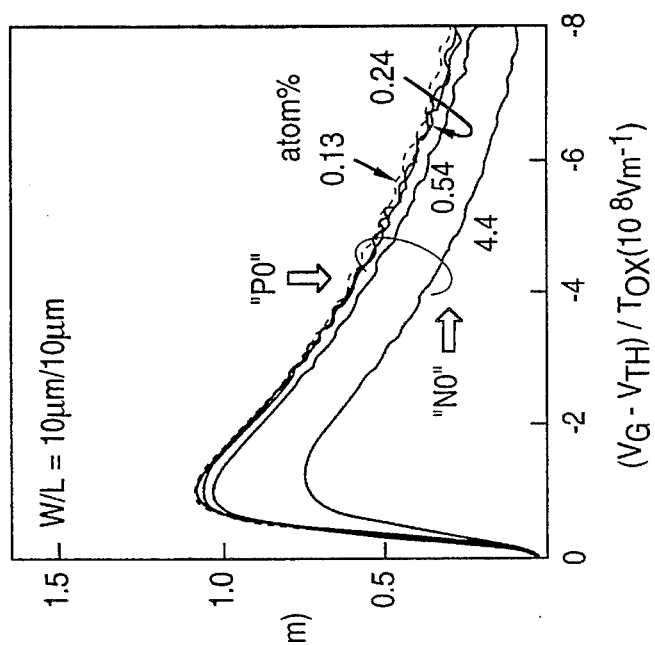
FIGS. 27A and 27B shows the dependence of the initial transconductance Gm on the gate bias with nitrogen S concentration as a parameter.
Figure 27A:
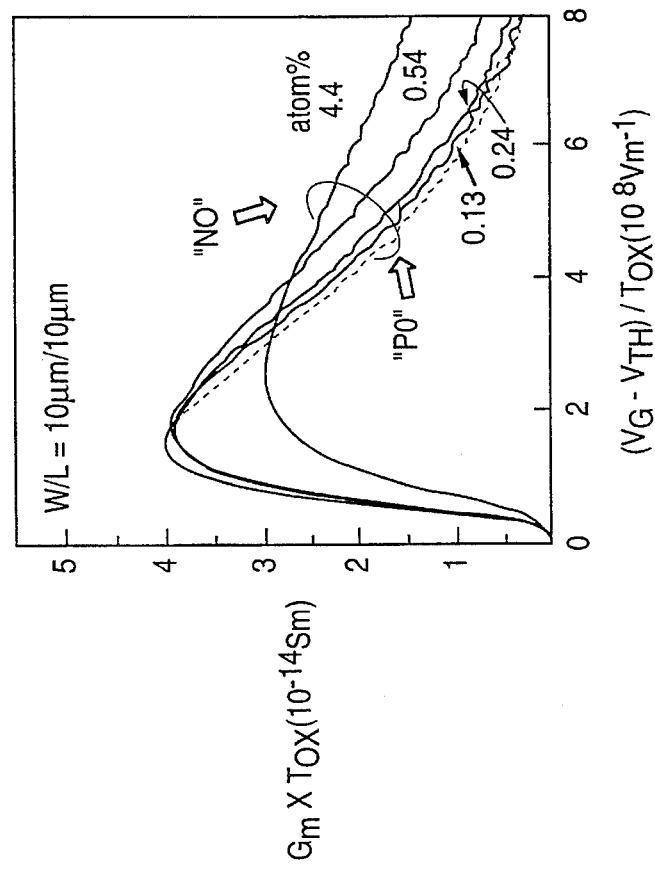

FIGS. 27A and 27B shows the dependence of the initial transconductance Gm on the gate bias with nitrogen concentration as a parameter. The dependence in the case of the n-MOSFETs is shown in FIG. 27A and the dependence in the case of p-MOSFETs is shown in FIG. 27B. The Gm characteristic is designated by multiplying the initial transconductance Gm by the oxide equivalent thickness Tox, and the gate bias is designated by the ratio of the effective gate voltage $V_G - V_{TH}$ to the oxide equivalent thickness Tox.

As shown in FIGS. 27A and 27B, the Gm peak value in the 4.4 atom % sample greatly decreases in comparison with those of the other samples. The reason is that Coulomb scattering is greatly generated. On the other hand, the 0.13 atom %, 0.24 atom %, and 0.54 atom % samples have almost the same Gm peak values as that of the "PO" sample. In addition, when the effective gate voltage $V_G - V_{TH}$ is high, the Gm values of these samples are 20–50% higher than that of the "PO" sample in the case of n-MOSFETs. The Gm characteristics of the 0.54 atom % sample in the n-MOSFETs are particularly excellent.

Figure 28B:
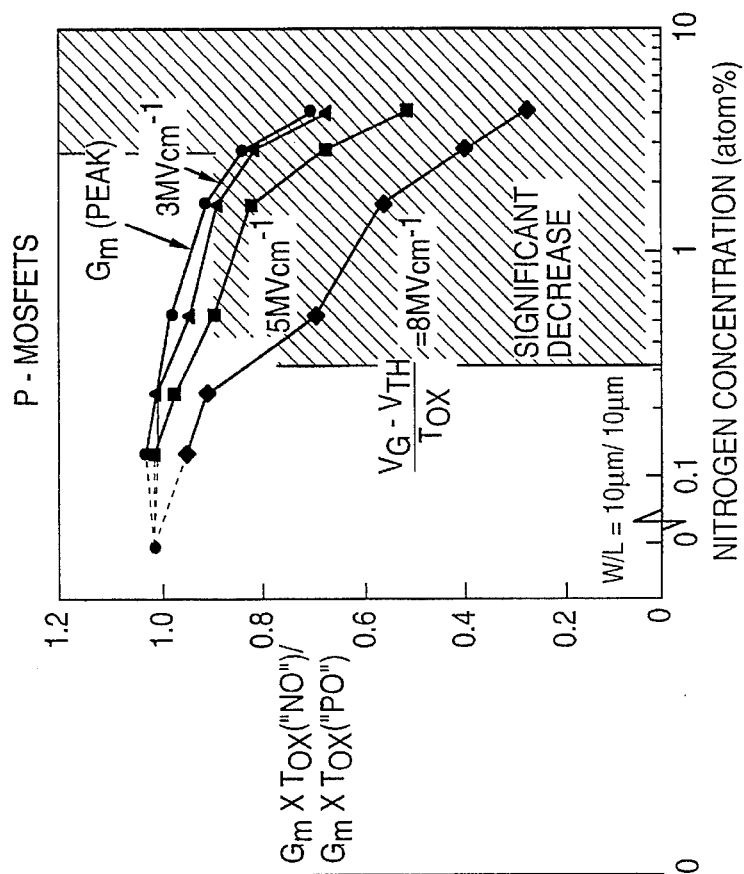
FIGS. 28A and 28B shows the dependence of the initial transconductance Gm on the nitrogen concentration with the gate bias as a parameter.
Figure 28A:
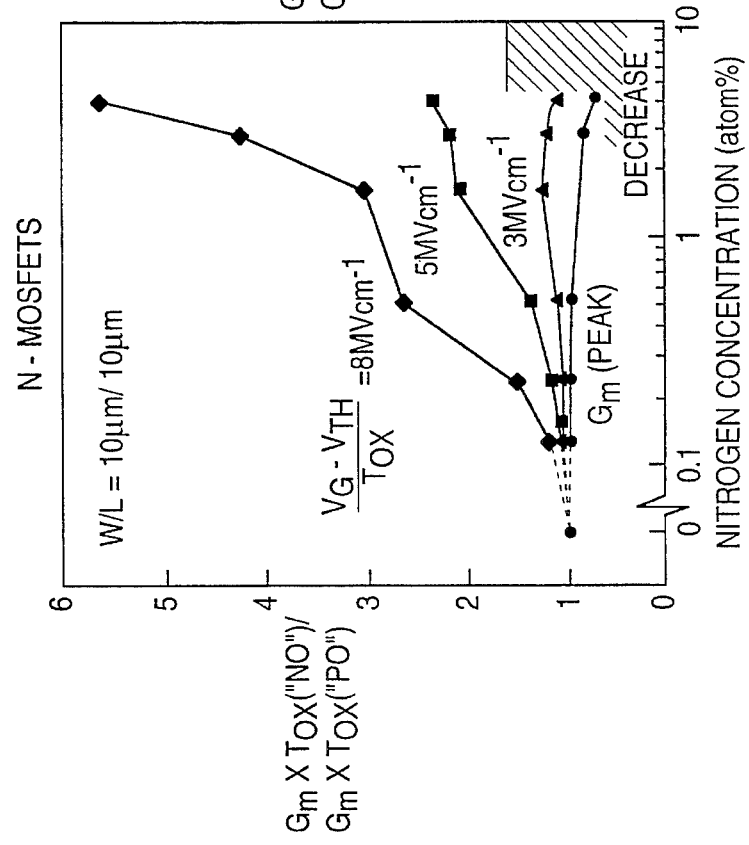

FIGS. 28A and 28B shows the dependence of the initial transconductance Gm on the nitrogen concentration with the gate bias as a parameter. The dependence in the case of the n-MOSFETs is shown in FIG. 28A and the dependence in the case of the p-MOSFETs is shown in FIG. 27B. The Gm characteristics of the samples "NO" are designated in comparison with the sample "PO".

As shown in FIG. 28A, the Gm characteristics rapidly deteriorate at a low gate bias in the n-MOSFETs when the nitrogen concentration is equal to or more than 3%. However, the Gm characteristics are excellent when the nitrogen concentration is less than 3%. Moreover, the Gm characteristics rapidly deteriorate at a high gate bias in the n-MOSFETs when the nitrogen concentration is less than 0.2%. However, the Gm characteristics are excellent when the nitrogen concentration is equal to or more than 0.2%.

As shown in FIG. 28B, the Gm characteristics rapidly deteriorate at high gate bias in the p-MOSFETs. The reason is that tensile stress is generated between the gate region 70 and the silicon substrate 62. However, when the gate bias is equal to or more than 5 $MeVcm^{-1}$, the Gm characteristics are excellent at less than 2 atom % in the p-MOSFETs.

Figure 29A:
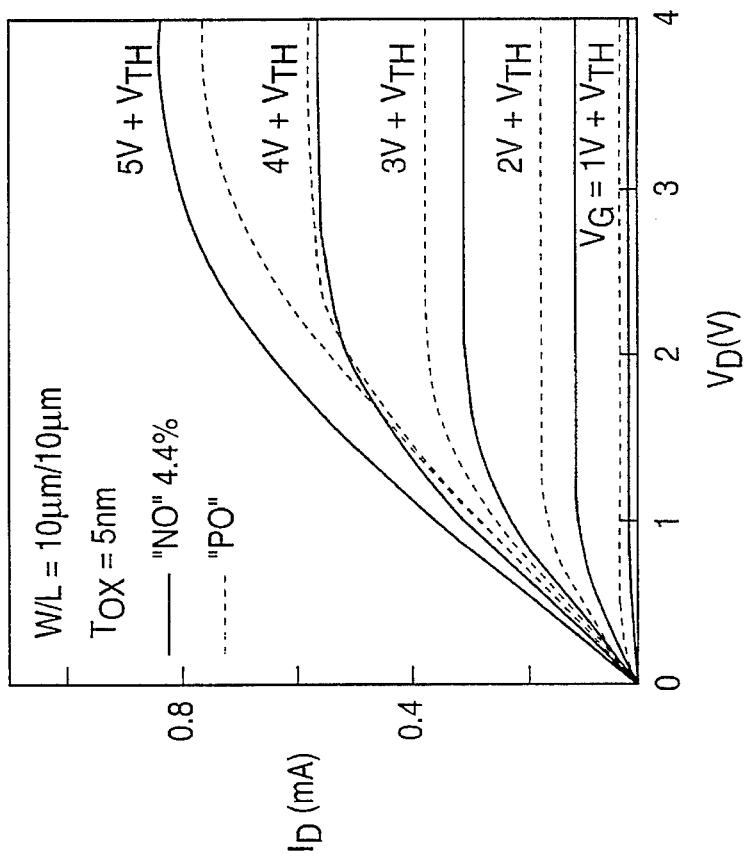
FIGS. 29A, 29B, 29C, and 29D show the dependence of the initial drain current $I_D$ on the drain voltage $V_D$ with the threshold voltage $V_{TH}$ as a parameter.
Figure 29B:
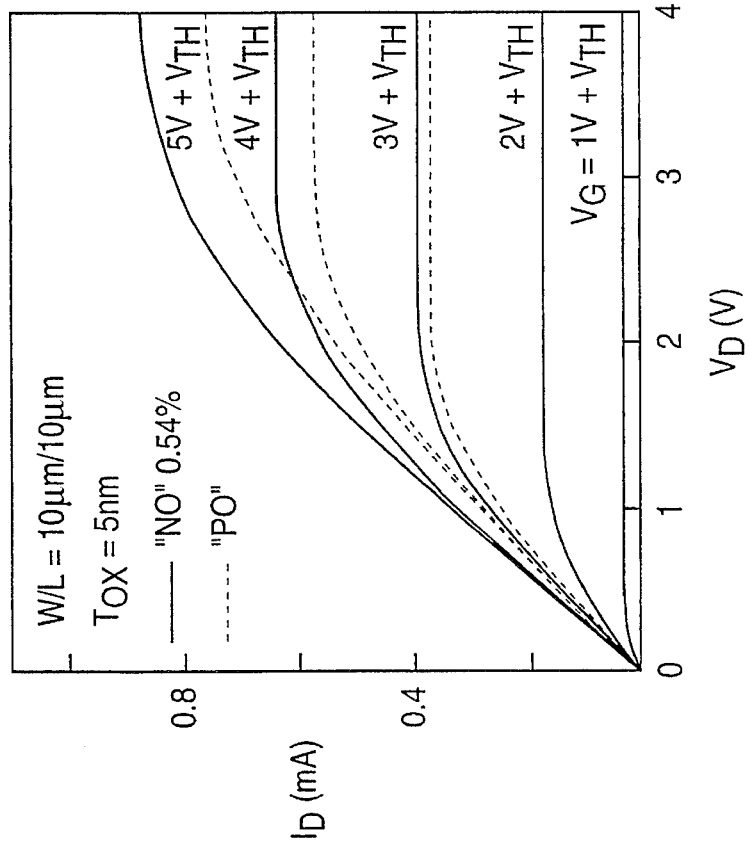
Figure 29C:
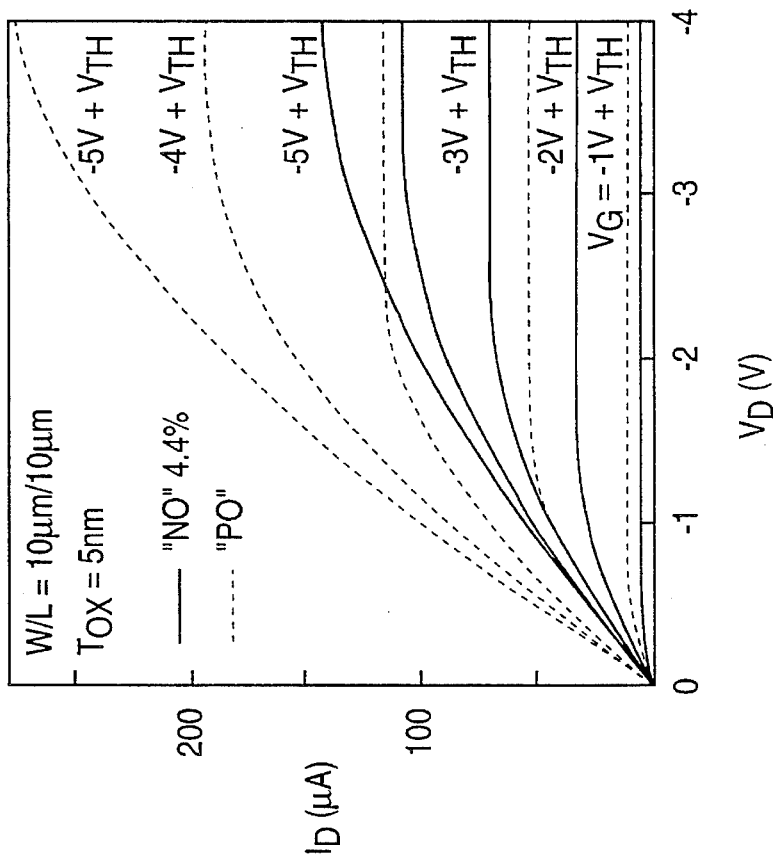
Figure 29D:
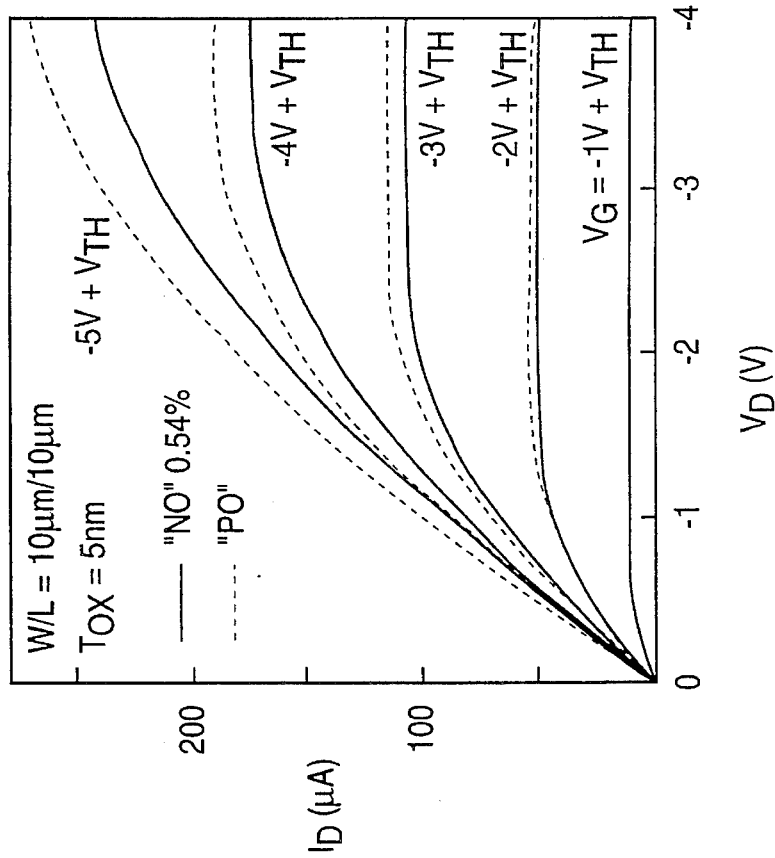

FIGS. 29A, 29B, 29C, and 29D show the dependence of the initial drain current $I_D$ on drain voltage $V_D$ with the threshold voltage $V_{TH}$ as a parameter. The $I_D$ characteristics (drivability) of the sample 0.54 atom % in the case of the n-MOSFETs are shown in FIG. 29A, and the $I_D$ characteristics of the sample 4.4 atom % in the case of the n-MOSFETs are shown in FIG. 29B. Moreover, the $I_D$ characteristics of the sample 0.54 atom % in the case of the p-MOSFETs are shown in FIG. 29C, and the $I_D$ characteristics of the sample 4.4 atom % in the case of the p-MOSFETs are shown in FIG. 29D.

As shown in FIG. 29A, the drivability of the 0.54 atom % sample is not lower than that of the "PO" sample over the whole gate voltage range in the n-MOSFETs. This is in great contrast to the 4.4 atom % sample as shown in FIG. 29B. That is, the drivability of the 4.4 atom % sample is lower than that of the "PO" sample at low gate voltage.

As shown in FIG. 29C, the drivability of the 0.54 atom % sample is not significantly lower than that of the "PO" sample at the whole gate voltage range in the p-MOSFETs. On the other hand, as shown in FIG. 29D, the drivability of the 4.4 atom % sample is significantly lower than that of the "PO" sample over the whole gate voltage range in the p-MOSFETs.

FIGS. 30A, 30B, 30C, and 30D show the dependence of the initial drain current $I_D$ on the nitrogen concentration with the gate voltage $V_G$ as a parameter. The initial drain current $I_D$ is normalized to that of the "PO" sample.

In FIG. 30A, the $I_D$ characteristics at the drain voltage value 0.05 V are shown in the case of the n-MOSFETs.

In FIG. 30B, the $I_D$ characteristics at the drain voltage value of 3.0 V are shown in the case of the n-MOSFETs.

In FIG. 30C, the $I_D$ characteristics at the drain voltage value of −0.05 V are shown in the case of the p-MOSFETs.

In FIG. 30D, the $I_D$ characteristics at the drain voltage value of −3.0 V are shown in the case of the p-MOSFETs.

As shown in FIGS. 30A, 30B, the drivability significantly deteriorates at more than 3 atom % nitrogen concentration when a high gate voltage value is applied to the n-MOSFETs, and the drivability significantly deteriorates at more than 1 atom % nitrogen concentration when a low gate voltage is applied to the n-MOSFETs. Moreover, the drivability significantly deteriorates at more than 2 atom % nitrogen concentration in the p-MOSFETs. However, the drivability is excellent at not more than 3 atom % nitrogen concentration when a high gate voltage is applied to the n-MOSFETs, and the drivability is excellent at not more than 1 atom % nitrogen concentration when a low gate voltage is applied to the n-MOSFETs. Moreover, the drivability is excellent at not more than 2 atom % nitrogen concentration in the p-MOSFETs.

FIGS. 31A, 31B, 31C, and 31D show the dependence of the hot carrier degradation on nitrogen concentration. The hot carrier degradation generally results from both channel-hot-carrier (CHC) stress and drain-avalanche-hot-carrier (DAHC) stress. The CHC stress is applied to the n-MOSFETs (p-MOSFETs) for 1,000 seconds under the conditions where the drain voltage $V_D$ and the gate voltage $V_G$ are respectively equal to 3.5 V (−3.5 V). The DAHC stress is applied to the n-MOSFETs (p-MOSFETs) for 1,000 seconds under the conditions where the drain voltage $V_D$ is equal to 4 V (−4 V) and the gate voltage $V_G$ is set so as to maximize the substrate current $I_{SUB}$.

Figure 31D:
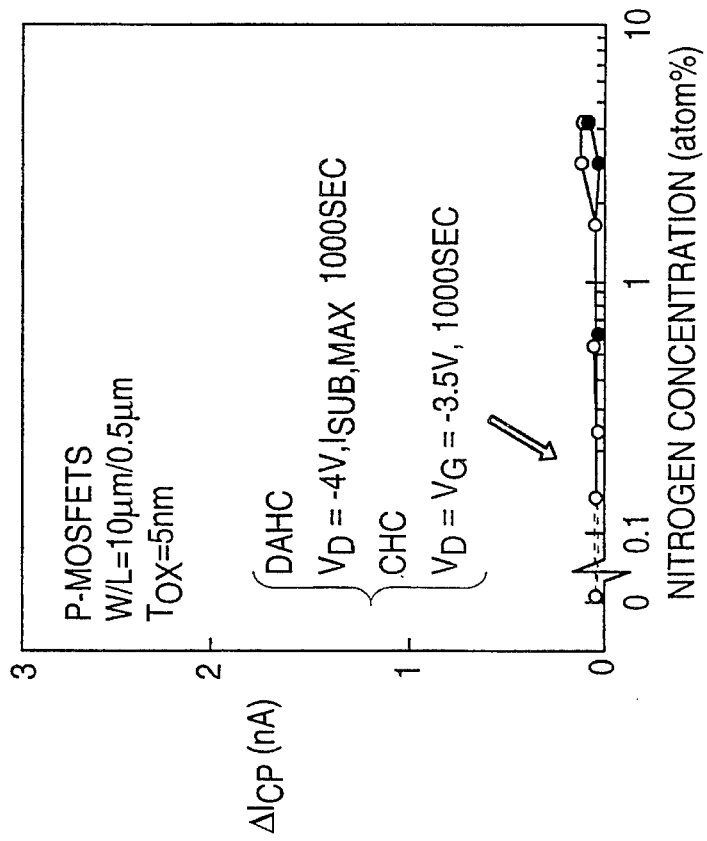
Figure 31C:
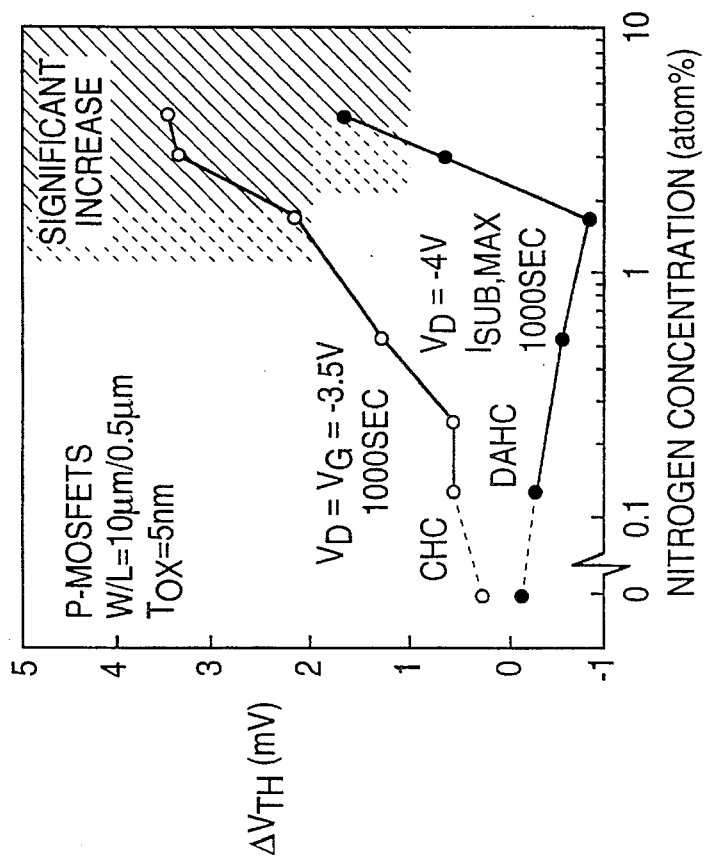

In FIGS. 31A and 31C, the threshold voltage shift $\Delta V_{TH}$ is measured for designating the hot carrier degradation. In FIGS. 31B and 31D, the charge-pumping current shift $\Delta Icp$ is measured for designating the hot carrier degradation.

The hot carrier degradation in the n-MOSFETS is shown in FIGS. 31A and 31B. The hot carrier degradation in the p-MOSFETS is shown in FIGS. 31C and 31D.

As shown in FIGS. 31A and 31B, the threshold voltage shift $\Delta V_{TH}$ is greatly increased by the CHC stress in the n-MOSFETs when the nitrogen concentration is more than 1 atom %, and both the threshold voltage shift $\Delta V_{TH}$ and the charge-pumping current shift $\Delta Icp$ are greatly increased by the DAHC stress in the n-MOSFETs when the nitrogen concentration is less than 0.2 atom %.

However, the threshold voltage shift $\Delta V_{TH}$ is suppressed in lightly nitrided n-MOSFET samples under CHC stress, and the charge-pumping current shift $\Delta Icp$ is suppressed in the all n-MOSFET samples under CHC stress. Moreover, the threshold voltage shift $\Delta V_{TH}$ and the charge-pumping current shift $\Delta Icp$ are respectively suppressed in heavily nitrided n-MOSFET samples under DAHC stress. Especially, a nitrogen concentration value of around 0.5 atom % is optimum at which the shifts $\Delta V_{TH}$ and $\Delta Icp$ are not large.

As shown in FIGS. 31C and 31D, the threshold voltage shift $\Delta V_{TH}$ is greatly increased by CHC stress in the p-MOSFETs when the nitrogen concentration is more than 2 atom %, and the threshold voltage shift $\Delta V_{TH}$ is greatly increased by DAHC stress in the p-MOSFETs when the nitrogen concentration is more than 3 atom %.

However, the threshold voltage shift $\Delta V_{TH}$ is suppressed in lightly nitrided p-MOSFET samples under CHC stress and DAHC stress, and the charge-pumping current shift $\Delta Icp$ is suppressed in the all p-MOSFET samples under CHC stress and DAHC stress.

Accordingly, the characteristics for withstanding hot carrier stress are excellent in the n-MOSFET samples in which the nitrogen concentration is between 0.2 atom % and 1 atom %. Moreover, the characteristics for withstanding hot carrier stress are excellent in the p-MOSFET samples in which the nitrogen concentration is equal to or less than 1 atom %. Especially, a nitrogen concentration around 0.5 atom % is optimum for n- and p-MOSFET hot carrier reliability because more electron traps are generated in heavily nitrided samples and more interface states are generated in ultra-lightly nitrided samples.

To investigate the hot carrier degradation in detail, transconductance degradation in the 0.54 atom % n-MOSFET sample subjected to DAHC stress as shown in FIGS. 31A and 31B is measured as follows.

Figure 32A:
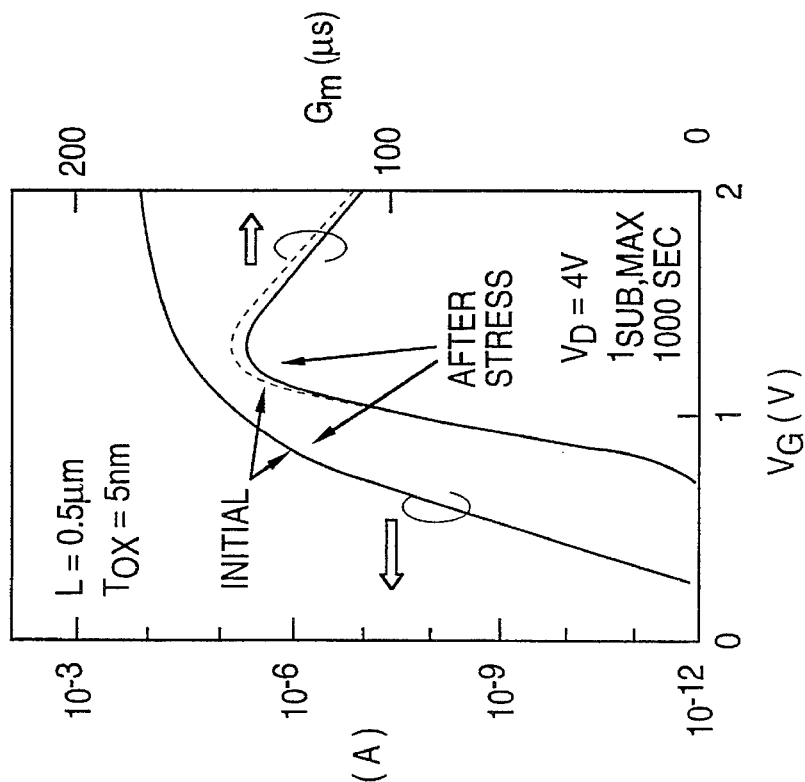
FIGS. 32A and 32B show dependence of the drain current $I_D$ and the transconductance (Gm) degradation after hot carrier stress on the gate voltage $V_G$.
Figure 32B:
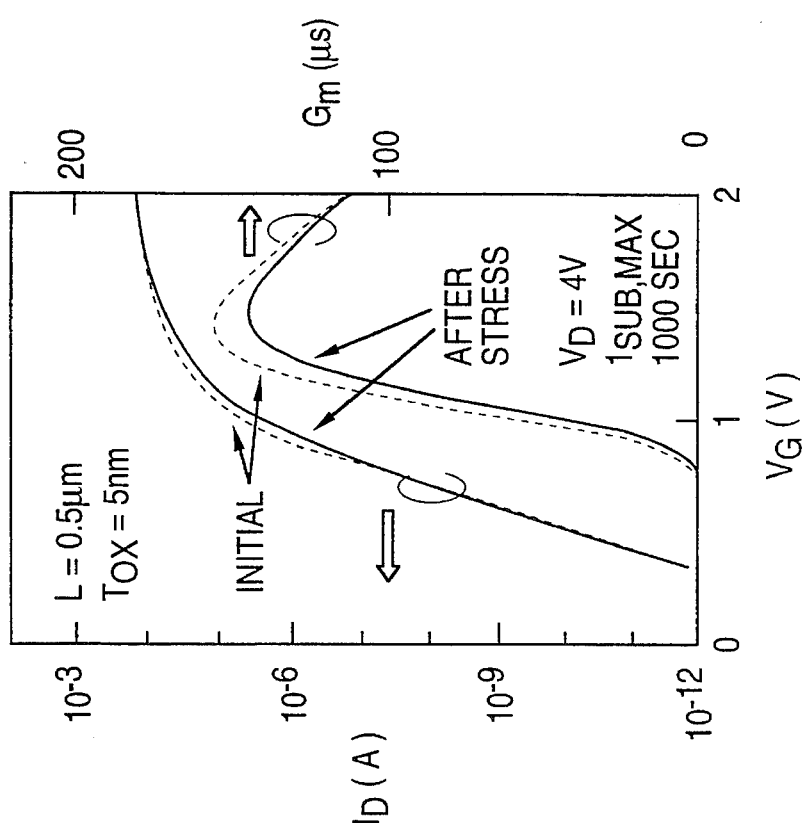

FIGS. 32A and 32B show the dependence of the drain current $I_D$ and the transconductance (Gm) degradation after hot carrier stress on the gate voltage $V_G$.

The dependence in the "PO" sample is shown in FIG. 32A for reference, and the dependence in the 0.54 atom % n-MOSFET sample is shown in FIG. 32B.

As shown in FIG. 32B, after hot carrier stress is applied, even the 0.54 atom % sample suppresses the transconductance degradation significantly under the prescribed conditions $I_{SUB,MAX}$ in which the substrate current is maximized, in comparison with the transconductance degradation in the "PO" sample.

Accordingly, the characteristics for withstanding the hot carrier stress do not deteriorate in the n-MOSFETs in which the nitrogen concentration is between 0.2 atom % and 1 atom %.

Figure 33B:
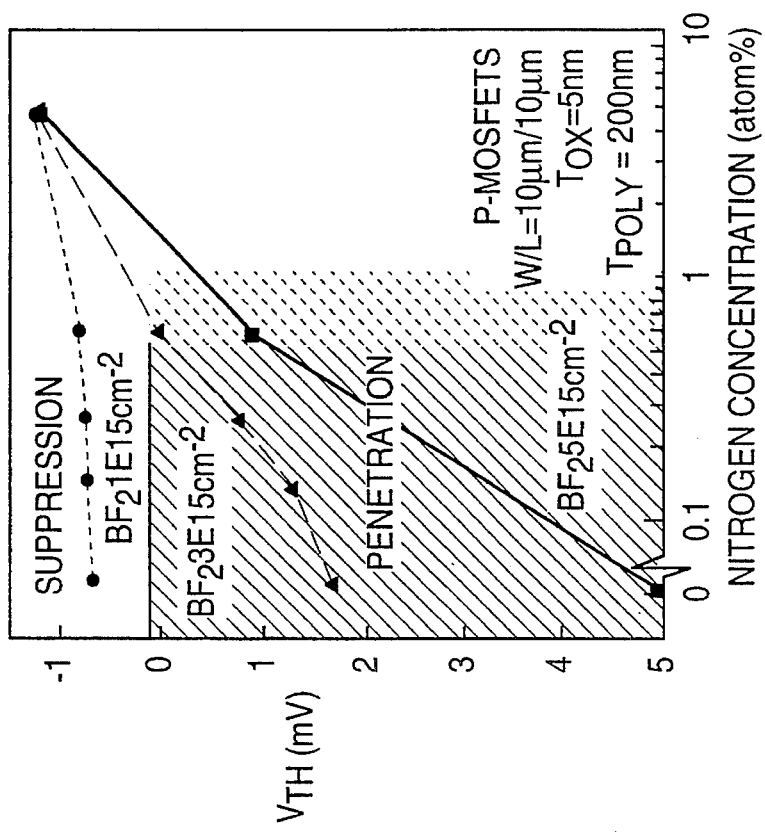
FIGS. 33A and 33B show the dependence of P-MOSFET characteristics on the nitrogen concentration, regarding boron penetration.
Figure 33A:
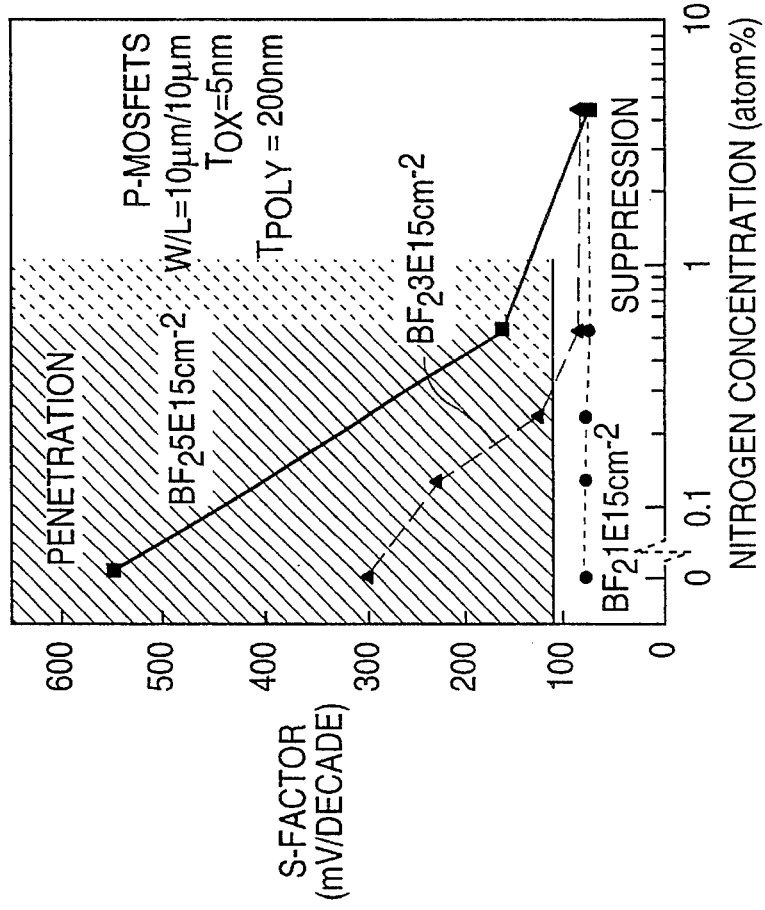

FIGS. 33A and 33B show the dependence of p-MOSFET characteristics on the nitrogen concentration for boron penetration.

The boron penetration characteristics are designated by an S-factor, which is defined as the ratio of the voltage shift $\Delta V_G$ to the logarithm of the drain current shift $\Delta \log I_D$, in FIG. 33A. Moreover, the boron penetration characteristics are designated by the threshold voltage $V_{TH}$ in FIG. 33B.

As shown in FIGS. 33A and 33B, the boron penetration has strong boron dose dependence. At a boron dose of $1 \times 10^{15}$ cm$^{-2}$, the boron penetration is suppressed for all samples (including the "PO" sample) used in this experiment where the Tox is equal to 5 nm and the thermal conditions after the formation of the gate regions 70, 71 are 850° C. furnace and 1000° C. rapid thermal annealing. A boron dose of $1\times10^{15}$ cm$^{-2}$ is sufficient for the dopant concentration of gate electrodes 68G, 69G as long as high temperature (1000° C.) rapid thermal annealing is used for dopant activation.

Accordingly, any nitrogen concentration can be chosen for suppression of the boron penetration. However, at a boron dose of $3\times10^{15}$ cm$^{-2}$, the S-factor and the threshold voltage shift $\Delta V_{TH}$ increase with reduction in the nitrogen concentration. The reduction is significant in the samples with the nitrogen concentration value of less than 0.5 atom %. That is, a nitrogen concentration value of more than 0.5 atom % makes the process margin for the boron penetration larger.

Figure 34:
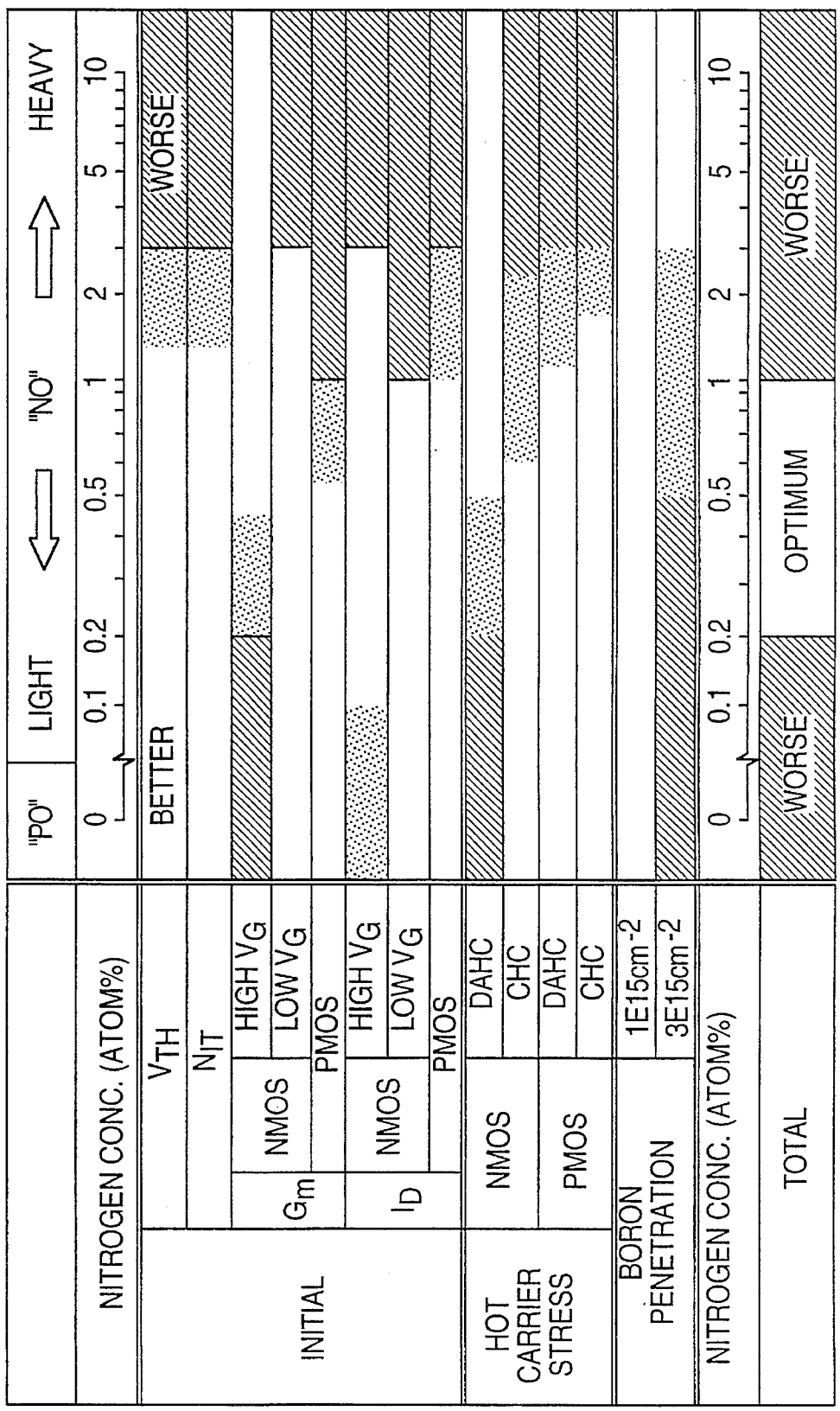
FIG. 34 shows, in tabular form, the optimization of the nitrogen concentration with respect to the initial characteristics, hot carrier reliability, and boron penetration.

FIG. 34 shows, in tabular form, the optimization of the nitrogen concentration with respect to the initial characteristics, the hot carrier reliability, and the boron penetration.

As shown in FIG. 34, the "NO" samples in which the nitrogen concentration is between 0.2 atom % and 1 atom % are judged excellent.

Accordingly, by choosing a nitrogen concentration around 0.5 atom %, fine device characteristics equivalent to those of N$_2$O oxidation are successfully obtained by low temperature rapid thermal nitridation with NH$_3$ gas. Good hot carrier reliability and suppression of the boron penetration are attained at the same time.

Moreover, such very light nitridation with NH$_3$ gas is desirable for deep-sub-micron processes because it can be accomplished at low temperatures, around 900° C., which cannot be attained by N$_2$O gas. It is very helpful in reducing defect generation and impurity re-distribution during high-temperature rapid thermal annealing.

The present invention can be utilized in an electrically programmable read only memory (EPROM) and an electrically erasable programmable read only memory (EEPROM).

Figure 35:
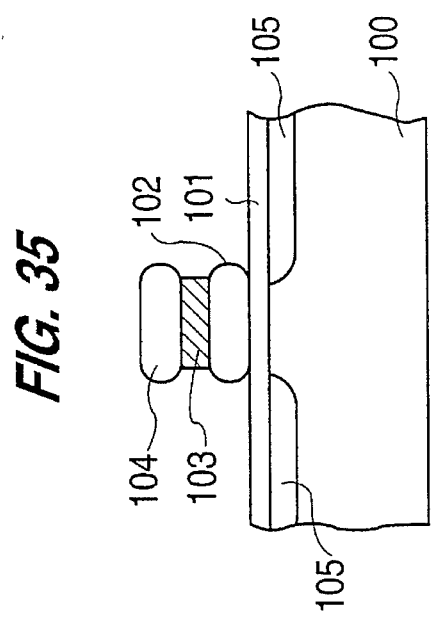
FIG. 35 is a cross sectional view of an electrically programmable read only memory according to a fourth embodiment of the present invention.

In detail, as shown in FIG. 35, the EPROM comprises a substrate 100, a gate insulating film 101 on the substrate 100, a floating gate 102 on the gate insulating film 101, a insulating film 103 on the floating gate 102, a control gate 104 on the insulating film 103, and a plurality of diffusion layers 105 in the surface of the substrate 100.

In the above configuration of the EPROM, the nitrogen concentration of the insulating film 103 is around 0.5 atom % according to the present invention.

Accordingly, the reliability is excellent in the EPROM.

Moreover, in the case where the gate insulating film 101 is around 0.5 atom %, the characteristics are excellent in the EPROM.

Figure 36:
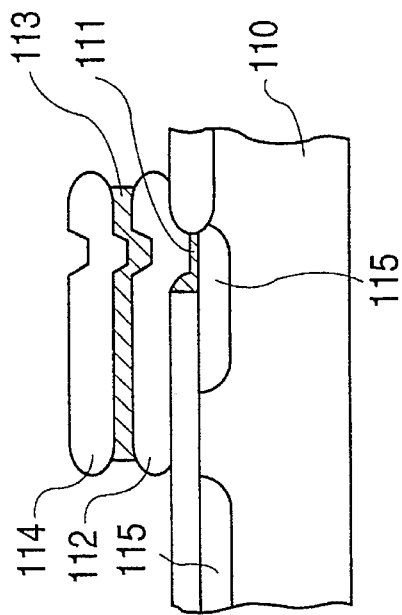
FIG. 36 is a cross sectional view of an electrically erasable programmable read only memory according to a fourth embodiment of the present invention.

As shown in FIG. 36, the EEPROM comprises a substrate 110, a gate insulating film 111 on the substrate 110, a floating gate 112 on the gate insulating film 111, a insulating film 113 on the floating gate 112, a control gate 114 on the insulating film 113, and a plurality of diffusion layers 115 in the surface of the substrate 110.

In the above configuration of the EEPROM, the nitrogen concentration of the gate insulating film 111 is around 0.5 atom % according to the present invention.

Accordingly, the reliability is excellent in the EEPROM.

Moreover, in the case where the insulating film 113 is around 0.5 atom %, the characteristics are excellent in the EEPROM.

The present invention can be utilized in a MOS capacitor such as a trench capacitor and a stacked capacitor.

Figure 37:
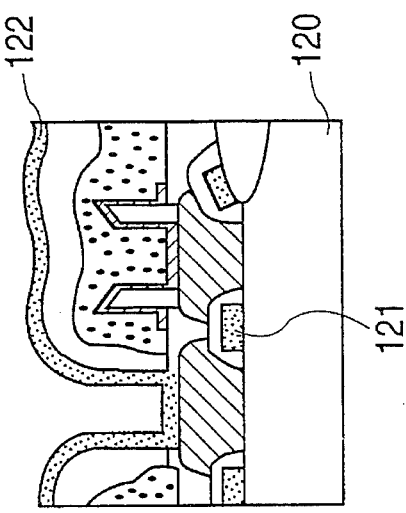
FIG. 37 is a cross sectional view of a trench capacitor according to a fourth embodiment of the present invention.

In detail, as shown in FIG. 37, the trench capacitor comprises a substrate 120, word lines 121 on the substrate 120, and bit lines 122. In the above configuration of the trench capacitor, the nitrogen concentration of an insulating film formed between the word line 121 and the substrate 120 is around 0.5 atom % according to the present invention.

Accordingly, characteristics such as breakdown voltage, large capacitance, and reliability are excellent in the trench capacitor.

Figure 38:
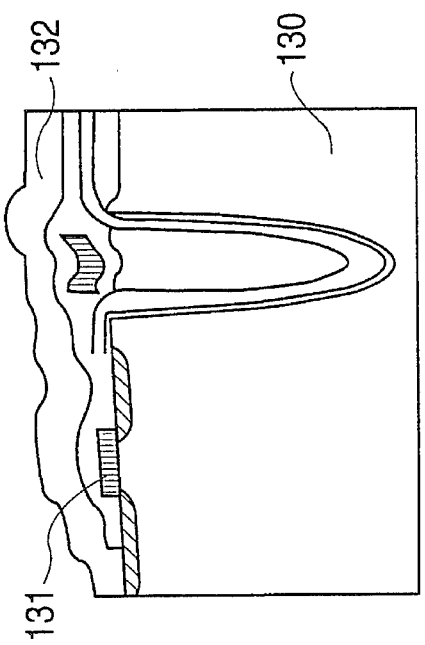
FIG. 38 is a cross sectional view of a stacked capacitor according to a fourth embodiment of the present invention.

As shown in FIG. 38, the stacked capacitor comprises a substrate 130, word lines 131 on the substrate 130, and bit lines 132. In the above configuration of the stacked capacitor, the nitrogen concentration of an insulating film formed between the word line 131 and the substrate 130 is around 0.5 atom % according to the present invention.

Accordingly, characteristics such as breakdown voltage, large capacitance, and reliability are excellent in the stacked capacitor.

Next, a method for fabricating a MISFET transistor according to a fifth embodiment of the present invention and the MISFET transistor is described.

In the fifth embodiment, the p-type well region 31, the silicon substrate 32, and the field oxidation films 33 are initially produced in the same manner as in the first embodiment shown in FIG. 10A.

Thereafter, a silicon oxide film 201 is produced over the entire n-type monocrystal silicon substrate 32 by a liquid phase deposition (LPD) method.

In detail, an aqueous solution including components represented by an equation (1) is prepared in equilibrium by dissolving silica (SiO$_2$) in a hydrosilicofluoric acid (H$_2$SiF$_6$) solution.

$$H_2SiF_6 + 2H_2O \leftarrow\rightarrow SiO_2 + 6HF \tag{1}$$

Thereafter, the temperature of the aqueous solution is adjusted to 35° C., and the surfaces of the p-type well region 31 and the field oxidation films 33 are treated with the aqueous solution. After treatment with the aqueous solution, the silicon oxide film 201 is deposited at a depositing speed of 1 nm thickness/min over the entire n-type monocrystal silicon substrate 32. As a result, the heated silicon oxide film 34 is formed to a thickness of 5 nm.

Thereafter, the n-type monocrystal silicon substrate 32 is heated at temperatures ranging from 100° C. to 300° C., so that water remaining in the n-type monocrystal silicon substrate 32 is evaporated. In addition, the heated silicon oxide film 34 is densified by the heating treatment.

Thereafter, as shown in FIG. 39, a first ramp heating process is performed for 20 seconds at a temperature of 1100° C. in a gaseous atmosphere including nitrogen atoms such as an ammonia (NH$_3$) gas. Following the first ramp heating process, a second ramp heating process is performed for 20 seconds at a temperature of 1,100° C. in a dry oxygen atmosphere. As a result, the silicon oxide film 201 is nitrided to form a nitrided silicon oxide film 202.

Thereafter, the P$^+$ polycrystalline silicon film 36 is produced in the same manner as in the first embodiment, then the silicon oxide film 201 and the P$^+$ polycrystalline silicon film 36 are etched to produce a gate insulating film 203 and a gate electrode 204.

Thereafter, a MIS transistor 205 comprising many semiconductor devices is fabricated according to conventional processes for fabricating semiconductor devices.

Figure 1A:
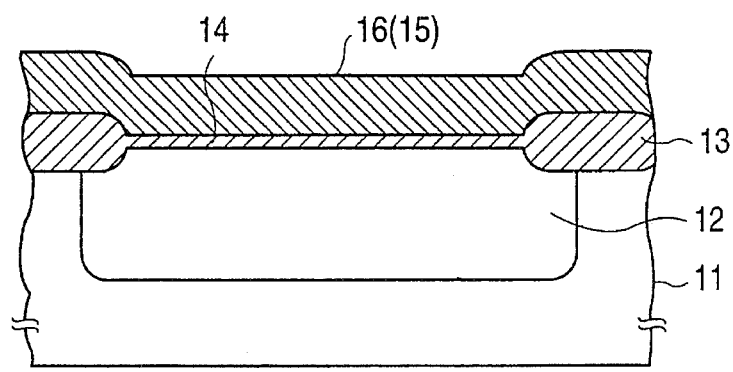
FIGS. 1A, 1B, and 1C are respectively cross sectional views of a conventional P channel MIS transistor, showing fabricating processes for adding nitrogen atoms to gate insulating films in the transistor.
Figure 1B:
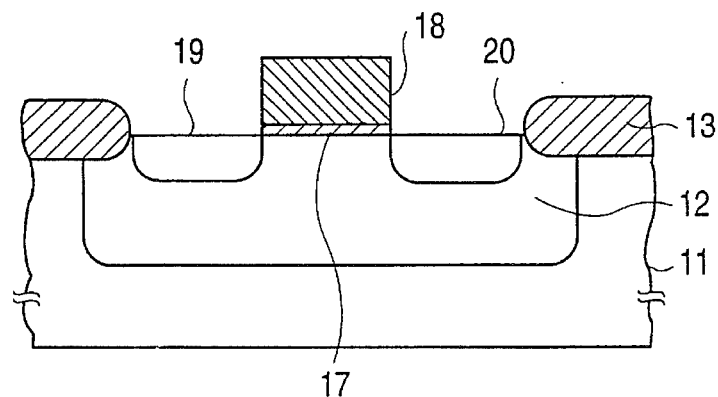
Figure 1C:
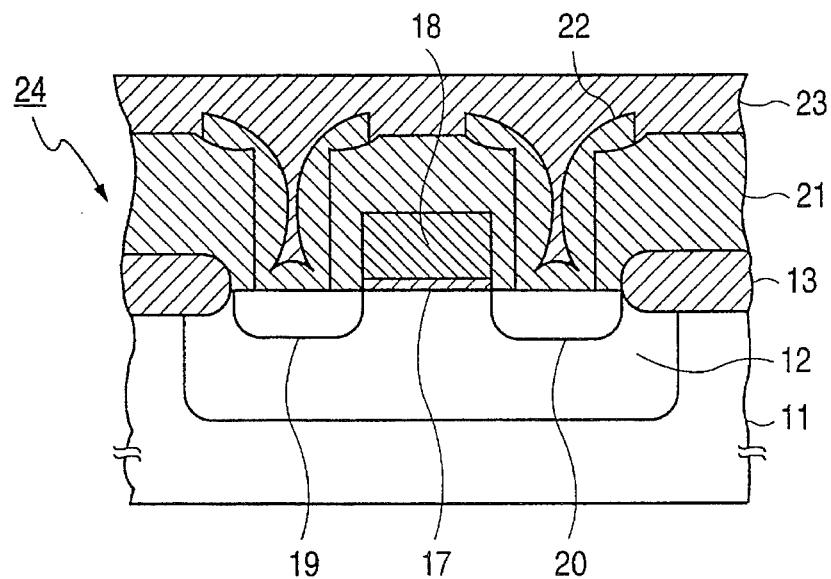
Figure 2:
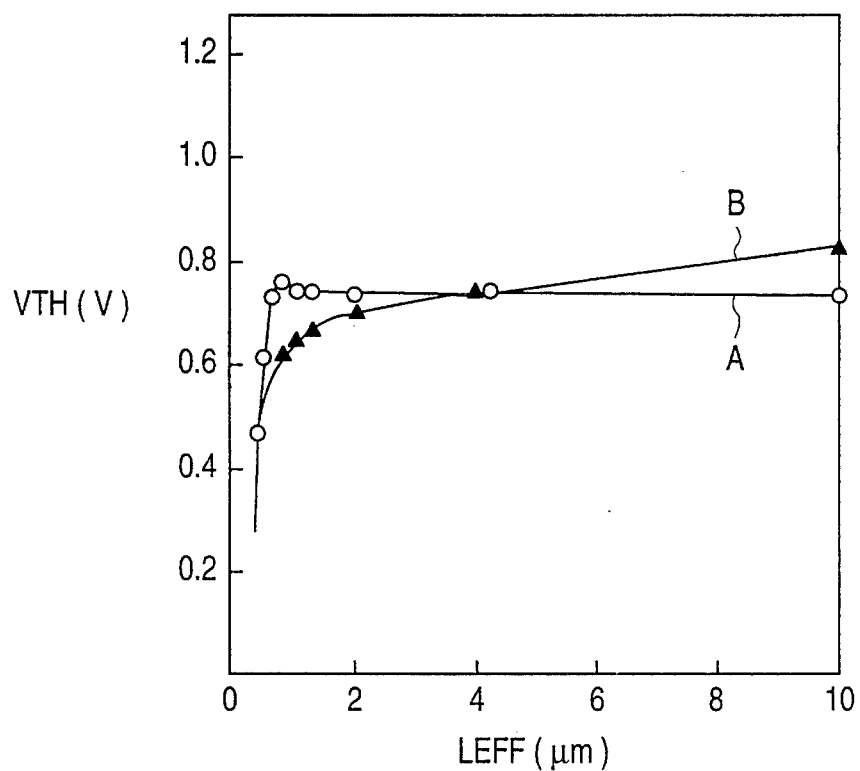
FIG. 2 is a graph of experimental results showing the shift of threshold voltage.
Figure 3:
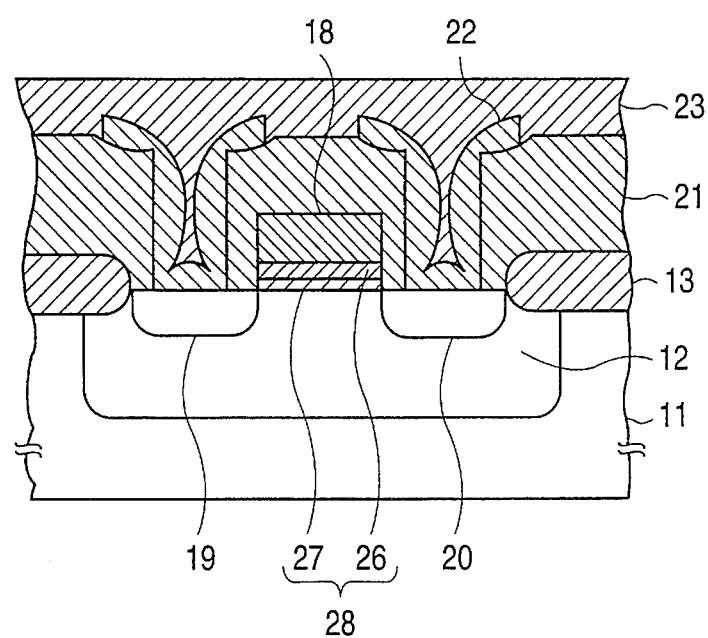
FIG. 3 is a cross sectional view of a third conventional MISFET transistor.
Figure 5:
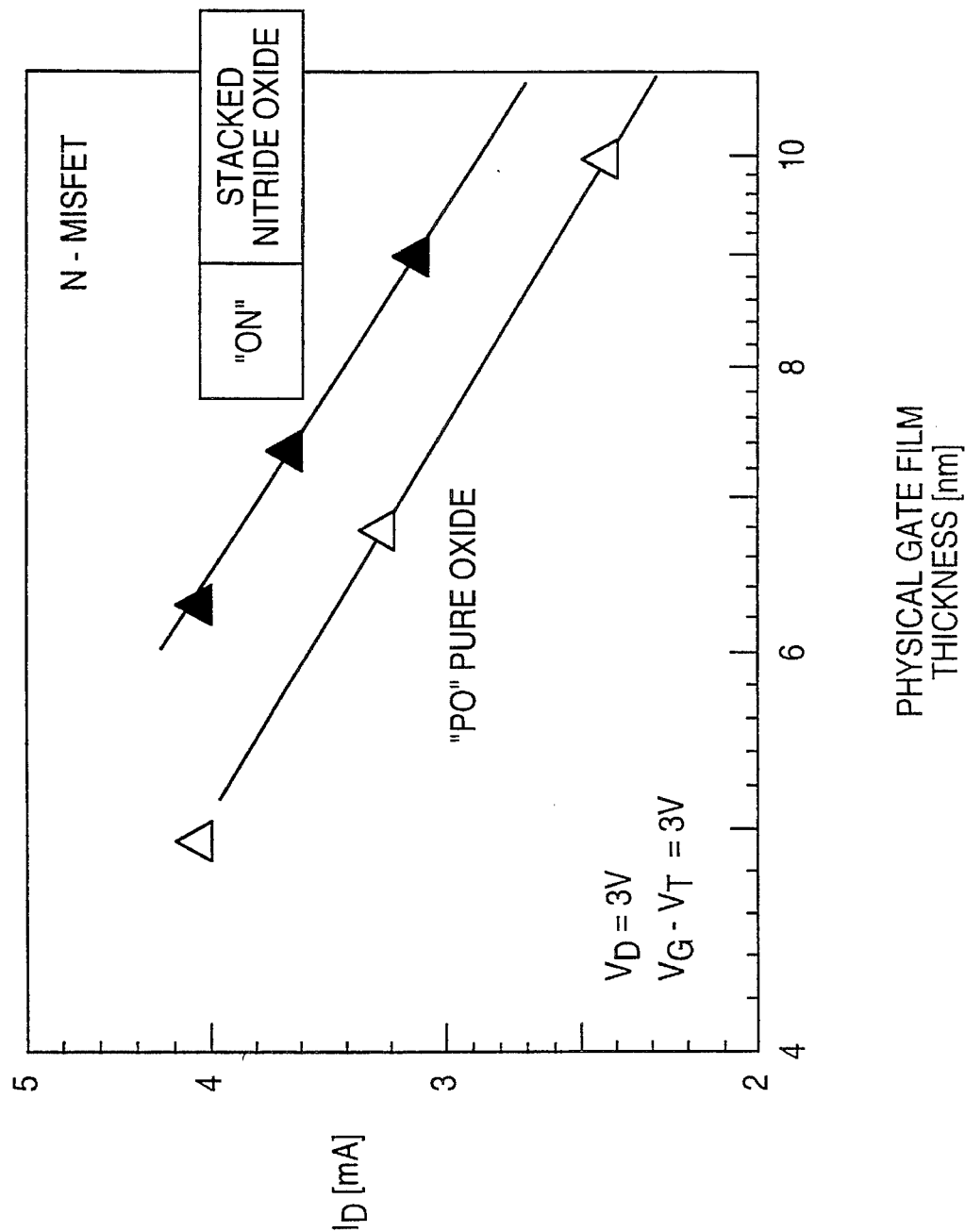
FIG. 5 shows the dependence of a drain current $I_{D0}$ at a drain voltage $V_D=3$ V and an effective gate voltage $V_G-V_{TH}=3$ V on the physical thickness of a gate insulating film for the various types of films.
Figure 6A:
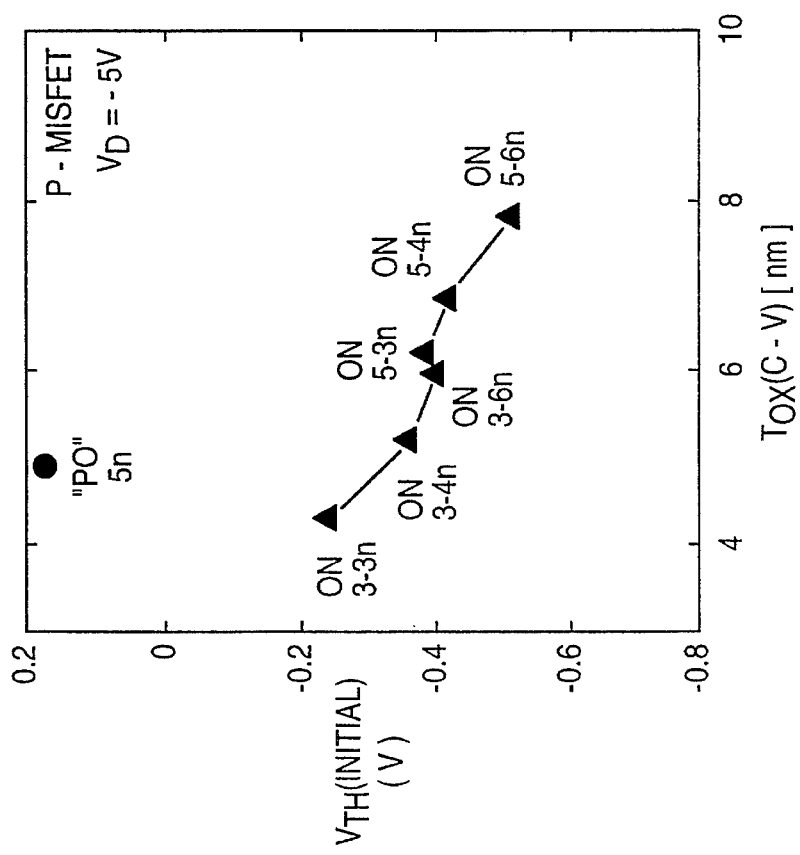
FIGS. 6A and 6B show the initial threshold voltage of n-channel and p-channel MISFET transistors before hot carrier stress is applied to the transistors, the transistors being provided with various-gate films shown in FIG. 4.
Figure 6B:
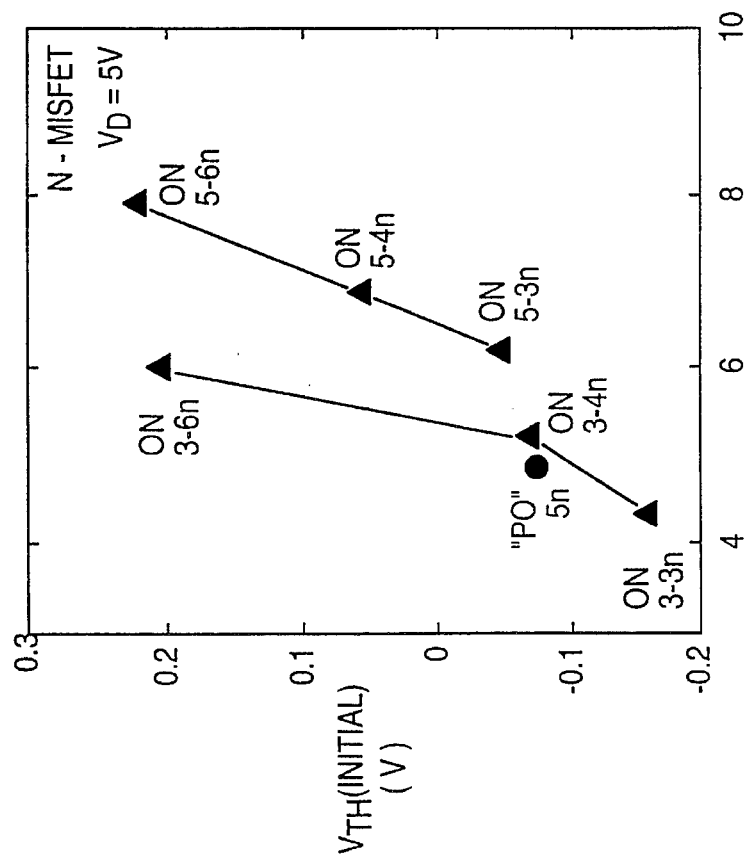
Figure 7B:
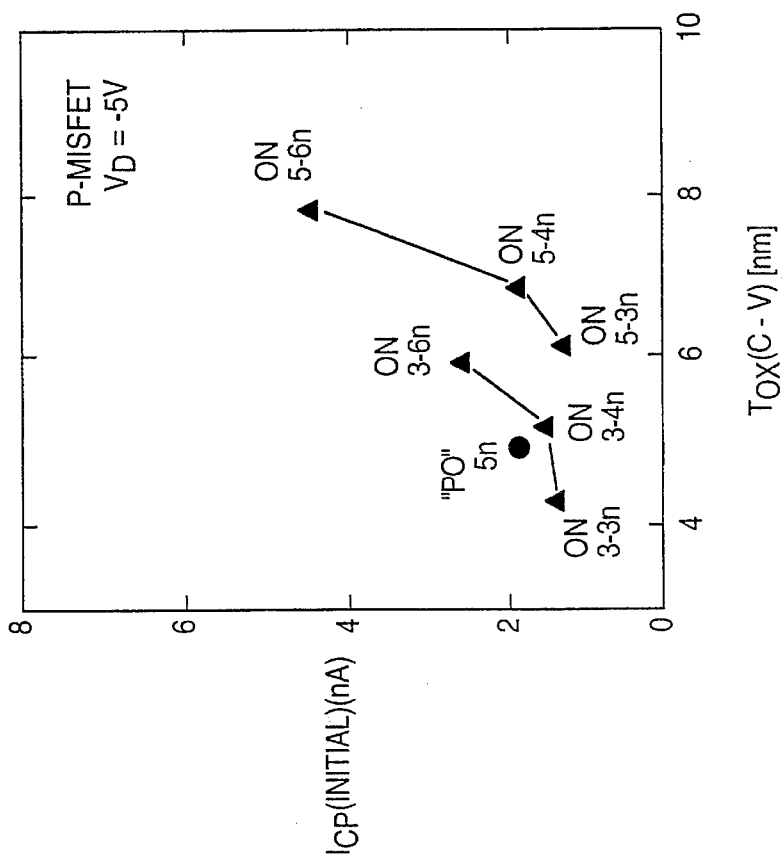
FIGS. 7A and 7B show the initial charge-pumping current of n-channel and p-channel MISFET transistors before hot carrier stress is applied to the transistors, the transistors being provided with the various gate films shown in FIG. 4.
Figure 7A:
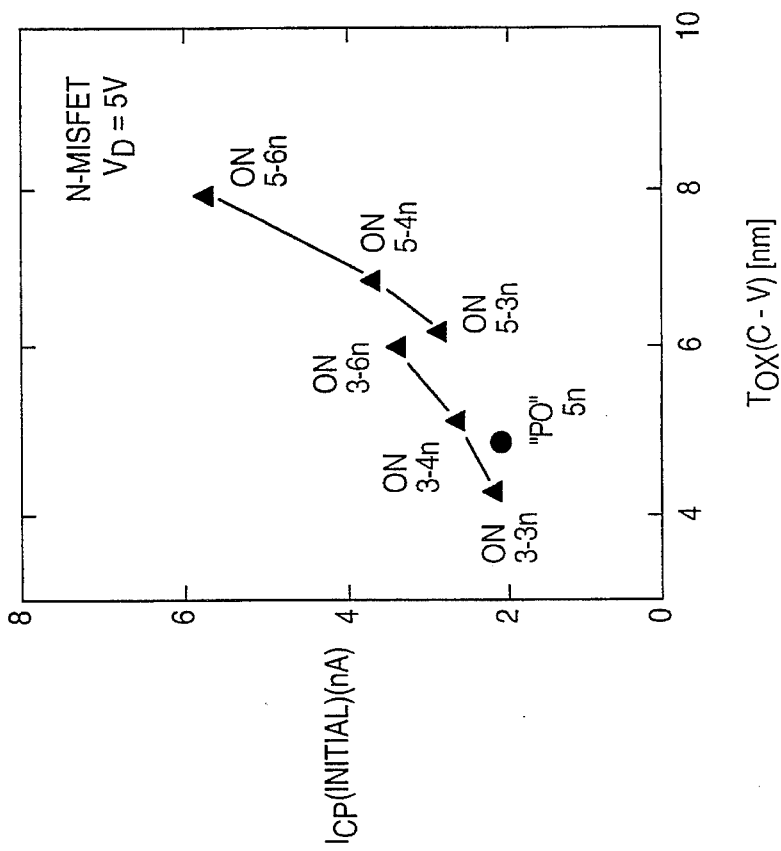

In The method for fabricating the MIS transistor 205, because the gate insulating film 203 is produced by the LPD method, stress applied to the p-type well region 31 by the gate insulating film 203 is smaller than that applied to the thermal oxide film 14 shown in FIG. 1A. As a result, tensile stress generated in an interface between the p-type well region 31 and the gate insulating film 203 becomes smaller, so that the threshold voltage is not greatly decreased even if the gate length is shortened.

Accordingly, a short channel effect can be prevented and miniaturized MIS transistors can be fabricated on a commercial basis.

Moreover, as shown in the equation (1), the growth rate of the silicon oxide film 201 is proportional to the removal rate of HF. Because the HF is easily removed, the control performance of the film thickness of the gate insulating film 203 can be improved. Therefore, the gate insulating film 203 can be reliably formed to a desired film thickness. As a result, a large number of MISFET transistors, in which the threshold values and the charge-pumping currents are the same, can be fabricated. In other words, the MISFET transistor can be supplied in good yield.

Further, because nitrogen is added to the gate insulating film 203, the film 203 is densified. Therefore, the boron included in the gate electrode 204 is not diffused in the silicon substrate 32 and the well region 31 even if the gate insulating film 203 is thin, so that the threshold voltage is not greatly shifted.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method for fabricating a semiconductor device on a silicon substrate, comprising the steps of:
   a) forming a silicon oxide film on the silicon substrate;
   b) forming a silicon nitride film on the silicon oxide film;
   c) thermally nitriding the silicon nitride film in an atmosphere of nitrogenous gas;
   d) forming a conductive film on the silicon nitride film nitrided in the atmosphere of the nitrogenous gas;
   e) forming a gate region from the silicon oxide film formed in the step a), the silicon nitride film nitrided in the step c), and the conductive film formed in the step d), a channel region being positioned under the gate region in the silicon substrate;
   f) forming a source region in the silicon substrate adjacent to one side of the channel region;
   g), forming a drain region in the silicon substrate adjacent to another side of the channel region; and
   h), forming wiring regions on the source region, the drain region, and the gate region, the semiconductor device being fabricated by the gate region, the channel region, the source region, the drain region, and the wiring regions.

2. Said method according to claim 1 in which the silicon nitride film formed in step b) is nitrided by a rapid thermal nitridation in step c).

3. Said method according to claim 1 in which the silicon nitride film in step b) is formed by a liquid phase chemical vapor deposition method.

4. Said method according to claim 1 in which the silicon nitride film in step b) is formed by a sputter method.

5. Said method according to claim 1 in which the nitrogenous gas in step c) is ammonia ($NH_3$).

6. Said method according to claim 1 in which the nitrogenous gas in step c) is $NF_3$.

7. Said method according to claim 1 in which the nitrogenous gas in step c) is $N_2O$.

8. Said method according to claim 1 in which the silicon nitride film is nitrided at an temperature of 1100° C. for one minute in step c).

9. Said method according to claim 1 in which the conductive film formed in step d) is a $P^+$ polycrystalline silicon film.

10. Said method according to claim 1 in which the thickness of the silicon nitride film formed in step b) is equal to or less than 3 nm.

11. Said method according to claim 1 in which the conductive film formed in step d) is formed as a multi-layer gate electrode consisting of both a $P^+$ polycrystalline silicon film and a metal.

12. Said method according to claim 1 in which the conductive film formed in step d) is formed as a multi-layer gate electrode consisting of both a $P^+$ polycrystalline silicon film and a metal silicide.

13. Said method according to claim 1 in which the wiring regions formed in step h) are formed as a multi-layer.

14. Said method for fabricating a semiconductor device on a silicon substrate, comprising the steps of:
   a) forming a silicon oxide film on the silicon substrate;
   b) forming a silicon nitride film on the silicon oxide film;
   c) thermally nitriding the silicon nitride film in an atmosphere of nitrogenous gas;
   d) oxidizing the silicon nitride film nitrided in the step c);
   e) forming a conductive film on the silicon nitride film oxidized in the step d);
   f) forming a gate region from the silicon oxide film formed in the step a), the silicon nitride film oxidized in the step d), and the conductive film formed in the step e), a channel region being positioned under the gate region in the silicon substrate;
   g), forming a source region in the silicon substrate adjacent to one side of the channel region;
   h) forming a drain region in the silicon substrate adjacent to another side of the channel region; and
   i) forming wiring regions on the source region, the drain region, and the gate region, the semiconductor device being fabricated by the gate region, the channel region, the source region, the drain region, and the wiring regions.

15. Said method according to claim 14 in which the silicon nitride film formed in step b) is nitrided by a rapid thermal nitridation in step c).

16. A method for fabricating a semiconductor device on a silicon substrate, comprising the steps of:
   a) forming a silicon oxide film on the silicon substrate;
   b) forming a silicon nitride film on the silicon oxide film;
   c) annealing the silicon nitride film in an atmosphere of argon gas;
   d) forming a conductive film on the silicon nitride film annealed in the atmosphere of argon gas;
   e) forming a gate region from the silicon oxide film formed in the step a), the silicon nitride film annealed in the step c), and the conductive film formed in the step d), a channel region being positioned under the gate region in the silicon substrate;
   f) forming a source region in the silicon substrate adjacent to one side of the channel region;
   g) forming a drain region in the silicon substrate adjacent to another side of the channel region; and h) forming wiring regions on the source region, the drain region, and the gate region, the semiconductor device being fabricated by the gate region, the channel region, the source region, the drain region, and the wiring regions.

17. Said method according to claim 16 in which the silicon nitride film formed in step b) is annealed by a rapid thermal annealing in the step c).

18. A method for fabricating a semiconductor device on a silicon substrate, comprising the steps of:

a) forming a silicon oxide film on the silicon substrate;

b) forming a silicon nitride film on the silicon oxide film;

c) annealing the silicon nitride film in an atmosphere of argon gas;

d) oxidizing the annealed silicon nitride film;

e) forming a conductive film on the silicon nitride film oxidized in the step d);

f) forming a gate region from the silicon oxide film formed in the step a), the silicon nitride film oxidized in the step d), and the conductive film formed in the step e), a channel region being positioned under the gate region in the silicon substrate;

g) forming a source region in the silicon substrate adjacent to one side of the channel region;

h) forming a drain region in the silicon substrate adjacent to another side of the channel region; and i) forming wiring regions on the source region, the drain region, and the gate region, the semiconductor device being fabricated by the gate region, the channel region, the source region, the drain region, and the wiring regions.

19. Said method according to claim 18 in which the silicon nitride film formed in step d) is annealed by a rapid thermal annealing in step c).

20. A method for fabricating a semiconductor device on a silicon substrate, comprising the steps of:

a) forming a silicon oxide film on the silicon substrate;

b) forming a silicon nitride film on the silicon oxide film;

c) thermally nitriding the silicon nitride film in an atmosphere of nitrogenous gas;

d) forming a conductive film on the silicon nitride film nitrided in the atmosphere of the nitrogenous gas; and e) forming a gate region from both the silicon oxide film formed in the step a) and the silicon nitride film nitrided in the step c), a channel region being positioned under the gate region in the silicon substrate and the semiconductor device being fabricated by the gate region and the channel region.

21. Said method according to claim 20 in which the semiconductor device is applied to a MOS transistor.

22. Said method according to claim 20 in which the semiconductor device is applied to a CMOS transistor.

23. Said method according to claim 20 in which the semiconductor device is applied to an EPROM.

24. Said method according to claim 20 in which the semiconductor device is applied to an EEPROM.

25. Said method according to claim 20 in which the semiconductor device is applied to a MOS capacitor.

26. A method for fabricating a semiconductor device on a silicon substrate, comprising the steps of:

a) forming a silicon oxide film on the silicon substrate;

b) thermally nitriding the silicon oxide film in an atmosphere of nitrogenous gas by a rapid thermal nitridation method to form an interface region in which the nitrogen concentration is between 0.2 atomic % and 1.0 atomic %, the interface region being positioned between the silicon oxide film and the silicon substrate;

c) forming a conductive film on the silicon oxide film;

d) forming a gate region from both the silicon oxide film nitrided in the step b) and the conductive film formed in the step c), a channel region being formed under the gate region in the silicon substrate;

e) forming a source region in the silicon substrate adjacent to one side of the channel region;

f) forming a drain region in the silicon substrate adjacent to another side of the channel region; and g) forming wiring regions on the source region, the drain region, and the gate region, the semiconductor device being fabricated by the gate region, the channel region, the source region, the drain region, and the wiring regions.

27. Said method according to claim 26 in which the silicon oxide film nitrided in step b) is exposed to the nitrogeous gas at temperatures equal to or less than 900° C.

28. Said method according to claim 26 in which the nitrogenous gas in step b) is ammonia ($NH_3$).

29. Said method according to claim 26 in which the nitrogenous gas in step b) is $NF_3$.

30. Said method according to claim 26 in which the nitrogenous gas in step b) is $N_2O$.

31. Said method according to claim 26 in which the nitrogenous gas in step b) is $N_2$.

32. A method for fabricating a semiconductor device on a silicon substrate, comprising the steps of:

a) forming a silicon oxide film on the silicon substrate;

b) thermally nitriding the silicon oxide film in an atmosphere of nitrogenous gas by a rapid thermal nitridation method and re-oxidizing the silicon oxide film in an atmosphere of oxygen gas so as to form an interface region in which the nitrogen concentration is between 0.2 atomic % and 1.0 atomic %, the interface region being positioned between the silicon oxide film and the silicon substrate;

c) forming a conductive film on the silicon oxide film;

d) forming a gate region from both the silicon oxide film nitrided and re-oxidized in the step b) and the conductive film formed in the step c), a channel region being formed under the gate region in the silicon substrate;

e) forming a source region in the silicon substrate adjacent to one side of the channel region;

f) forming a drain region in the silicon substrate adjacent to another side of the channel region; and g) forming wiring regions on the source region, the drain region, and the gate region, the semiconductor device being fabricated by the gate region, the channel region, the source region, the drain region, and the wiring regions.

33. A method for fabricating a semiconductor device on a silicon substrate, comprising the steps of:

a) forming a silicon oxide film on the silicon substrate by a liquid phase deposition method;

b) densifying the silicon oxide film by vaporizing water included in the silicon oxide film;

c) thermally nitriding the silicon oxide film densified in the step b);

d) re-oxidizing the surface of the nitrided silicon oxide film in an atmosphere of dry oxygen at temperatures around 1100° C.;

e) forming a conductive film on the re-oxidized silicon nitride film;

f) forming a gate region from both the silicon oxide film formed in the step a) and the conductive film formed in the step c), a channel region being positioned under the gate region in the silicon substrate;

g) forming a source region in the silicon substrate adjacent to one side of the channel region;

h) forming a drain region in the silicon substrate adjacent to another side of the channel region; and i) forming wiring regions on the source region, the drain region, and the gate region, the semiconductor device being fabricated by the gate region, the channel region, the source region, the drain region, and the wiring regions.

34. Said method according to claim 33 in which the silicon oxide film densified in step b) is nitrided by a rapid thermal nitridation in step b).

* * * * *